United States Patent
Tsukamoto et al.

(10) Patent No.: US 8,324,606 B2
(45) Date of Patent: Dec. 4, 2012

(54) RESISTANCE CHANGE TYPE MEMORY

(75) Inventors: Takayuki Tsukamoto, Kawasaki (JP);
Reika Ichihara, Yokohama (JP);
Hiroshi Kanno, Kawasaki (JP); Kenichi Murooka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 466 days.

(21) Appl. No.: 12/563,470

(22) Filed: Sep. 21, 2009

(65) Prior Publication Data

US 2010/0237314 A1    Sep. 23, 2010

(30) Foreign Application Priority Data

Mar. 19, 2009    (JP) .................................. 2009-069046

(51) Int. Cl.
*H01L 47/00*    (2006.01)

(52) U.S. Cl. ............................................. 257/2; 257/5

(58) Field of Classification Search .................. 257/2–5, 257/E45.002
See application file for complete search history.

(56) References Cited

U.S. PATENT DOCUMENTS

| | | | |
|---|---|---|---|
| 7,443,712 B2 | 10/2008 | Bill et al. | |
| 8,059,447 B2 | 11/2011 | Scheuerlein et al. | |
| 2009/0137112 A1* | 5/2009 | Tabata et al. | 438/631 |
| 2009/0219740 A1* | 9/2009 | Nagashima et al. | 365/51 |
| 2011/0297911 A1* | 12/2011 | Shima et al. | 257/4 |

FOREIGN PATENT DOCUMENTS

JP    2008-287827    11/2008

OTHER PUBLICATIONS

U.S. Appl. No. 13/234,796, filed Sep. 16, 2011, Takashima, et al.
U.S. Appl. No. 12/713,667, filed Feb. 26, 2010, Kanno, et al.
Office Action issue Jun. 21, 2011 in Japanese Patent Application No. 2009-069046 (with English translation).
U.S. Appl. No. 12/876,637, filed Sep. 7, 2010, Ichihara, et al.

* cited by examiner

*Primary Examiner* — Cuong Q Nguyen
(74) *Attorney, Agent, or Firm* — Oblon, Spivak, McClelland, Maier & Neustadt, L.L.P.

(57) ABSTRACT

A resistance change type memory of an aspect of the present invention including a first wiring configured to extend in a first direction, a second wiring configured to extend in a second direction crossing the first direction, a series circuit configured to connect to the first and second wirings, the series circuit including a non-ohmic element being more conductive in the first to second wiring direction than in the second to first direction and a resistance change type storage element in which data is stored according to a change of a resistance state, an energy supplying circuit configured to connect to the first wiring to supply energy to the first wiring, the energy being used to store the data in the resistance change type storage element, and a capacitance circuit configured to include a capacitive element and being connected to the second wiring.

11 Claims, 26 Drawing Sheets

FIG. 5A  2-level memory

FIG. 5B  Malti-level memory

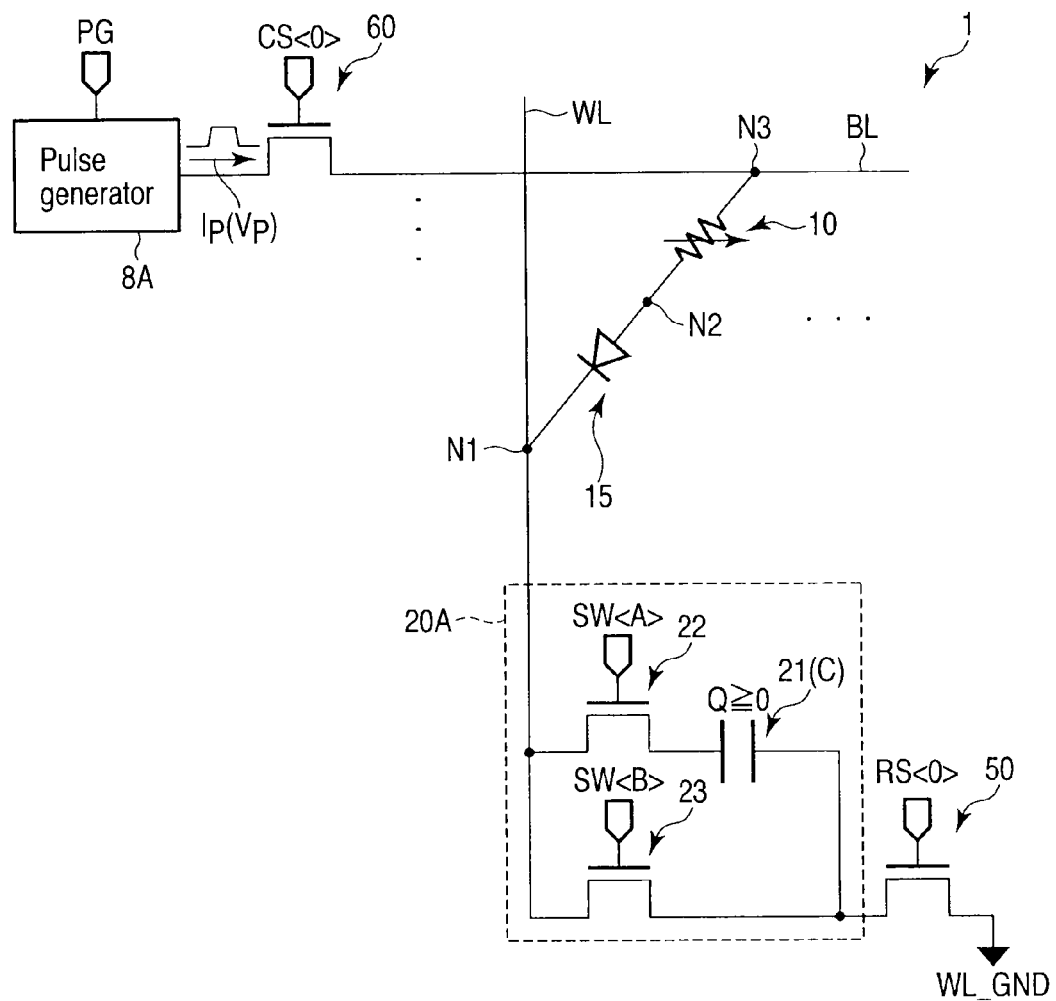
F I G. 6

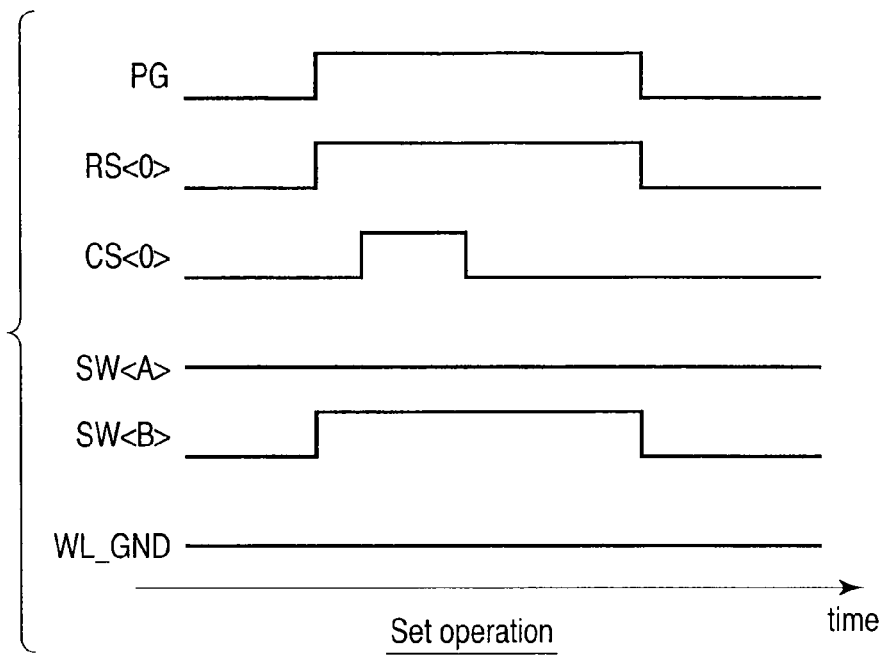
F I G. 7 A
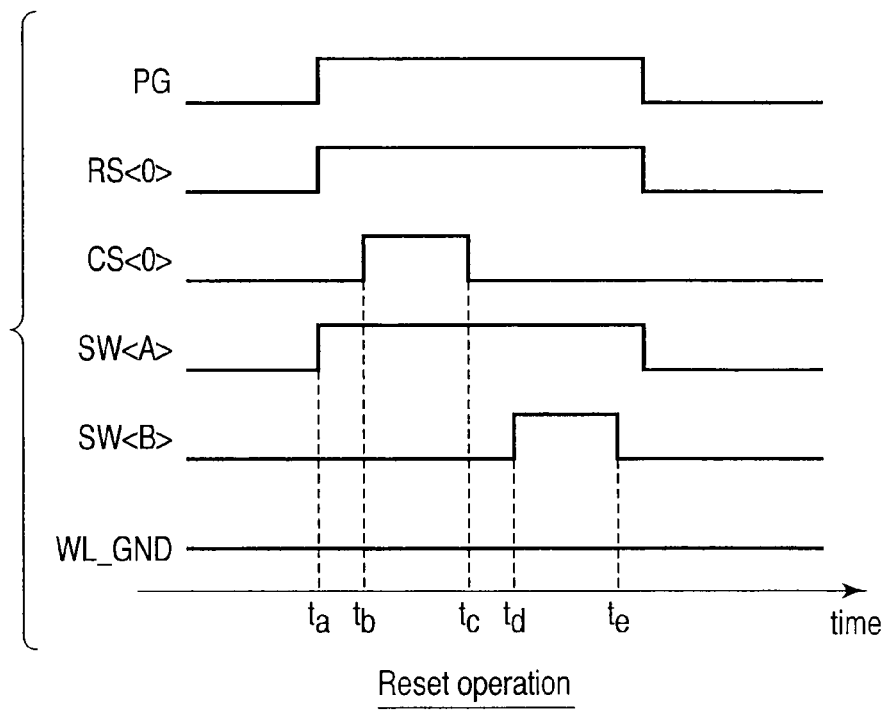
F I G. 7 B

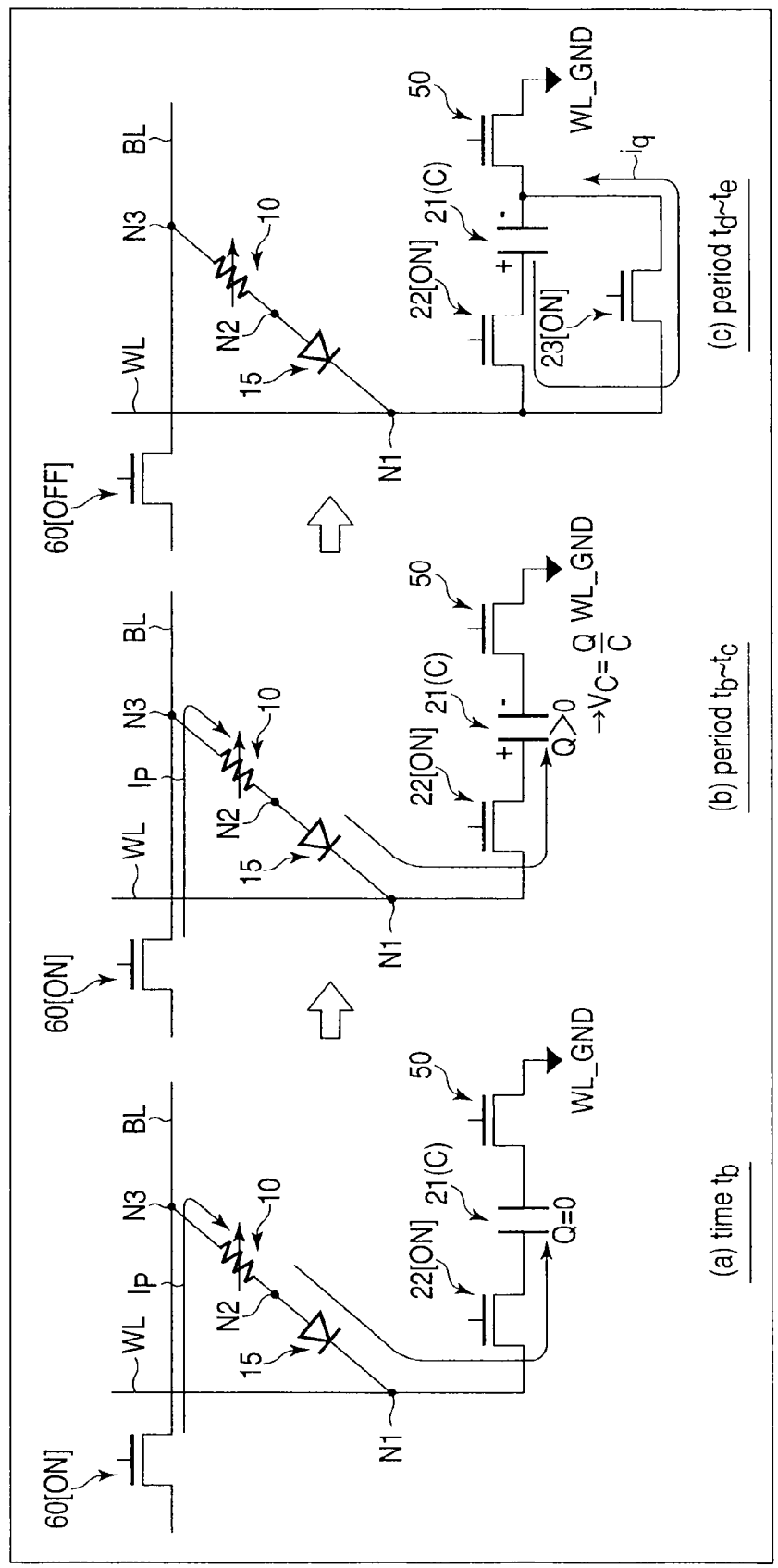
F I G. 8

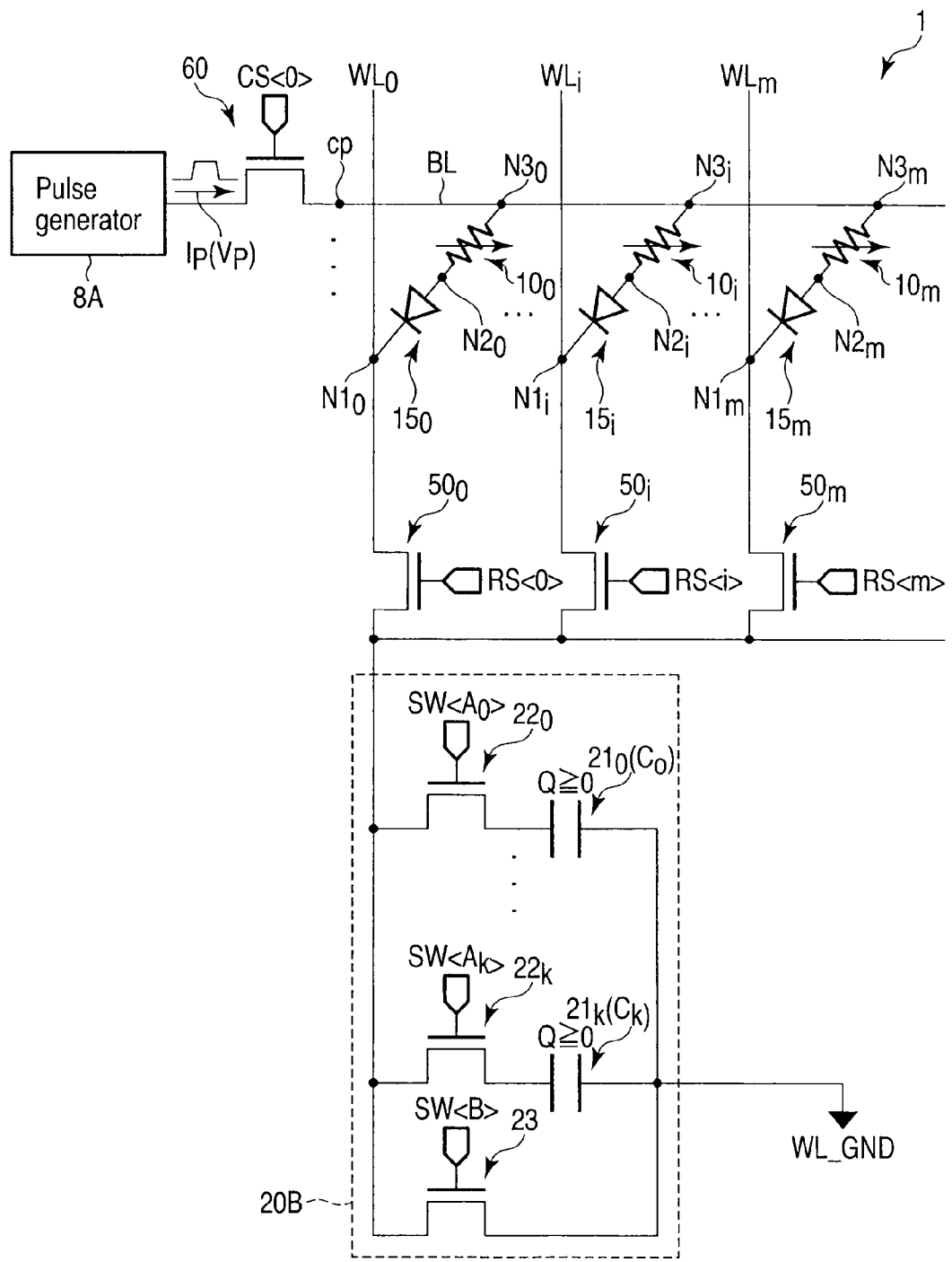
F I G. 9

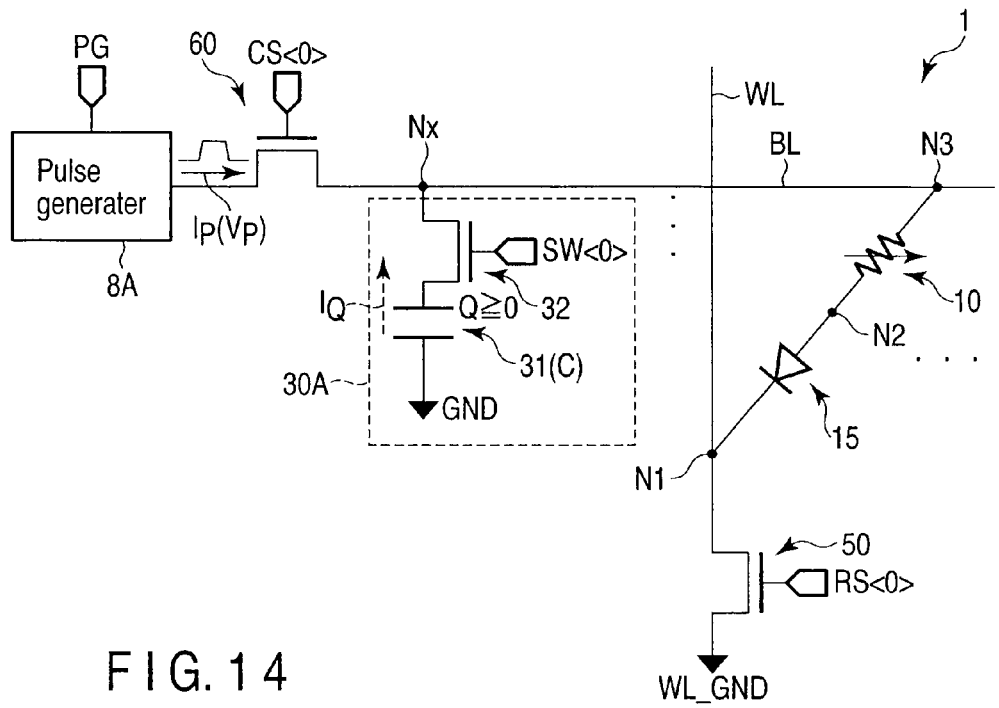
F I G. 14
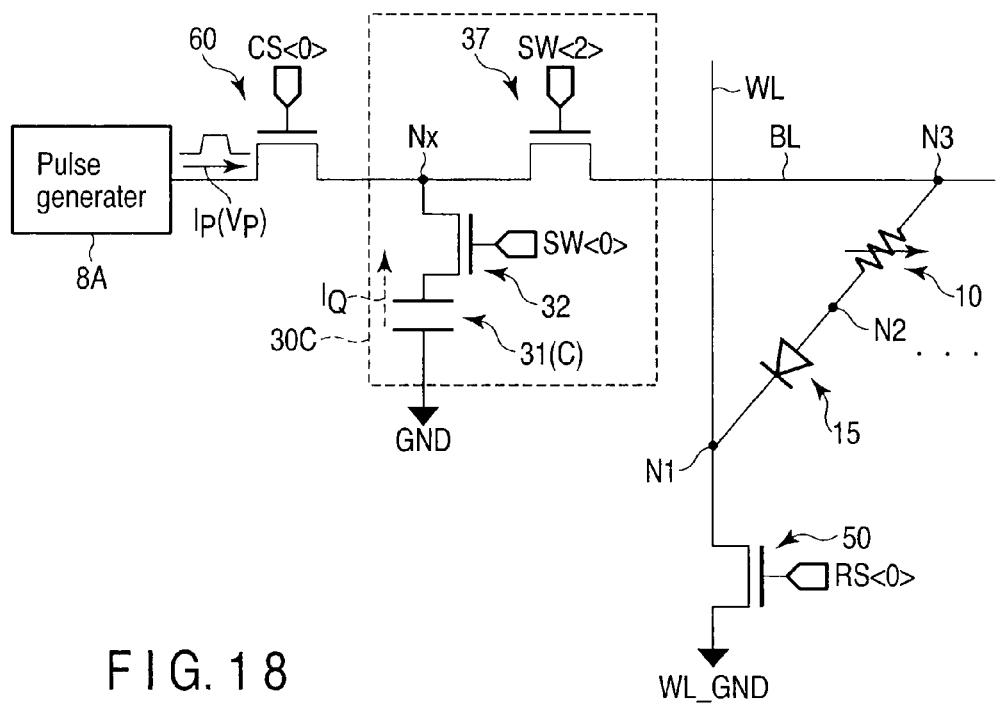
F I G. 18

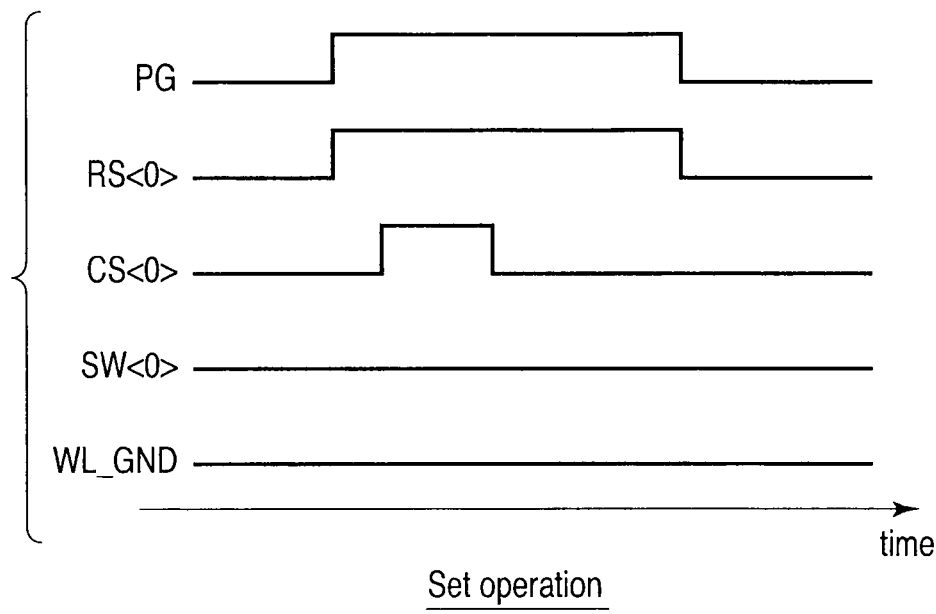
F I G. 15 A
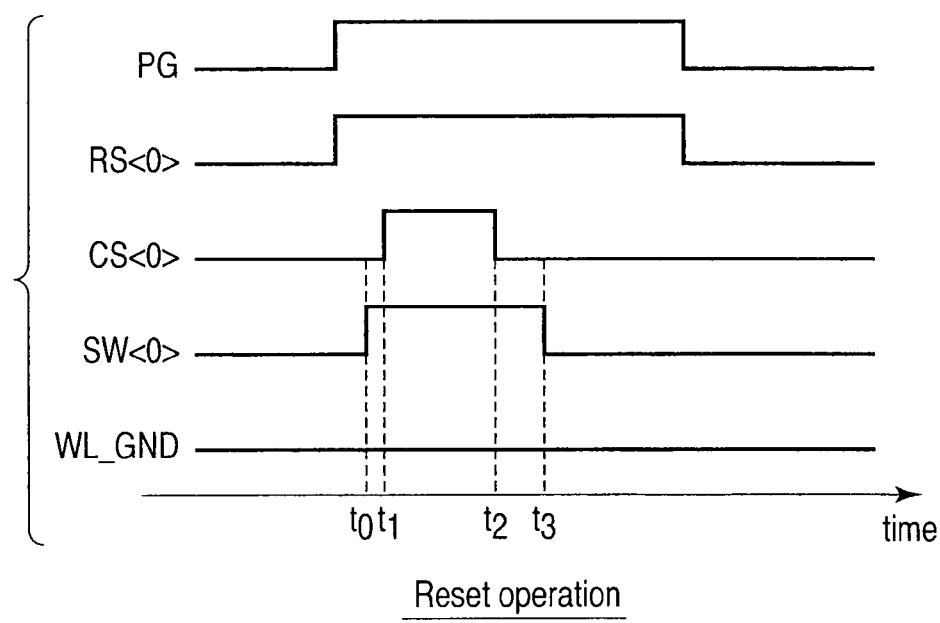
F I G. 15 B

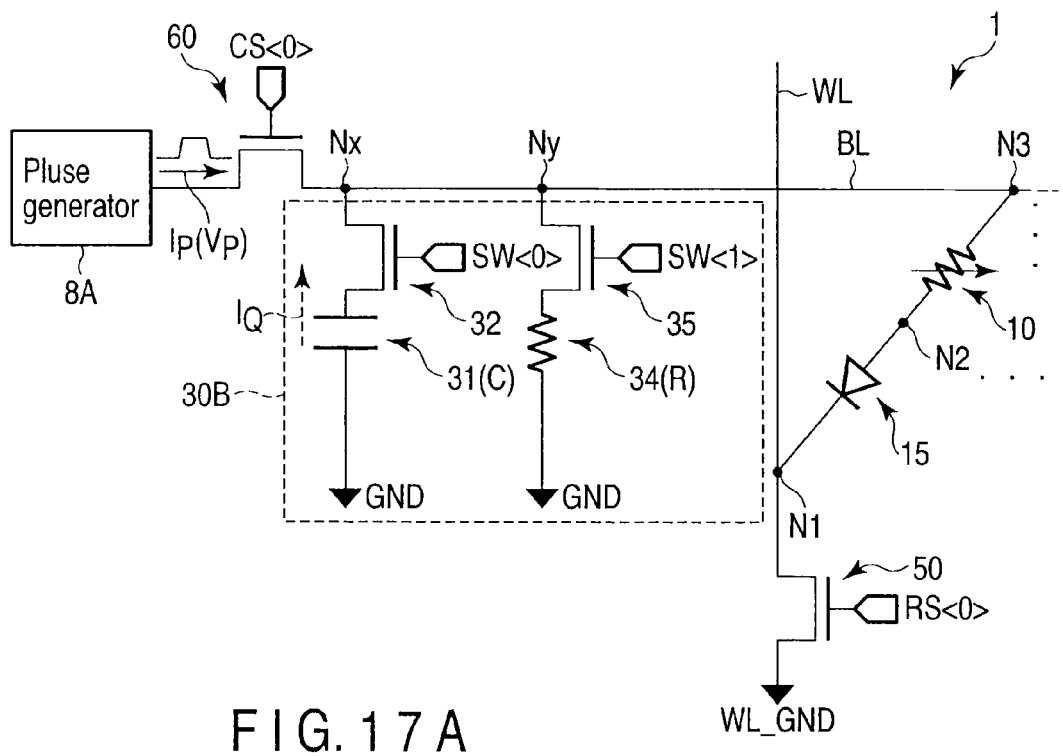
F I G. 17 A
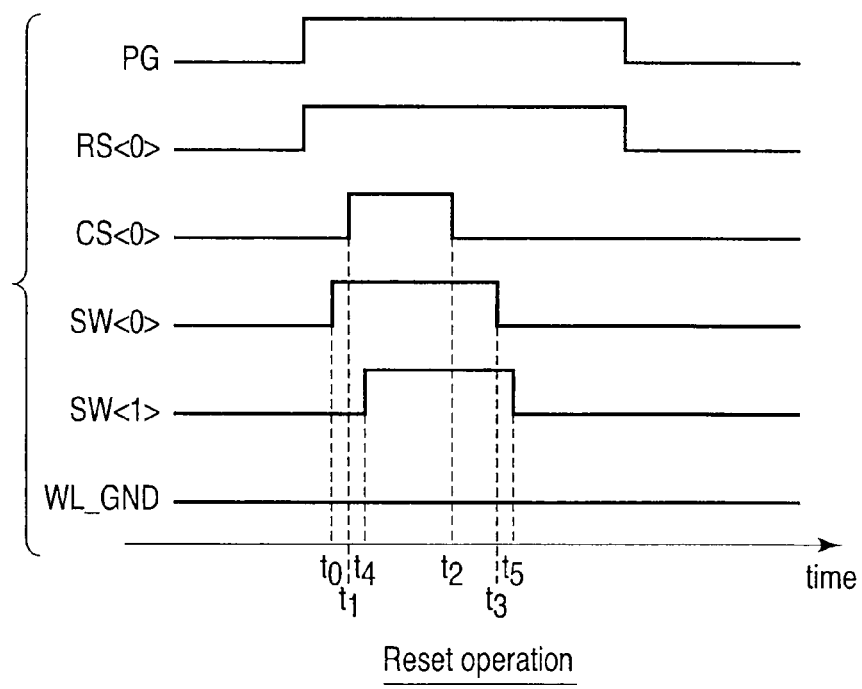
F I G. 17 B

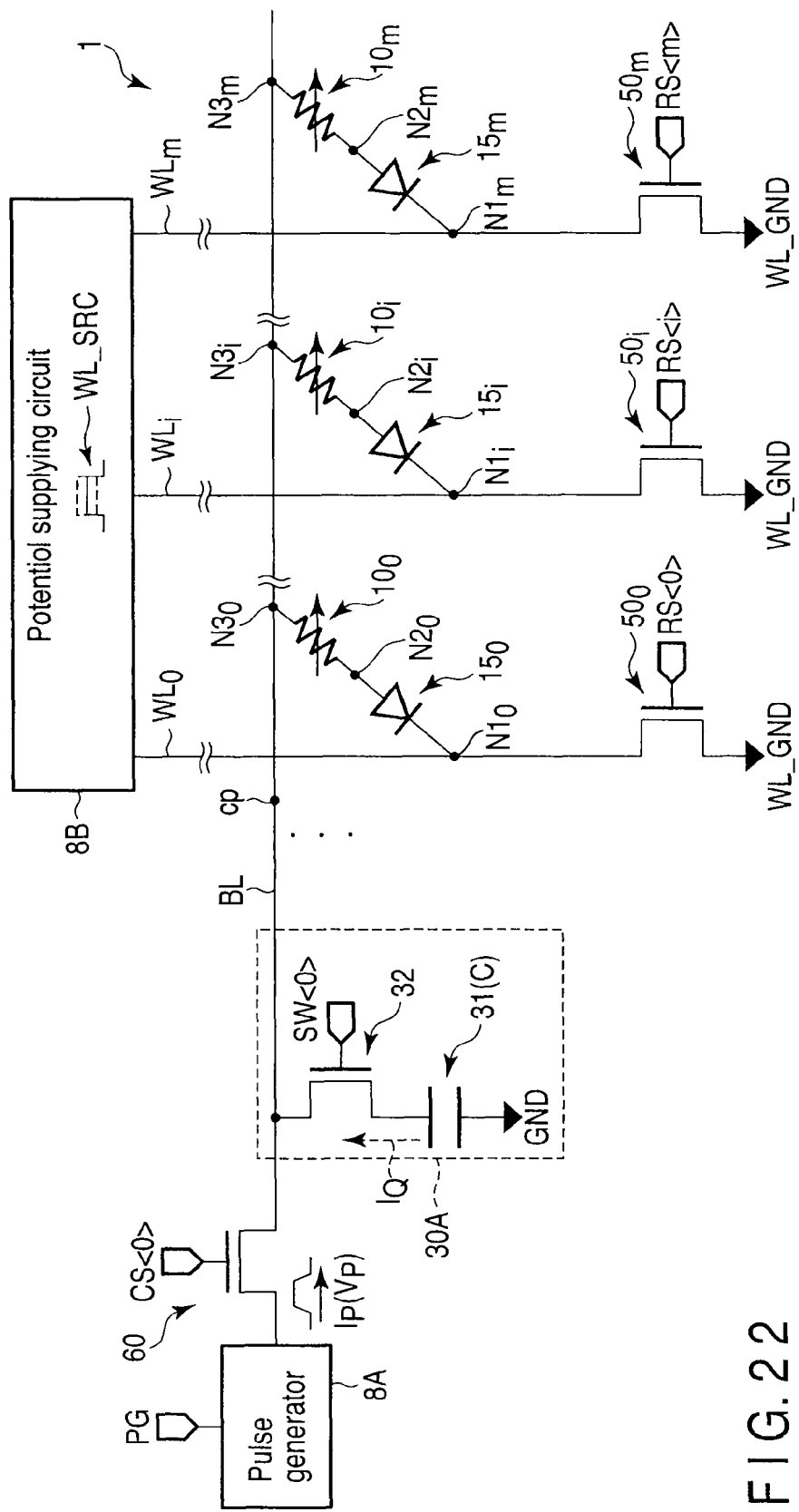
F I G. 22

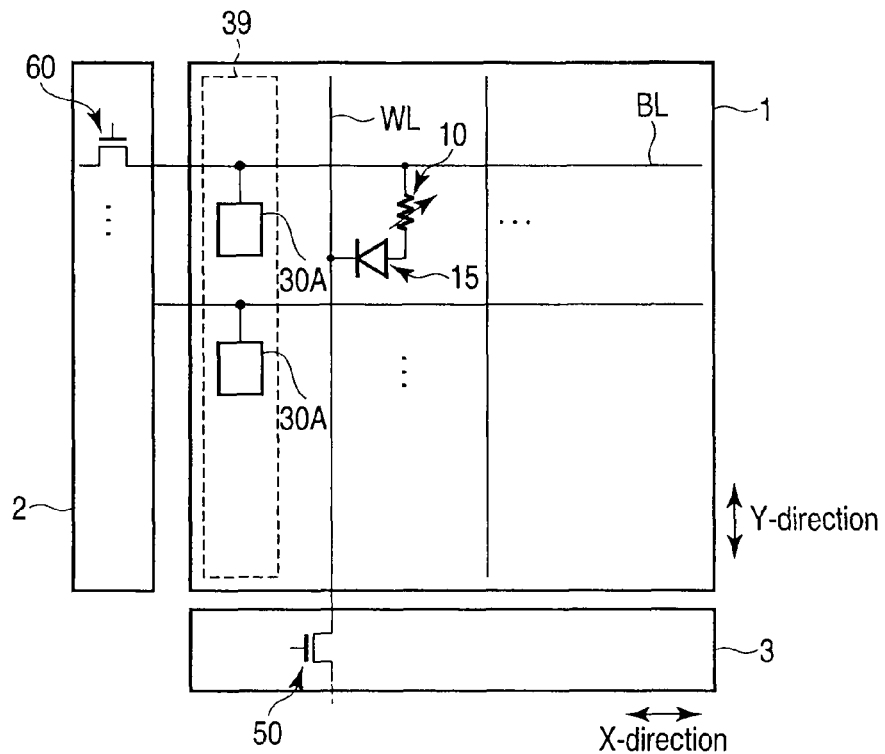
F I G. 24 A
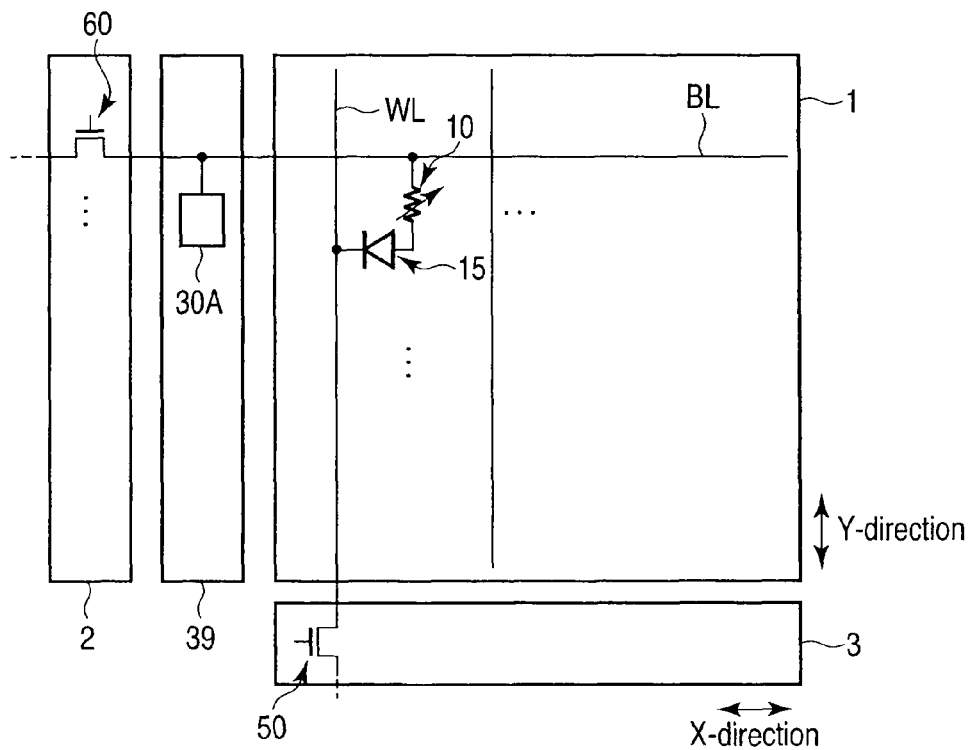
F I G. 24 B

| Capacitance [pF] | Voltage [V] | Reset probability [%] | |
|---|---|---|---|
| | | FIG.6 | FIG.18 |
| 5.6 | 4 | 3 | 4 |
| | 5 | 65 | 39 |
| | 6 | 41 | 18 |
| 2.4 | 4 | 3 | 4 |
| | 5 | 26 | 11 |
| | 6 | 75 | 50 |
| 0.8 | 4 | 3 | 3 |
| | 5 | 27 | 15 |
| | 6 | 70 | 44 |

FIG. 25

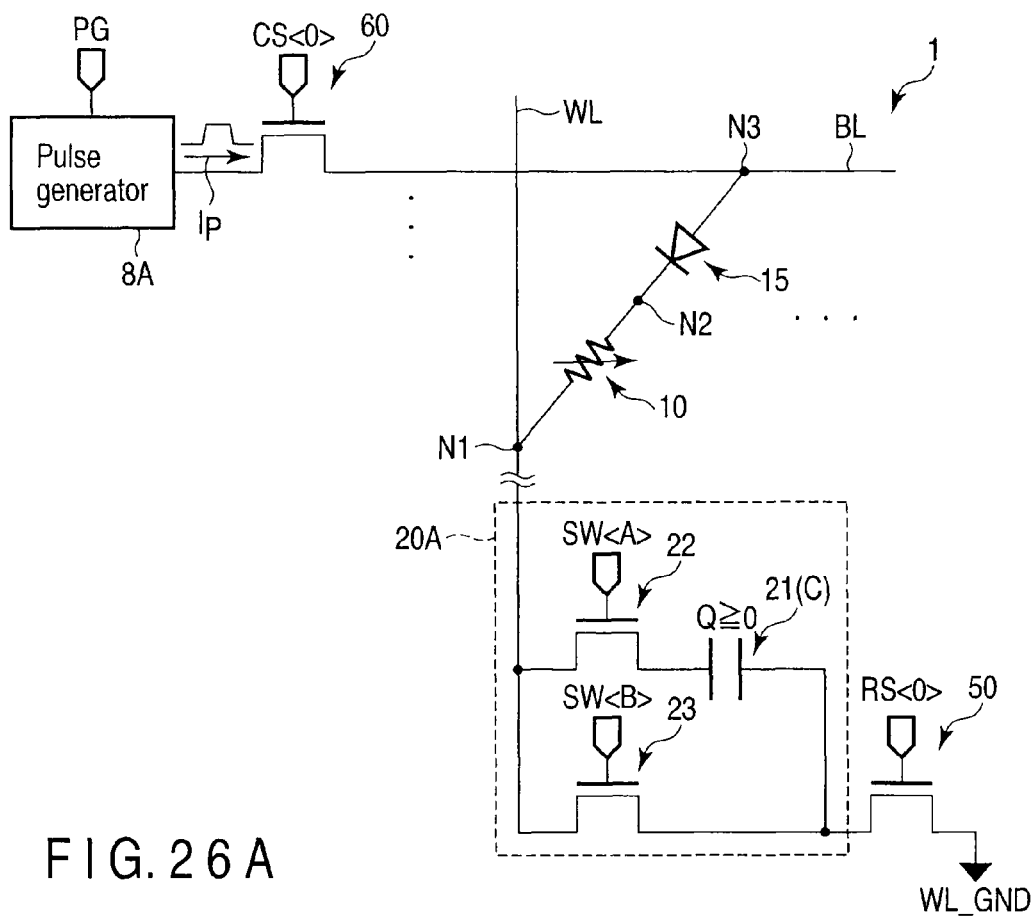
F I G. 26 A
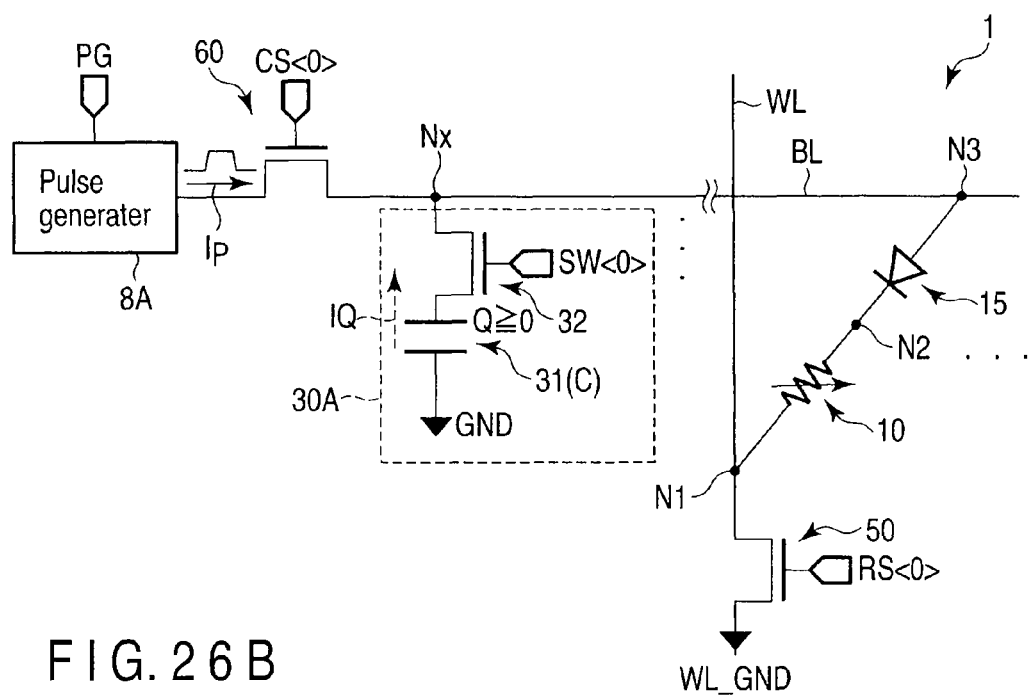
F I G. 26 B

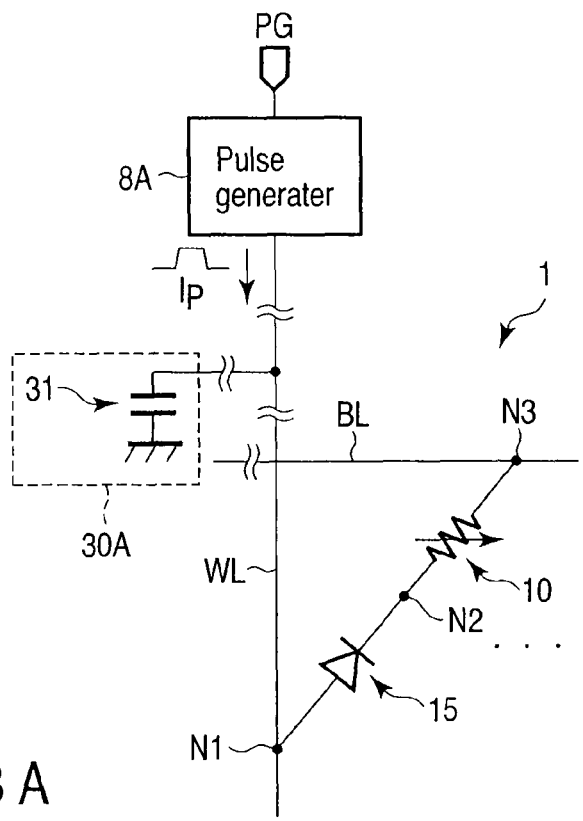
F I G. 2 8 A
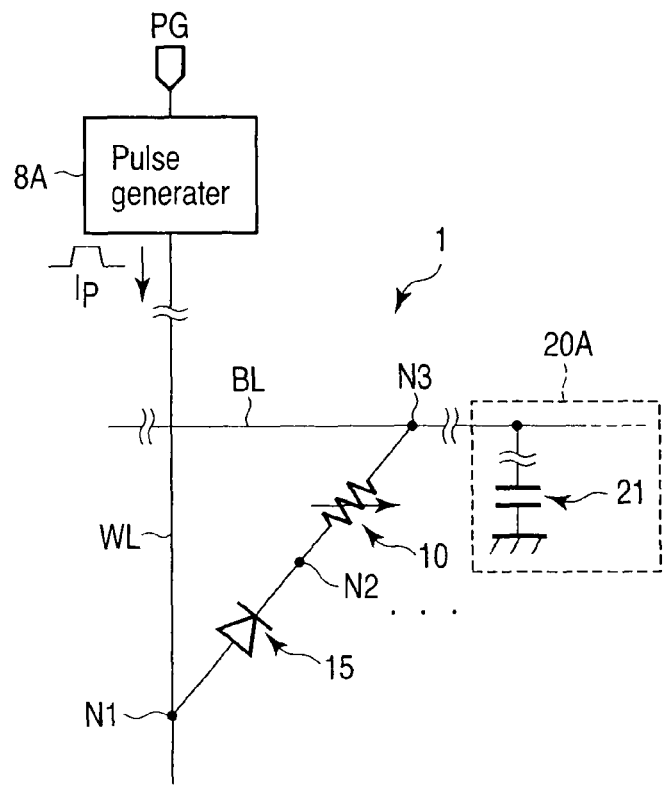
F I G. 2 8 B

RESISTANCE CHANGE TYPE MEMORY

CROSS-REFERENCE TO RELATED APPLICATIONS

This application is based upon and claims the benefit of priority from prior Japanese Patent Application No. 2009-069046, filed Mar. 19, 2009, the entire contents of which are incorporated herein by reference.

BACKGROUND OF THE INVENTION

1. Field of the Invention

The present invention relates to a resistance change type memory, and particularly to a memory in which a resistance change type storage element is used.

2. Description of the Related Art

Recently, attention is focused on a memory in which a resistance change type storage element is used. In the resistance change type storage element, data can electrically be rewritten.

A phase change memory can be cited as an example of such memory. In the phase change memory, a phase change between an amorphous state and a crystalline state is utilized in a material used for a memory element. In the phase change memory, the data is stored in a storage layer of the memory element, and a transition of a phase state of the storage layer is reversely made between the crystalline state (low-resistance state) and the amorphous state (high-resistance state) by a current passed through the storage layer. States of data are distinguished according to a high-resistance state and a low-resistance state of a storage layer, and the data is stored in a nonvolatile manner.

A Resistive Random Access Memory (ReRAM) can be cited as another example of the memory in which the resistance change type storage element is used. There are two well known operation types in the resistance change type storage element used for ReRAM.

One of the two operation types is referred to as bipolar type. In the bipolar type, the high-resistance state and the low-resistance state are switched by changing a polarity of an applied voltage.

The other operation type is referred to as a unipolar type. In the unipolar type, the high-resistance state and the low-resistance state are switched by controlling a voltage value (current value) and an applied time (pulse width) of the voltage (current).

In the memories in which the resistance change type storage element is used, various circuit configurations and operations have been studied in order to enhance the operational reliability or performance.

For example, in a technique disclosed in U.S. Pat. No. 7,443,712, a capacitive element is connected to a bit line, and the data stored in the resistance change type storage element is erased by utilizing Joule heat generated by a discharge current of the capacitive element.

BRIEF SUMMARY OF THE INVENTION

A resistance change type memory of an aspect of the present invention comprising: a first wiring configured to extend in a first direction; a second wiring configured to extend in a second direction crossing the first direction; a series circuit configured to connect to the first and second wirings, the series circuit including a non-ohmic element being more conductive in the first to second wiring direction than in the second to first direction and a resistance change type storage element in which data is stored according to a change of a resistance state; an energy supplying circuit configured to connect to the first wiring to supply energy to the first wiring, the energy being used to store the data in the resistance change type storage element; and a capacitance circuit configured to include a capacitive element and being connected to the second wiring.

A resistance change type memory of an aspect of the present invention comprising: a first wiring configured to extend in a first direction; a second wiring configured to extend in a second direction crossing the first direction; a series circuit configured to connect to the first and second wirings, the series circuit including a non-ohmic element being more conductive in the first to second wiring direction than in the second to first direction and a resistance change type storage element in which data is stored according to a change of a resistance state; an energy supplying circuit configured to connect to the first wiring to supply energy to the first wiring, the energy being used to store the data in the resistance change type storage element; and a capacitance circuit configured to include a capacitive element and being connected to the first wiring.

A resistance change type memory of an aspect of the present invention comprising: a plurality of first wirings configured to extend in a first direction and arrayed in a second direction crossing the first direction; a plurality of second wirings configured to extend in the second direction and arrayed in the first direction; a plurality of series circuits configured to connect to the first and second wirings, the series circuit including a non-ohmic element being more conductive in the first to second wiring direction than in the second to first direction and a resistance change type storage element in which data is stored according to a change of a resistance state, respectively; an energy supplying circuit configured to connect to the plurality of first wirings to supply energy to the first wirings, the energy being used to store the data in the resistance change type storage element; and at least one capacitance circuit that includes at least one capacitive element and being connected to at least one of the first wirings or at least one of the second wirings.

BRIEF DESCRIPTION OF THE SEVERAL VIEWS OF THE DRAWING

FIG. 5A is a view for explaining a basic operation of a resistance change type memory;

FIG. 5B is a view for explaining a basic operation of the resistance change type memory;

FIG. 6 illustrates a basic example of a resistance change type memory according to a first embodiment;

FIG. 7A is a waveform chart for explaining an operation of the resistance change type memory of FIG. 6;

FIG. 7B is a waveform chart for explaining an operation of the resistance change type memory of FIG. 6;

FIG. 8 schematically illustrates the operation of the resistance change type memory of FIG. 6;

FIG. 9 illustrates configuration example 1 of the resistance change type memory of the first embodiment;

FIG. 14 illustrates a basic example of a resistance change type memory according to a second embodiment;

FIG. 15A is a waveform chart for explaining an operation of the resistance change type memory of FIG. 14;

FIG. 15B is a waveform chart for explaining an operation of the resistance change type memory of FIG. 14;

FIG. 17A illustrates configuration example 1 of the resistance change type memory of the second embodiment;

FIG. 17B is a waveform chart for explaining an operation of the resistance change type memory of FIG. 17A;

FIG. 18 illustrates configuration example 2 of the resistance change type memory of the second embodiment;

FIG. 22 illustrates configuration example 4 of the resistance change type memory of the second embodiment;

FIG. 24A illustrates a layout example of the resistance change type memory of the second embodiment;

FIG. 24B illustrates a layout example of the resistance change type memory of the second embodiment;

FIG. 25 is a view explaining a verification result of the resistance change type memories of the first and second embodiments;

FIG. 26A illustrates a modification example of the resistance change type memory;

FIG. 26B illustrates a modification example of the resistance change type memory;

FIG. 28A illustrates a modification example of the resistance change type memory; and FIG. 28B illustrates a modification example of the resistance change type memory.

DETAILED DESCRIPTION OF THE INVENTION

An embodiment of the invention will be described in detail with reference to the drawings.

Embodiment

1. Entire Configuration

An entire configuration of a resistance change type memory according to an embodiment of the invention will be described with reference to FIGS. 1 to 5C.

(1) Chip Configuration

A chip configuration of the resistance change type memory of the embodiment will be described with reference to FIG. 1.

Figure 1:
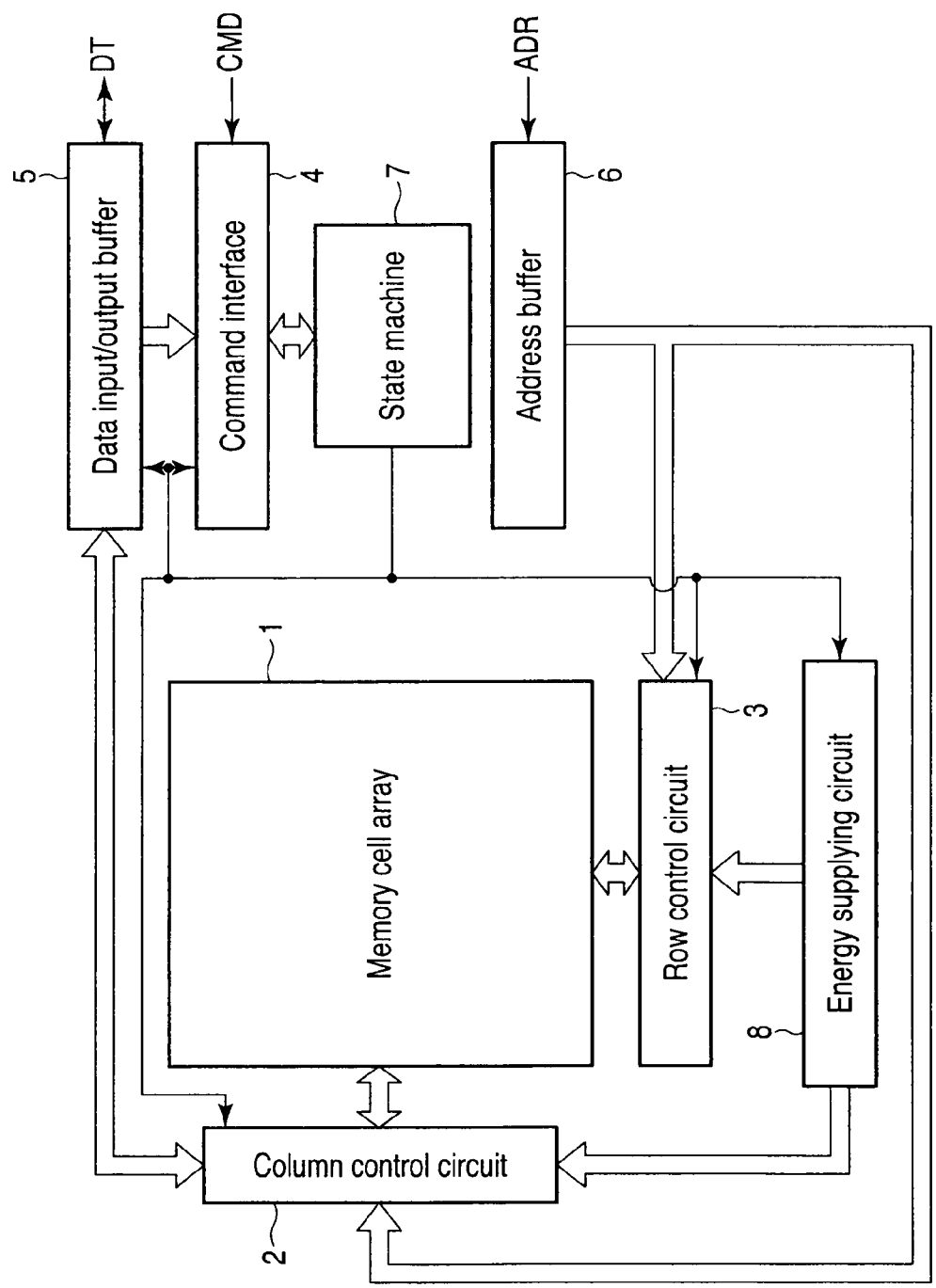
FIG. 1 is a block diagram illustrating an example of an entire configuration of a resistance change type memory according to an embodiment of the invention.

FIG. 1 illustrates an example of the chip configuration of the resistance change type memory of the embodiment.

A memory cell array 1 includes plural resistance change type storage elements (memory cell). Plural resistance change type storage elements are provided in the memory cell array 1. A detailed internal configuration of the memory cell array 1 will be described later. Plural bit lines and plural word lines are provided in the memory cell array 1. An operation of the resistance change type storage element is controlled by a potential or a current, which is supplied to a word line and a bit line. A connection configuration of the resistance change type storage element to the word line and bit line depends on the internal configuration of the memory cell array 1.

A column control circuit 2 controls the operation of the bit line. The column control circuit 2 includes a sense amplifier, a latch circuit, and a buffer. The column control circuit 2 selects the bit line and activates the bit line based on address information fed from the outside. The column control circuit 2 controls a potential and a current, which are supplied to the selected bit line.

A row control circuit 3 controls the operation of the word line. The row control circuit 3 includes a transfer gate and a switch element. The row control circuit 3 selects the word line and activates the word line based on the address information fed from the outside. The row control circuit 3 controls a potential and a current, which are supplied to the selected word line.

The column control circuit 2 controls the bit line, and the row control circuit 3 controls the word line, thereby performing data write, data read, and data erase to the resistance change type storage element connected to the word line and bit line.

For example, command information CMD is fed into a command interface 4 from the outside such as a host device, and the command interface 4 transfers the command information CMD to a state machine 7. For example, the command information CMD indicates a data write command, a data read command, or a data erase command.

A data input and output buffer 5 temporarily retains data DT fed or supplied. The data input and output buffer 5 transfers the write data DT fed from the outside to the memory cell array 1 through the column control circuit 2. The data input and output buffer 5 transfers the data DT read from the memory cell array to the outside. In cases where the fed data includes the command information, the data input and output buffer 5 transfers the fed data to the command interface.

For example, address information ADR is fed into an address buffer 6 from the outside. The address information ADR indicates address information (selected address information) of the selected resistance change type storage element (selected cell). The address buffer 6 transfers a bit line address (column address information) included in the address information ADR to the column control circuit 2. The address buffer 6 transfers a word line address (row address information) included in the address information ADR to the row control circuit 3.

The state machine 7 manages operation of a whole chip. The state machine 7 receives the command information CMD transferred from the command interface 4, and controls operations of the circuits 2 to 9 based on the command information CMD. The state machine 7 transfers status information to the host device located outside the chip. The host device determines whether the operation result is suitable based on the status information.

An energy supplying circuit 8 is provided in the chip. For example, the energy supplying circuit 8 produces such as a voltage (potential), a current, a heat, which is imparted to the resistance change type storage element, and produces the potential or current, which is supplied to the word line and bit line. For example, in the case of the memory in which the resistance state of the resistance change type storage element is switched by a pulse current or a pulse voltage, a pulse generator is used as the energy supplying circuit 8. The state machine 7 controls the current and potential supplying circuit 8. In cases where the data is written in the resistance change type storage element, or in cases where the data is read from the resistance change type storage element, the energy supplying circuit 8 supplies the produced potential and current to the selected bit line or selected word line through the column control circuit 2 or row control circuit 3.

(2) Memory Cell Array

An example of the internal configuration of the memory cell array 1 in the resistance change type memory of FIG. 1 will be described with reference to FIGS. 2 to 4.

Figure 2:
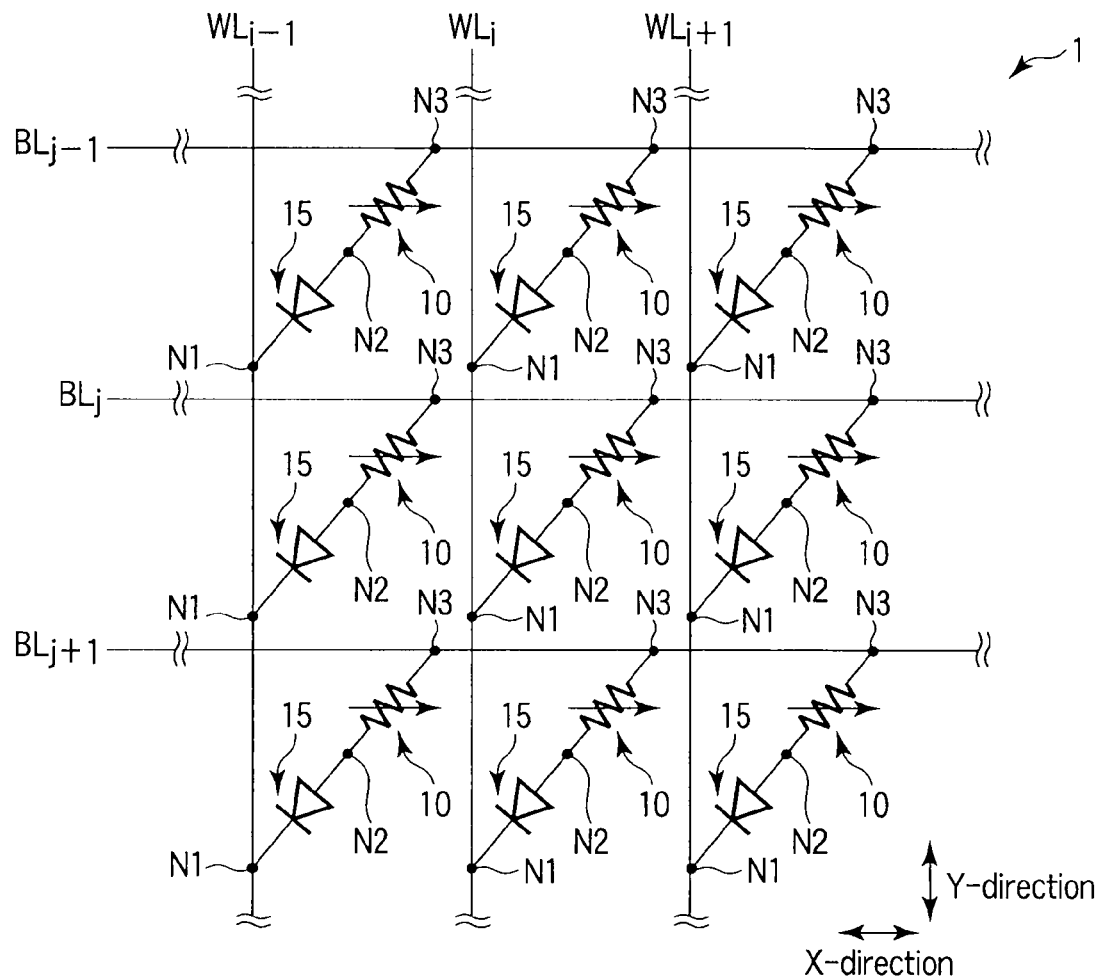
FIG. 2 is an equivalent circuit diagram illustrating an example of an internal configuration of a memory cell array.

FIG. 2 illustrates an equivalent circuit of the memory cell array 1. FIG. 3 is a perspective view illustrating a structure of the memory cell array 1. The memory cell array 1 of FIGS. 2 and 3 has a cross-point type structure.

Plural bit lines (first wiring) $BL_{j-1}$, $BL_j$, and $BL_{j+1}$ extended in an X-direction (first direction) are provided in the memory cell array 1. Plural word lines (second wiring) $WL_{i-1}$, $WL_i$, and $WL_{i+1}$ extended in a Y-direction (second direction) crossing the X-direction are provided in the memory cell array 1. The plural bit lines $BL_{j-1}$, $BL_j$, and $BL_{j+1}$ are disposed in the memory cell array 1 so as to be adjacent to one another in the Y-direction. The plural word lines $WL_{i-1}$, $WL_i$, and $WL_{i+1}$ are disposed in the memory cell array 1 so as to be adjacent to one another in the X-direction.

In the cross-point type memory cell array 1 of FIG. 2, the bit lines $BL_{j-1}$, $BL_j$, and $BL_{j+1}$ and the word lines $WL_{i-1}$, $WL_i$, and $WL_{i+1}$ are crossed with each other. A resistance change type storage element 10 is provided at each of the cross-points of the word lines $WL_{i-1}$, $WL_i$, and $WL_{i+1}$ and the bit lines $BL_{j-1}$, $BL_j$, and $BL_{j+1}$.

The resistance change type storage element 10 is one in which the data is stored in a nonvolatile manner according to a resistance value (resistance state) by utilizing the change in resistance value. For example, the resistance change type storage element 10 is a two-terminal element having one end and the other end.

The resistance change type storage element 10 is series-connected to a non-ohmic element (for example, diode) 15. In the cross-point type memory cell array 1, one resistance change type storage element 10 acts as one memory cell. The non-ohmic element 15 is provided to suppress a crosstalk with a non-selected cell during memory operation.

The series circuit including the resistance change type storage element 10 and the non-ohmic element 15 is connected between the word lines $WL_{i-1}$, $WL_i$, and $WL_{i+1}$ and the bit lines $BL_{j-1}$, $BL_j$, and $BL_{j+1}$. An example of a connection relationship of the resistance change type storage element 10 and non-ohmic element 15 to the word lines $WL_i$ and bit line $BL_j$ will be described below.

For example, one end of the resistance change type storage element 10 is connected to the bit line $BL_j$, and a connection point thereof constitutes a connection node N3. For example, the other end of the resistance change type storage element 10 is connected to an anode of the non-ohmic element 15, and a connection point thereof constitutes a connection node N2. For example, a cathode of the non-ohmic element 15 is connected to the word line $WL_i$, and a connection point thereof constitutes a connection node N3.

Figure 3:
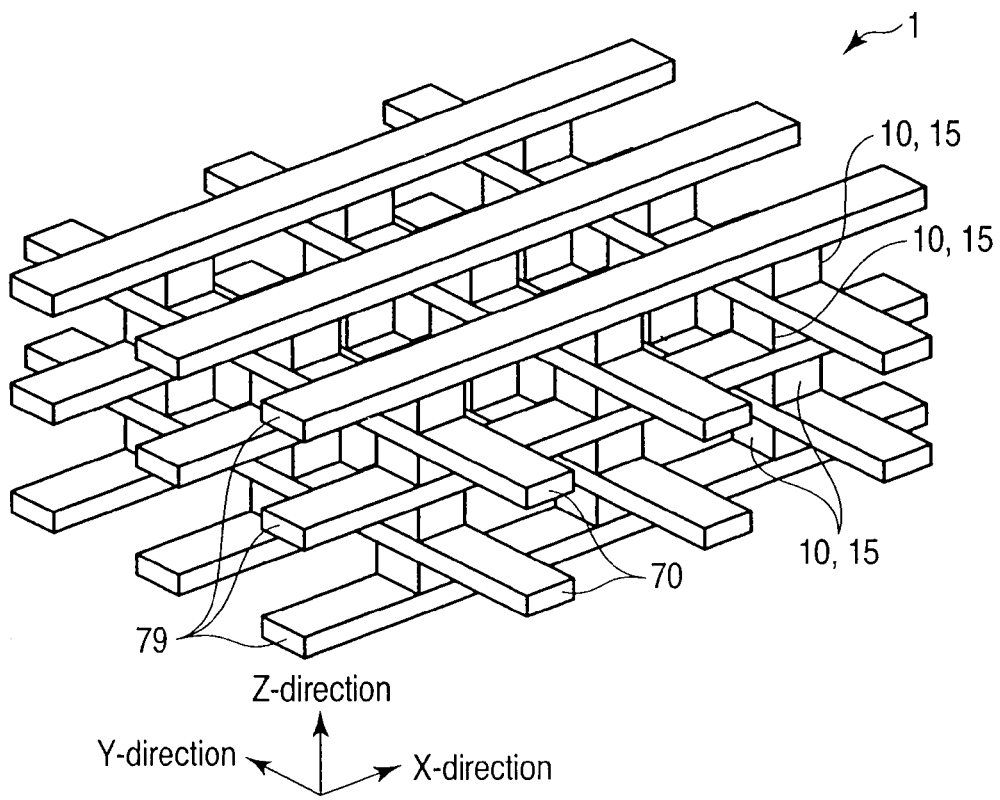
FIG. 3 is a perspective view illustrating an example of a structure of the memory cell array.

As illustrated in FIG. 3, in the cross-point type memory cell array 1, the bit line and the word line have a structure in which the bit lines and the word lines are laminated in a direction (Z-direction) perpendicular to an X-Y plane. The resistance change type storage element 10 and the non-ohmic storage element 15 are sandwiched between the bit line and the word line, and laminated on wirings of the bit lines and word lines.

In FIG. 3, wirings 70 and wirings 79 are alternately laminated in the Z-direction, and the resistance change type storage element 10 and the non-ohmic element 15 are provided between the two laminated wirings 70 and 79.

As reduction of production cost per one chip is achieved by the structure of FIG. 3. In FIG. 3, the wirings (word lines and bit lines) and the resistance change type storage elements are alternately laminated in the Z-direction. However, a structure in which plural layers are alternately laminated with the inter-layer insulator interposed therebetween may be adopted, when a layer including the bit line/resistance change type storage element and the non-ohmic element/word line is set to one unit. At this point, the number of resistance change type storage elements connected to one wiring becomes half of that of the structure of FIG. 3, so that high-speed operation can be realized to improve the reliability.

As with the column control circuit 2 and row control circuit 3 of FIG. 1, a peripheral circuit that controls the operation of the memory cell array 1 may be formed on a semiconductor substrate in a lower portion of the memory cell array with the inter-layer insulator interposed therebetween, and the memory cell array may be laminated on the peripheral circuit. At this point, a chip area of the resistance change type memory of the embodiment is substantially equal to an area of the memory cell array.

Figure 4:
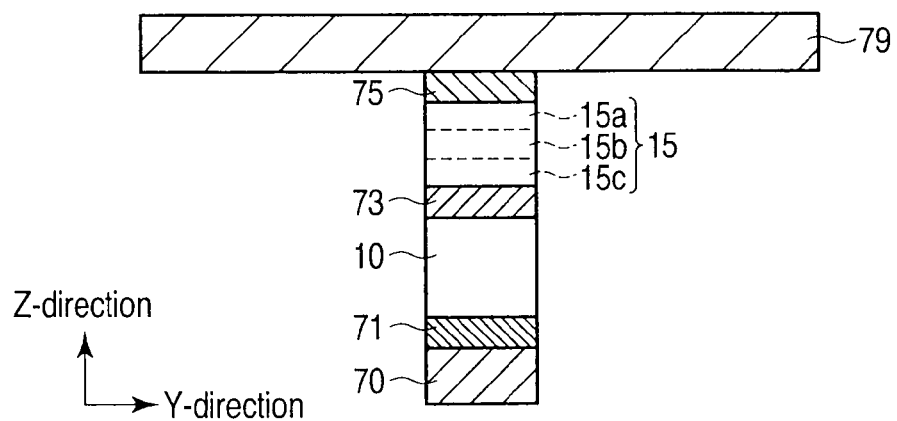
FIG. 4 is a sectional view illustrating an example of the structure of the memory cell array.

FIG. 4 illustrates a sectional structure in which the memory cell array 1 is partially extracted.

The wiring 70 is extended in the X-direction. The wiring 70 is made of a low-resistivity material that is less affected by heat. Metallic materials such as aluminum, copper, and tungsten and silicide materials such as tungsten silicide, nickel silicide, and cobalt silicide are used in the wiring 70. For example, the wiring 70 acts as the bit line.

The resistance change type storage element 10 is provided above the wiring 70 with a first electrode layer 71 interposed therebetween. The resistance change type storage element 10 includes a storage layer whose resistance value is changed by imparting a voltage, a current, heat, or chemical energy. The storage layer is made of a metal oxide, chalcogenide, and polymer in which electrically conductive particles are dispersed. An impurity may be added to the metal oxide and chalcogenide, which are used in the storage layer. For example, the metal oxide includes transition metal oxide such as a perovskite metal oxide and binary metal oxide. Examples of the perovskite metal oxide include PCMO ($Pr_{0.7}Ca_{0.3}MnO_3$), SrTi(Zr)$O_3$ added with Nb, and SrTi(Zr)$O_3$ added with Cr. Examples of the binary metal oxide include NiO, $TiO_2$, and $Cu_2O$. Examples of the chalcogenide include Ge—Sb—Te, In—Sb—Te, Ag—In—Sb—Te, and Ge—Sn—Te.

The resistance state of the storage layer is reversely changed from a high-resistance state to a low-resistance state or from the low-resistance state to the high-resistance state by supplying the current or potential. In the memory device in which the resistance change type storage element is used, the pieces of data are distinguished by correlating the transition of the resistance state to binary levels or, at least three levels.

The first electrode layer 71 acts as a lower electrode of the resistance change type storage element 10. Further, the electrode layer 71 acts as a barrier metal that prevents constituent atoms of the resistance change type storage element 10 and wiring 70 from diffusing therebetween, and acts as an adhesive layer that prevents peel-off between the resistance change type storage element 10 and the wiring 70. The peel-off between the resistance change type storage element 10 and the wiring 70 is caused by application of a high voltage or high current.

For example, the electrode layer 71 is made of a metal, an alloy, or an electrically conductive compound. Examples of the metal used in the electrode layer 71 include platinum (Pt), gold (Au), silver (Ag), Ir, cobalt (Co), titanium (Ti), aluminum, Ru, and Rh. The electrically conductive compound used in the electrode layer 71 includes TiAlN, TiN, SrRuO, RuN, TaN, TaAlN, LaNiO, PtIrOx, and PtRhO. These metals and electrically conductive compounds are used as the electrode layer 71 in the form of a single-layer film or an appropriately-combined laminated film. The material used in the electrode layer 71 is set according to the material used in the storage layer 10. Alternatively, different materials may be used in the electrode layer 71 according to the material used in the storage layer (resistance change type storage element) 10.

A second electrode layer 73 is provided on an upper surface of the resistance change type storage element 10. The non-ohmic element 15 is provided on the electrode layer 73.

The second electrode layer 73 acts as an upper electrode of the resistance change type storage element 10. The resistance change type storage element 10 may be an element in which the transition of the resistance state of the storage layer 10 is exerted by the combination of the upper and lower electrodes 71 and 73 and the storage layer 10 or an element in which the transition of the resistance value of the storage layer 10 is made.

The second electrode layer 73 acts as a buffer layer that suppresses constituent atoms or molecules of the resistance change type storage element 10 and non-ohmic element 15 from diffusing therebetween. The electrode layer 73 may have a function of absorbing a difference of work functions of the materials used in the two elements 10 and 15 or may act as the electrode to the two elements 10 and 15.

A film that homogenizes the orientation of the film constituting the non-ohmic element 15 may be inserted between the electrode layer 73 and the non-ohmic element 15. The buffer layer, the barrier metal, and the adhesive layer may be provided between the electrode layer 73 and the element 10 and between the electrode layer 73 and the element 15. The material used in the electrode layer 73 may be identical to or different from the material used in the electrode layer 71.

A rectifying element such as a PN junction diode, a PIN junction diode, a Schottky diode, or a Zener diode is used as the non-ohmic element 15. For example, in cases where the PIN junction diode is used as the non-ohmic element 15, a p-type semiconductor layer 15a is provided on the side of a wiring 79, and an n-type semiconductor layer 15c is provided on a side of the wiring 70. An intrinsic semiconductor layer 15b is sandwiched between the p-type semiconductor layer 15a and the n-type semiconductor layer 15c. In the diode, a current is passed in only one direction from an anode side to a cathode side during a steady operation. Therefore, in cases where the diode is used as a non-ohmic element 15, the operation (write/read) performed to the resistance change type storage element 10 is the unipolar operation.

Alternatively, an element having an MIM (Metal-Insulator-Metal) structure and an element having an SIS (Silicon-Insulator-Silicon) structure may be used as the non-ohmic element 15. Because the non-ohmic element 15 having the MIM structure or the SIS structure can bi-directionally supply the current (or voltage) to the resistance change type storage element 10, the bipolar operation can be performed to the resistance change type storage element 10.

A wiring 79 is provided above the upper layer of the non-ohmic element 15 with a third electrode layer 75 interposed therebetween. The electrode layer 75 acts as a barrier metal or adhesive layer to the non-ohmic element 15 and wiring 79. A single-layer film made of a metallic material or a laminated film made of Ti/TiN is used as the electrode layer 75.

The wiring 79 is extended in the Y-direction. As with the wiring 70, the metallic materials such as aluminum, copper, and tungsten and the silicide materials such as tungsten silicide, nickel silicide, and cobalt silicide are used in the wiring 79. For example, the wiring 79 acts as the word line.

As illustrated in FIG. 4, the structure in which the resistance change type storage element 10 and the non-ohmic element 15 are laminated in the Z-direction is referred to as a memory plug structure.

In FIGS. 3 and 4, the memory plug structures located across one wiring (bit line or word line) from each other in the laminated direction (Z-direction) have a mirror structure in relation to the wiring. Specifically, the wiring (bit line) 70 is sandwiched between the two resistance change type storage elements 10 laminated in the Z-direction, and is shared by the two resistance change type storage elements. The wiring 79 is sandwiched between the two non-ohmic elements 15 laminated in the Z-direction, and is shared by the two non-ohmic elements 15. However, the structure and positional relationship of the elements 10 and 15 and the wirings 70 and 79 are not limited to the structure of FIGS. 3 and 4 as long as the memory cell array is normally operated.

(3) Basic Operation

The operation of the resistance change type memory of the embodiment will be described below with reference to FIGS. 1, 2, 5A, 5B, and 5C.

FIGS. 5A and 5B are schematic diagrams for explaining a correlation between data and a resistance state of the resistance change type storage element 10. In FIGS. 5A and 5B, a horizontal axis indicates the resistance state (resistance value) of the resistance change type storage element, and a vertical axis indicates the probability of the resistance change type storage element being in a certain resistance state.

As described above, the data is allocated to the resistance change type storage element 10 according to the magnitude of the resistance value, and the resistance change type storage element 10 is used as a binary memory or a multi-level memory.

As illustrated in FIG. 5A, in a binary memory (SLC: single level cell), one-bit data, that is, a value of "0" or "1" is stored according to the magnitude (distribution) of the resistance value of the resistance change type storage element.

For example, in FIG. 5A, the data "0" is allocated to the distribution in the low-resistance state of the resistance change type storage element, and the data "1" is allocated to the distribution in the high-resistance state of the resistance change type storage element. For example, the data "0" is set to a write (program) level, and the data "1" is set to an erase level. In FIG. 5A, the resistance value corresponding to the data "0" is set in a range of 1 kΩ to 10 kΩ, and the resistance value corresponding to the data "1" is set in a range of 100 kΩ to 1 MΩ. However, the range of the resistance value corresponding to the data may appropriately be set within a variable range of the resistance value (resistance state) of the resistance change type storage element, and obviously the range of the resistance value corresponding to the data depends on the material used in the element 10.

In the multi-level memory (MLC: multi level cell), plural write levels are set according to the magnitude of the resistance value. FIG. 5B illustrates an example of a four-level memory. Two-bit data is stored in the four-level memory.

In the four-level memory, as with the binary memory, pieces of data of the four levels (two bits) are allocated according to the magnitude of the resistance value. In the case of the four-level memory, "00", "01", and "10" are set to the write levels, and "11" is set to the erase level. In FIG. 5B, for example, "01", "00", "10", and "11" are allocated to the distributions of the element according to the resistance value in ascending order of the resistance value. In the four-level memory, the range of the resistance value corresponding to the "00" data is set between the range of the resistance value corresponding to the "01" data and the range of the resistance value corresponding to the "10" data.

The write operation and read operation of the resistance change type memory of the embodiment will be described. The resistance change type memory in which the unipolar operation is used will be described below.

Data is written in the resistance change type storage element 10 by imparting energy such as a voltage and current to the resistance change type storage element 10 such that the resistance value of the resistance change type storage element (selected cell) of the write target falls within the distribution of the resistance state corresponding to the data. Therefore, the resistance state of the resistance change type storage element 10 is changed, and the data is stored in the resistance change type storage element 10 in the nonvolatile manner. In the embodiment, the case in which the write operation is performed by supplying a current or voltage (hereinafter referred to as pulse current or pulse voltage) having a predetermined pulse shape to the resistance change type storage element will be described below.

Figure 5C:
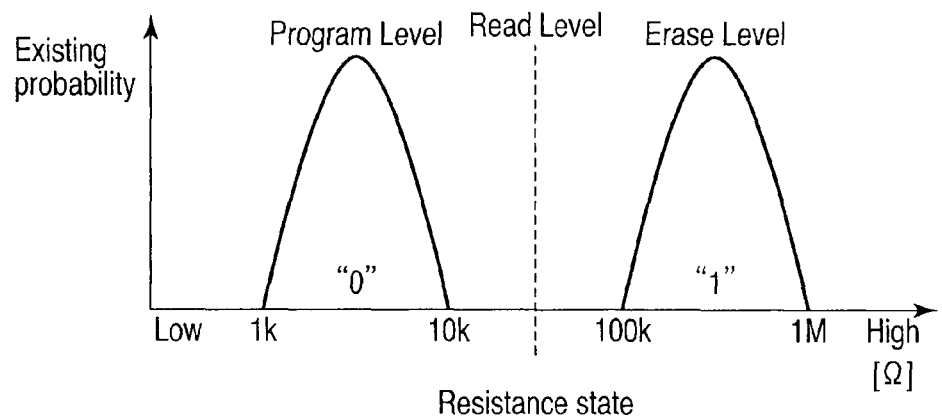
FIG. 5C is a view for explaining a basic operation of the resistance change type memory.
Figure 5C:
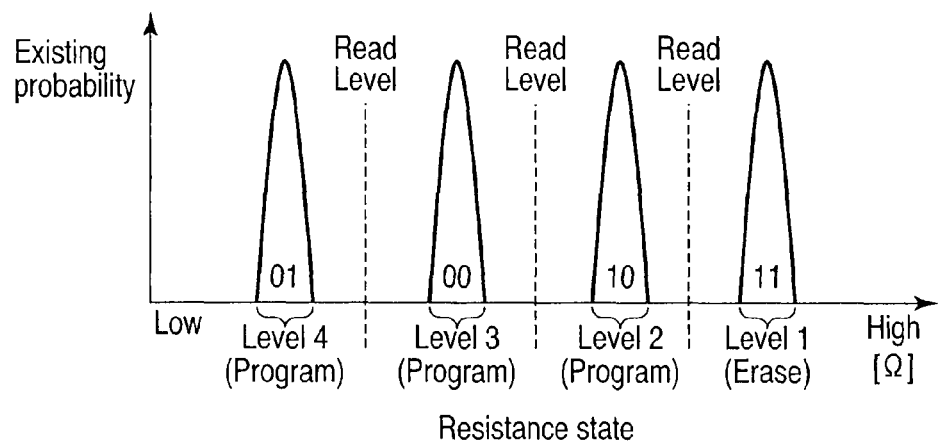
Figure 5C:
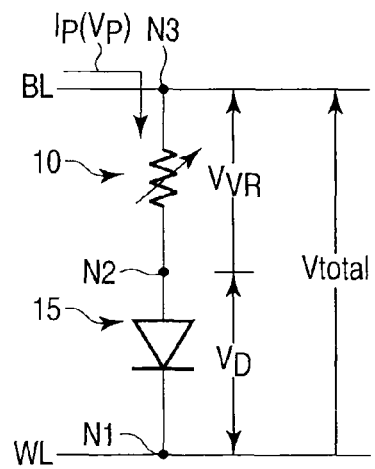

As illustrated in FIG. 5C, in cases where the memory cell array 1 has the cross-point type circuit configuration, the series circuit including the resistance change type storage element 10 and the non-ohmic element 15 is connected between the bit line BL and the word line WL.

For example, a predetermined pulse voltage (write voltage) $V_P$ is applied to the bit line BL according to the operation, and a ground potential is applied to the word line WL, thereby performing the write operation to the resistance change type storage element (memory cell) 10. A pulse current (write current) $I_P$ is generated according to a potential difference between the bit line BL and the word line WL. When the pulse current $I_P$ is passed between the bit line BL and the word line WL, a potential difference $V_{total}$ is applied between the connection node N1 and the connection node N3, and the energy that changes the resistance state of the resistance change type storage element 10 is imparted to the resistance change type storage element 10. In the following description, it is assumed that the pulse current $I_P$ generated by the pulse voltage $V^P$ is the energy that changes the resistance state of the resistance change type storage element 10. A current value and a pulse width of the pulse current $I_P$ have a correlation with a voltage value and a pulse width of the pulse voltage applied to the bit line BL. Although the pulse current $I_P$ is described here, the operation of the resistance change type memory of the embodiment is substantially identical even if the pulse voltage is used.

For example, the pulse current $I_P$ is supplied to the bit line BL, and is passed from the anode (N3) of the non-ohmic element 15 toward the cathode (N2). The pulse current $I_P$ is supplied to the resistance change type storage element 10 and the non-ohmic element 15.

The pulse current $I_P$ necessary to change the resistance state of the resistance change type storage element 10 from the low-resistance state to the high-resistance state is supplied to apply a potential to the resistance change type storage element 10, whereby the data "1" is written in the resistance change type storage element (memory cell) 10. The pulse current $I_P$ necessary to change the resistance state of the resistance change type storage element 10 from the high-resistance state to the low-resistance state is supplied to apply a potential to the resistance change type storage element 10, whereby the data "0" is written in the resistance change type storage element (memory cell) 10.

In other words, the pulse voltage applied to the bit line is divided, and the divided voltages are applied to the non-ohmic element 15 and the resistance change type storage element 10. The resistance state of the resistance change type storage element 10 is changed by the divided potential difference (voltage), thereby writing predetermined data in the resistance change type storage element 10.

Thus, during the write operation, a product of the resistance value of the resistance change type storage element 10 and the pulse current $I_P$ passed through the resistance change type storage element 10 is applied as a potential difference $V_{VR}$ between the connection nodes N3 and N2, that is, to the resistance change type storage element 10. Because the resistance value of the resistance change type storage element 10 changes according to the stored data, the value of the potential difference $V_{VR}$ applied during the operation depends on the resistance state of the element 10. A constant potential difference $V_D$ is applied between the connection nodes N2 and N1, that is, to the non-ohmic element (diode) 15 according to the magnitude of the supplied pulse current $I_P$. In the configuration of the embodiment, the bit line BL takes the high potential and the word line WL takes the low potential.

In the write operation of the resistance change type memory, the resistance state of the resistance change type storage element 10 may be changed by utilizing Joule heat generated by the passage of the pulse current $I_P$ through the resistance change type storage element 10 in addition to the potential applied to the resistance change type storage element 10.

In the embodiment, the operation for changing the resistance state of the resistance change type storage element from the low-resistance state to the high-resistance state is referred to as a reset operation, and the operation for changing the resistance state from the high-resistance state to the low-resistance state is referred to as a set operation.

Reading the data from the resistance change type storage element 10 is performed as follows.

As illustrated in FIG. 5A, a read level corresponding to the predetermined resistance value is set between the distributions of the resistance states corresponding to the pieces of data.

Reading the data from the resistance change type storage element is performed by determining whether the resistance value of the resistance change type storage element is higher than the resistance value indicated by the read level. For example, a sense potential or a sense current, which is imparted to the bit line connected to the selected cell, fluctuates according to the resistance value of the resistance change type storage element (selected cell) 10. The fluctuation amount is sensed by a sense amplifier of the column control circuit 2. A comparison result of the fluctuation amount and the reference value (read level) is read as the data DT to the outside while correlated with "1" or "0".

2. First Embodiment

A resistance change type memory according to a first embodiment of the invention will be described with reference to FIGS. 6 to 13B. For example, the resistance change type memory of the first embodiment is ReRAM (Resistive Random Access Memory). However, obviously the resistance change type memory of the first embodiment may be a PCRAM (Phase Change Random Access Memory) or other memory, such as a Magnetoresistive Random Access Memory (MRAM) in which the resistance change type storage element is used. Hereinafter the same component is designated by the same numeral, and an overlapping description is made if needed. In the first embodiment, for the sake of convenience, only components required for the description are illustrated. However, the invention is not limited to such components.

(1) Basic Example

A basic example of the resistance change type memory of the first embodiment will be described with reference to FIGS. 6 to 8.

(a) Circuit Configuration

A circuit configuration in the basic example of the resistance change type memory of the first embodiment will be described with reference to FIG. 6.

FIG. 6 illustrates the circuit configuration in the basic example of the resistance change type memory. For clarification, the one resistance change type storage element 10 provided in the memory cell array and one bit line and one word line WL connected to the element 10 are illustrated in FIG. 6.

As illustrated in FIG. 6, as with the circuit configuration of FIG. 2, the resistance change type storage element 10 is series-connected to the non-ohmic element 15.

In the first embodiment, the resistance change type storage element (memory cell) 10 is a two-terminal element.

In the first embodiment, for example, the non-ohmic element 15 is a diode. Hereinafter the non-ohmic element 15 is referred to as diode 15. A PIN junction diode, a PN junction diode, and a Zener diode (constant voltage diode) are used as the diode 15.

One end of the resistance change type storage element 10 is connected to the bit line BL. In FIG. 6, the connection point of the resistance change type storage element 10 and the bit line BL constitutes the connection node N3. The other end of the resistance change type storage element 10 is connected to the anode of the diode 15. In FIG. 6, the connection point of the resistance change type storage element 10 and the diode 15 constitutes the connection node N2. The cathode of the diode 15 is connected to the word line WL, and the connection point of the diode 15 and the word line WL constitutes the connection node N1.

An energy supplying circuit 8A is connected to one end of the bit line BL through a switch element 60. In cases where the resistance change type storage element 10 is an element whose resistance state is changed by the applied pulse voltage or pulse current, a pulse generator 8A is used as the energy supplying circuit 8A.

The pulse generator 8A is controlled by a control signal PG. Under the control of the state machine 7, the pulse generator 8A applies the pulse voltage to the bit line BL to produce the pulse current $I_P$ having a constant pulse width and current value. The produced pulse current $I_P$ is supplied through the on-state switch element 60 to the bit line BL activated based on the selected address information. The pulse current $I_P$ is supplied to the selected resistance change type storage element (selected cell) 10 and the diode 15. Therefore, the transition of the resistance state of the resistance change type storage element 10 is made to perform the data write or data erase. The stored data is read by supplying the current based on the resistance state of the resistance change type storage element 10.

There is the case where the operation (setting operation) for switching the resistance state of the resistance change type storage element 10 from the high-resistance state to the low-resistance state differs from the operation (resetting operation) for switching the resistance state from the low-resistance state to the high-resistance state in that the pulse width and current value of the pulse current $I_P$ vary. The pulse width and current value, which are used in the setting/reset operation (write/erase operation), differs from the current pulse width and current value, which are used to read the data.

For example, the switch element 60 is a field effect transistor. One end of a current path of the field effect transistor 60 that is the switch element 60 is connected to the bit line BL, and the other end of the current path is connected to an output terminal of the pulse generator 8A. A control signal CS<0> is fed into a gate (control terminal) of the field effect transistor 60. The control signal CS<0> controls the turn-on and turn-off of the field effect transistor 60. The turn-on and turn-off of the switch element (field effect transistor) 60 controls activation and deactivation of the bit line BL. That is, when the field effect transistor 60 is turned on, the pulse generator 8A and the resistance change type storage element 10 are electrically connected. The pulse current $I_P$ is supplied to the bit line BL and resistance change type storage element 10 through the on-state switch element 60.

The state machine 7 controls the on state and off state of the switch element 60 based on the column address information (selected column address information) of the selected cell.

Hereinafter the switch element 60 is referred to as column selection switch element 60, and the control signal CS<0> is referred to as column selection signal CS<0>. For example, the column selection switch element 60 is provided in the column control circuit 2 of FIG. 1. The column selection switch element 60 is provided in each of the plural bit lines BL in the memory cell array.

The switch element 50 is connected to one end of the word line WL through a capacitance circuit 20A. For example, the switch element 50 is a field effect transistor. One end of the current path of the field effect transistor 50 that is the switch element 50 is connected to the capacitance circuit 20A. The other end of the current path of the field effect transistor 50 is connected to the ground terminal WL_GND of the word line WL. A control signal RS<0> is fed into a gate (control terminal) of the field effect transistor 50. The control signal RS<0> controls the turn-on and turn-off of the field effect transistor 50. The turn-on and turn-off of the switch element (field effect transistor) 50 controls the activation and deactivation of the word line WL. The on-state switch element 50 supplies a ground potential at a ground terminal WL_GND to the activated word line WL.

The state machine 7 controls the on state and off state of the switch element 50 based on the row address information (selected row address information) of the selected cell.

Hereinafter the switch element 50 is referred to as row selection switch element 50, and the control signal RS<0> is referred to as row selection signal RS<0>. For example, the row selection switch element 50 is provided in the row control circuit 3 of FIG. 1. The row selection switch element 50 is connected in each of the plural word lines WL in the memory cell array.

The capacitance circuit 20A is connected to the word line WL, and is connected in series between the connection node N1 and one end of the current path of the row selection switch element 50. The state machine 7 controls the operation of the capacitance circuit 20A.

The capacitance circuit 20A includes one capacitive element 21 and two switch elements (first and second switch elements) 22 and 23.

The capacitive element 21 and the switch element 22 are connected in series in the capacitance circuit 20A. The capacitive element 21 has an electrostatic capacitance C ranging from 10 pF to 10 nF, for example. In cases where the capacitive element 21 has the electrostatic capacitance C ranging from 100 pF to 1 nF, power consumption can be suppressed to a low level during the write operation, and the write operation (particularly, reset operation) can be stabilized. However, the electrostatic capacitance value of the capacitive element 21 depends on the configuration or type of the resistance change type storage element 10.

The pulse current $I_P$ supplied to the bit line BL is supplied to the capacitance circuit 20A through the connection nodes N1 and N3, that is, through the resistance change type storage element 10. The capacitive element 21 is charged by the supplied pulse current $I_P$. The capacitive element 21 supplies the discharge current using the charge Q.

The switch element 22 constitutes a current path to the capacitive element 21 and controls the activation of the capacitive element 21.

For example, the switch element 22 is a field effect transistor. A control signal SW<A> is fed into a gate (control terminal) of the field effect transistor 22, and the control signal SW<A> controls the turn-on and turn-off of the field effect transistor 22 that is the switch element. One end of the current path of the field effect transistor 22 is connected to the connection node N1, and the other end of the current path of the field effect transistor 22 is connected to one end of the capacitive element 21. The other end of the capacitive element 21 is connected to one end of the row selection switch element 50.

The switch element 23 of the capacitance circuit 20A is connected in parallel to the series-connected capacitive element 21 and switch element 22. For example, the switch element 23 is a field effect transistor. A control signal SW<B> is fed into a gate (control terminal) of the field effect transistor 23, and the control signal SW<B> controls the turn-on and turn-off of the field effect transistor 23 that is the switch element. One end of the current path of the field effect transistor 23 is connected to one end of the switch element 22. The other end of the current path of the field effect transistor 23 is connected to the other end of the capacitive element 21. That is, the switch element (field effect transistor) 23 is connected in parallel to the capacitive element 21 and switch element 22 while connected in series between the connection node N1 and the row selection switch element 50.

Thus, the two current paths are provided in the capacitance circuit 20A. One of the current paths in the capacitance circuit 20A is a current path that goes through the capacitive element 21 and the switch element 22. The other current path in the capacitance circuit 20A is a current path that goes through the switch element 23. For example, the discharge current of the capacitive element 21 is discharged to the ground terminal WL_GND through the two switch elements 22 and 23 of the capacitance circuit 20A and the row selection switch element 50.

During the operation of the resistance change type memory, based on the pieces of row and column address information of the selected cell, the row and column selection switch elements 50 and 60 are turned on to activate the word line (selected word line) WL and bit line (selected bit line) BL, which are connected to the selected cell (resistance change type storage element) 10.

Therefore, the selected cell 10 and diode 15, which are series-connected between the bit line BL and the word line WL, are made conductive with the bit line BL and word line WL, and the pulse current $I_P$ produced by the pulse generator 8A is supplied to the selected cell.

In the resistance change type memory of the first embodiment, one end of the resistance change type storage element 10 is connected to the bit line BL, and the cathode of the diode (non-ohmic element) series-connected to the resistance change type storage element 10 is connected to the word line WL. The resistance change type memory includes the capacitance circuit 20A connected to the word line WL.

When the transition of the resistance state of the resistance change type storage element 10 is made from the low-resistance state to the high-resistance state, the pulse currents $I_P$ having the same magnitude are passed through the resistance change type storage element 10 before and after the transition of the resistance state. In FIG. 5C, the voltage $V_{VR}$ applied to the resistance change type storage element 10 in the high-resistance state becomes larger than the potential difference $V_{VR}$ applied to the resistance change type storage element 10 in the low-resistance state. Therefore, there is a case where a large potential difference in which the transition of the resistance state of the resistance change type storage element 10 is made is applied immediately after the transition of the resistance state of the resistance change type storage element 10 is made from the low-resistance state to the high-resistance state. As a result, the resistance change type storage element 10 that is put in the high-resistance state by the reset operation is switched to the low-resistance state again, in the case of the use of the resistance change type storage element in which a small difference exists between the potential difference at which the resistance state may be switched from the low-resistance state to the high-resistance state and the potential difference at which the resistance state is switched from the high-resistance state to the low-resistance state.

In the first embodiment, the pulse current $I_P$ passed from the selected bit line BL to the selected word line WL is supplied to the capacitive element 21 of the capacitance circuit 20A through the resistance change type storage element 10 during the operation (reset operation) for switching the resistance state of the resistance change type storage element 10 from the low-resistance state to the high-resistance state.

The pulse current $I_P$ accumulates the charge Q in the capacitive element 21 to charge the capacitive element 21. The transition of the resistance change type storage element 10 to the high-resistance state is made while the capacitive element 21 is charged. When the resistance state of the resistance change type storage element 10 is changed from the low-resistance state to the high-resistance state, a charging speed of the capacitive element 21 becomes moderate.

As the capacitive element 21 connected to the selected word line WL is charged, the potential difference applied between the selected bit line BL and the selected word line WL is gradually decreased, thereby reducing the potential difference (voltage) applied to the resistance change type storage element 10 after the resistance state is switched to the high-resistance state and the current supplied to the resistance change type storage element 10. Therefore, immediately after the transition of the resistance state of the resistance change type storage element 10 is made from the low-resistance state to the high-resistance state, the resistance change type storage element 10 is prevented from returning to the low-resistance state due to the potential difference caused by the pulse current $I_P$ passed through the element 10.

After the transition of the resistance state of the resistance change type storage element 10 is made to the high-resistance state, the charge Q charged in the capacitive element 21 is discharged to the ground terminal WL_GND through the switch element 23 of the capacitance circuit 20A.

In the resistance change type memory of the first embodiment, the potential difference applied to the resistance change type storage element is adjusted using the charge potential of the capacitive element 21. Therefore, the resistance change type storage element whose resistance state is switched from the low-resistance state to the high-resistance state can be prevented from making the transition to the low-resistance state again. That is, the resistance change type memory of the first embodiment can prevent the writing error.

Accordingly, the operational reliability can be improved in the resistance change type memory of the first embodiment.

The configuration of the resistance change type memory of the first embodiment is effectively applied to a memory such as ReRAM in which the resistance change type storage element 10 is used. In the memory such as ReRAM, the transition (response speed) of the resistance state is made at high speed in the resistance change type storage element.

(b) Operation

The operation in the basic example of the resistance change type memory of the first embodiment will be described with reference to FIGS. 6 to 8. An operation (set operation) for switching the resistance state of the resistance change type storage element from a high-resistance state to a low-resistance state and an operation (reset operation) for switching the resistance state from the low-resistance state to the high-resistance state will be described below. The operation for switching the resistance state of the resistance change type storage element using a pulse current $I_P$ will be described by way of example.

(b-1) Set Operation

The set operation of the resistance change type memory of FIG. 6 will be described with reference to FIGS. 1 and 7A. FIG. 7A is a timing chart (waveform chart) for explaining the set operation of the resistance change type memory of FIG. 6.

First, the command information (write command) CMD for providing a direction of the write operation and the address information (selected address information) ADR on the selected cell that becomes the write target are fed into the chip. The write command is fed into the state machine 7 through the command interface 4. The selected address information is transferred to the column control circuit 2 and row control circuit 3 through the address buffer 6.

As illustrated in FIG. 7A, the state machine 7 changes the control signal PG of the pulse generator 8A from an "L (Low)" level to an "H (High)" level to turn on the pulse generator 8A. Therefore, the pulse generator 8A produces the pulse current (pulse voltage) $I_P$ having the predetermined pulse shape as the energy for making the transition of the resistance state of the selected cell (resistance change type storage element) 10. For example, the current value and pulse width of the produced pulse current $I_P$ are set based on the write data DT that is transferred to the column control circuit 2 through the data input and output buffer 6.

The state machine 7 makes the transition of the control signal RS<0> of the row selection switch element 50 from the "L" level to the "H" level based on the fed row address information. Therefore, the row selection switch element 50 is turned on to activate the word line (selected word line) WL indicated by the row address information.

The state machine 7 makes the transition of the control signal SW<B> of the switch element 23 from the "L" level to the "H" level. Therefore, the switch element 23 of the capacitance circuit 20A is turned on. As illustrated in FIG. 7A, during the set operation of the memory of FIG. 6, the control signal SW<A> of the switch element 22 connected to the capacitive element 21 is maintained at the "L" level, and the switch element 22 is turned off. In FIG. 7A, the control signal SW<B> of the switch element 23, the control signal PG and RW<0> of the pulse generator 8A and row selection switch element 50 are substantially simultaneously changed to the "H" level. However, the invention is not limited to the configuration of FIG. 7A.

After the pulse generator 8A, the row selection switch element 50, and the switch element 23 are turned on, the state machine 7 makes the transition of the control signal CS<0> of the column selection switch element 60 from the "L" level to the "H" level based on the fed column address information. Therefore, the bit line (selected bit line) BL indicated by the column address information is activated. The pulse current $I_P$ produced by the pulse generator 8A is supplied to the selected bit line BL through the on-state column selection switch element 60.

During the set operation, the potential at the selected word line WL is set to the ground potential WL_GND. A potential difference is generated between the selected bit line BL and the selected word line WL by supplying the pulse current (write current) $I_P$ used in the set operation to the selected bit line BL.

The pulse current $I_P$ having the predetermined pulse shape, used in the set operation, is supplied to the resistance change type storage element 10 that is the selected cell and the diode 15. Preferably, the current value of the pulse current $I_P$ used in the set operation ranges from 10 nA to 50 µA. Preferably, the pulse width of the pulse current $I_P$ used in the set operation ranges from 10 ns to 10 µS. However, the current value and pulse width of the pulse current $I_P$ are not limited to the above-described values, but obviously the current value and pulse width depend on the area and thickness of the resistance change type storage element 10 and the material used in the resistance change type storage element 10.

The pulse current $I_P$ is passed through the resistance change type storage element 10 to apply the potential difference between one end N3 and the other end N2 of the resistance change type storage element 10, thereby switching the resistance value that is of the selected cell from the high-resistance state to the low-resistance state. Therefore, predetermined data (for example, "0") is stored in the selected cell. The resistance state of the resistance change type storage element 10 may be changed by Joule heat generated by the pulse current $I_P$.

The pulse current $I_P$ passed through the selected cell 10 is discharged to the ground terminal WL_GND of the word line WL through the capacitance circuit 20A. During the set operation, the capacitive element 21 of the capacitance circuit 20A is electrically separated from the selected word line WL by the off-state switch element 22, and the switch element 23 to which the capacitive element is not connected becomes the current path in the capacitance circuit 20A. Therefore, the pulse current $I_P$ is discharged to the word line ground terminal WL_GND through the switch element 23, and the capacitive element 21 is not charged by the pulse current $I_P$ during the set operation.

The pulse current $I_P$ is passed through the selected cell 10 in a period during which the column selection signal CS<0> is set to the "H" level.

The state machine 7 makes the transition of the column selection signal CS<0> from the "H" level to the "L" level after the resistance state of the resistance change type storage element is switched from the high-resistance state to the low-resistance state after a predetermined period elapses. Therefore, the column selection switch element 60 is turned off, and the current $I_P$ is not supplied to the selected cell 10. Then, the state machine makes the transition of the control signal PG and RS<0> of the pulse generator 8A and row selection switch element 50 from the "H" level to the "L" level to turn off the pulse generator 8A and row selection switch element 50. The state machine makes the transition of the control signal SW<B> of the switch element 23 from the "H" level to the "L" level to turn off the switch element 23 of the capacitance circuit 20A.

Thus, the set operation performed to the selected cell (resistance change type storage element) 10 is completed.

An operation (verify operation) for verifying whether the predetermined data is normally written through the above operation may be performed.

That is, after the pulse current $I_P$ is passed through the selected cell 10 and turn off the capacitance circuit 20A, whether the resistance state of the selected cell 10 indicates a resistance value corresponding to the fed write data DT is verified by reading the data (resistance value) of the selected cell 10 using a read circuit (such as sense amplifier) provided in the column control circuit 2.

The write operation is ended when the write data and the data stored in the selected cell are matched with each other. On the other hand, when the write data and the data stored in the selected cell are not matched with each other, the data is written in the same selected cell 10 again. The pulse current $I_P$ used to write the data again may have the same pulse shape as the pulse current used in the first-time data write or the pulse shape in which the current value and pulse width are adjusted.

The resistance state of the selected cell (resistance change type storage element) 10 is confirmed before the set operation, and the pulse current may be not supplied when the selected cell is in the low-resistance state.

During the set operation, one of the bit line and the word line takes a deactivated state in the resistance change type storage element (non-selected cell) that is not the write target in the memory cell array. Therefore, the pulse current is not supplied to the non-selected cell, and the set operation is not performed to the non-selected cell.

Thus, during the set operation, because the capacitive element 21 of the capacitance circuit 20A is separated from the current path of the pulse current, the capacitive element 21 is not charged, and does not degrade the set operation of the selected resistance change type storage element 10.

Accordingly, the set operation is stably performed to the selected resistance change type storage element in the memory of FIG. 6 in which the capacitance circuit 20A is connected to the word line WL.

(b-2) Reset Operation

The reset operation of the resistance change type memory of FIG. 6 will be described with reference to FIGS. 7B and 8. FIG. 7B is a timing chart (waveform chart) for explaining the reset operation of the resistance change type memory of FIG. 6. FIG. 8 is a schematic diagram for explaining the reset operation of the resistance change type memory of FIG. 6. The detailed description of the operation of substantially the same components and circuit as the set operation of FIG. 7A is omitted.

First, as with the set operation, the control signal PG becomes the "H" level to turn on the pulse generator 8A based on the write command and the selected address information. The row selection signal RS<0> also becomes the "H" level to turn on the row selection switch element 50. Therefore, the selected word line WL is activated.

As illustrated in FIG. 7B, in the reset operation of the memory of FIG. 6, the transition of the control signal SW<A> of the switch element 22 is made from the "L" level to the "H" level at a time $t_a$. Therefore, the switch element 22 connected to the capacitive element 21 is turned on, thereby electrically connecting the capacitive element 21 and the selected word line WL. At this point, the control signal SW<B> of the switch element 23 to which the capacitive element is not connected is maintained at the "L" level, and the switch element 23 is turned off.

In FIG. 7B, the transition of the control signal SW<A> is made to the "H" level at the same time as the pulse generator 8A and the row selection switch element 50 are activated. However, the invention is not limited to the configuration of FIG. 7B.

After the pulse generator 8A, the row selection switch element 50, and the switch element 23 are turned on, the transition of the control signal CS<0> of the column selection switch element 60 is made from the "L" level to the "H" level at a time $t_b$. Therefore, the selected bit line BL is activated.

The pulse current (write current) $I_P$ used in the reset operation is supplied to the selected bit line BL. During the reset operation, the potential at the selected word line WL is set to the ground potential WL_GND. The pulse current $I_P$ is supplied to the resistance change type storage element (selected cell) 10 connected between the selected bit line BL and the selected word line through the diode 15.

Preferably, the current value of the pulse current $I_P$ used in the reset operation ranges from 500 nA to 100 μA. Preferably, the pulse width of the pulse current $I_P$ used in the reset operation ranges from 10 ns to 100 μs. However, the current value and pulse width of the pulse current $I_P$ are not limited to the above-described values, and the current value and pulse width depend on the area and thickness of the resistance change type storage element 10 and the material used in the resistance change type storage element 10.

As illustrated in the (a) of FIG. 8, the pulse current $I_P$ passed through the selected cell 10 flows in the capacitance circuit 20A. As described above, during the reset operation, the switch element 22 connected to the capacitive element 21 is turned on while the switch element 23 is turned off. Therefore, at the time $t_b$, the pulse current $I_P$ is supplied to the capacitive element 21 to start the charging the capacitive element 21.

As illustrated in FIG. 7B, the column selection switch element 60 is turned on in the period from the time $t_b$ to a time $t_c$. As illustrated in the (b) of FIG. 8, the capacitive element 21 is charged by the pulse current $I_P$ passed through the selected cell 10 in the period $t_b$ to $t_c$.

In the period $t_b$ to $t_c$, since the electrostatic capacitance C of the capacitive element 21 is charged by the charge Q (>0), a potential (charge potential) $V_c$ between electrodes of the capacitive element 21 becomes potential $V_c$=Q/C. In the period $t_b$ to $t_c$, the potential $V_c$ is larger than the ground potential WL_GND. Therefore, in the period (period $t_b$ to $t_c$) during which the pulse current $I_P$ is supplied to the selected cell 10, the potential at one end of the selected cell (resistance change type storage element) 10, that is, at the connection node N1 becomes about the potential $V_c$ that is equal to or larger than the ground potential WL_GND. The potential at the connection node N1 is gradually raised as the capacitive element 21 is charged by the pulse current $I_P$ as time advances.

The potential difference (voltage) is applied between the ends N2 and N3 of the resistance change type storage element 10 that is the selected cell by supplying the pulse current $I_P$, thereby switching the resistance value of the resistance change type storage element 10 from the low-resistance state to the high-resistance state. Therefore, predetermined data (for example, "1") is stored in the selected cell. When the resistance value of the resistance change type storage element 10 is changed from the low-resistance state to the high-resistance state, a charge speed of the capacitive element 21 becomes moderate.

In making the transition of the resistance change type storage element 10 to the high-resistance state, because the about potential $V_c$ is applied to the connection node N1 between selected word line WL and the cathode of diode 15, the potential difference between one end (connection node N2) and the other end (connection node N3) of the resistance change type storage element 10 is decreased compared with the case in which the potential at the connection node N1 is set to the ground potential WL_GND. Therefore, the potential difference applied to the high-resistance state resistance change type storage element 10 can be decreased immediately after the resistance change type storage element 10 takes the high-resistance state.

At the time $t_c$, the column selection signal CS<0> is set to the "L" level to turn off the column selection switch element 60. The state machine 7 senses that the charge speed of the capacitive element 21 becomes moderate, and the state machine 7 changes the control signal SW<B> from the "L" level to the "H" level such that the switch element 23 of the capacitance circuit 20A is turned on. Therefore, the switch element 23 is turned on at a time $t_d$. The control signal SW<B> is set to the "L" level at a time $t_e$. That is, the switch element 23 is turned on in the period from the time $t_d$ to the time $t_e$.

When the column selection switch element 60 is turned off, the current (potential) is not supplied to the capacitive element 21, and the capacitive element 21 is connected to the ground terminal WL_GND through the on-state switch element 23. Therefore, as illustrated in the (c) of FIG. 8, during the period $t_d$ to $t_e$, a discharge current $i_q$ of the capacitive element 21 is discharged to the ground terminal WL_GND through the switch element 23 and on-state row selection switch element 50. At this point, the column selection switch element 60 is turned off, and the diode 15 is provided. Therefore, the discharge current $i_q$ of the capacitive element 21 is not passed through the resistance change type storage element 10.

Alternatively, in the period $t_c$ to $t_e$, the state machine 7 senses the resistance value of the resistance change type storage element 10 that is the selected cell, controls the on state and off state of the switch element 23 such that the potential difference between the bit line BL and the word line WL does not become excessive with respect to the resistance state of the resistance change type storage element, and may adjust the potential applied to the resistance change type storage element as needed.

After the switch element 23 is turned off, the pulse generator 8A and the row selection switch element 50 are turned off. The control signal SW<A> is set to the "L" level to turn off the switch element 22 connected to the capacitive element 21. Therefore, the capacitive element 21 is electrically separated from the selected word line WL.

Thus, the reset operation performed to the selected cell (resistance change type storage element) 10 is completed. As with the set operation, the verify operation may be performed after the reset operation of FIG. 7B. The resistance state of the selected cell (resistance change type storage element) 10 is confirmed before the reset operation, and the pulse current may be not supplied when the selected cell is in the high-resistance state.

In the resistance change type memory of the first embodiment, the capacitive element 21 is connected to the word line WL. During the reset operation of the resistance change type memory, the potential difference applied to the resistance change type storage element (selected cell) 10 is reduced and adjusted by utilizing the charge of the capacitive element 21 when the transition of the element (selected cell) 10 is made from the low-resistance state to the high-resistance state.

Therefore, immediately after the transition of the resistance change type storage element 10 is made from the low-resistance state to the high-resistance state, the resistance state of the resistance change type storage element 10 is prevented from returning to the low-resistance state due to the potential difference that is caused by the pulse current $I_P$ (or potential) supplied to the element 10.

Accordingly, the operational reliability can be improved in the resistance change type memory of the first embodiment.

(2) Configuration Example 1

Configuration example 1 of the resistance change type memory of the first embodiment will be described with reference to FIGS. 9, 10A, and 10B.

(a) Circuit Configuration

Configuration example 1 of the resistance change type memory of the first embodiment will be described with reference to FIG. 9. A difference in the circuit configuration between configuration example 1 and the memory of FIG. 6 will mainly be described here.

As described above, the plural resistance change type storage elements $10_0$ to $10_n$ are provided in one memory cell array 1.

As described above with reference to FIG. 2, the plural bit lines and the plural word lines are provided in one memory cell array 1.

As illustrated in FIG. 9, in cases where (m+1) (m≧0) word lines WL are provided in the memory cell array, (m+1) resistance change type storage elements $10_0$ to $10_m$ are connected to one bit line BL. Diodes (non-ohmic element) $15_0$ to $15_m$ are series-connected to resistance change type storage elements $10_0$ to $10_m$, respectively.

In configuration example 1, as illustrated in FIG. 9, at least one (for example, (k+1) (k≧0)) capacitive elements $21_0$ to $21_k$ are provided in the capacitance circuit 20B. Switch elements $22_0$ to $22_k$ that activate the capacitive elements $21_0$ to $21_k$ are connected to the capacitive elements $21_0$ to $21_k$, respectively. Control signals SW<$A_0$> to SW<$A_k$> control the turn-on and turn-off of the switch elements $22_0$ to $22_k$. The capacitive elements $21_0$ to $21_k$ are connected in parallel in the capacitance circuit 20B. For example, one switch element 23 is shared by the plural capacitive elements $21_0$ to $21_k$. The discharge currents of the plural capacitive elements $21_0$ to $21_k$ are discharged to the ground terminal WL_GND by turning on the switch element 23.

In configuration example 1 of FIG. 9, one capacitance circuit 20B is provided with respect to the plural word lines $WL_0$ to $WL_m$. Row selection switch elements $50_0$ to $50_m$ are series-connected to connection nodes $N1_0$ to $N1_m$, respectively. The capacitance circuit 20B is provided between the row selection switch elements $50_0$ to $50_m$ and the word line ground terminal WL_GND. The capacitance circuit 20B is series connected between one end of the current path of the row selection switch elements $50_0$ to $50_m$ and the word line ground terminal WL_GND.

Thus, one capacitance circuit 20B is shared by the plural word lines $WL_0$ to $WL_m$ to suppress the increase in chip size caused by the installation of the capacitance circuit.

In configuration example 1, during the reset operation, the number of activated capacitive elements $21_0$ to $21_k$ depends on connection positions of the resistance change type storage elements $10_0$ to $10_m$ to the bit line BL.

Specifically, the resistance change type storage element $10_m$ has the connection node $N3_m$ with the bit line BL located far away from a connection point cp at which the pulse generator 8A is connected to the bit line BL, and the resistance change type storage element $10_0$ has the connection node $N3_0$ with the bit line BL located near the connection point cp at which the pulse generator 8A is connected to the bit line BL. The resistance change type storage element $10_m$ is larger than the resistance change type storage element $10_0$ in the number of the capacitive elements activated during the reset operation. Although another component such as the switch element 60 is provided between the connection point cp and the pulse generator 8A, in the following description it is assumed that the connection point cp is a point at which the pulse generator and the wiring (bit line or word line) are connected.

For example, in cases where the selected word line is the word line $WL_0$, one capacitive element is activated for the resistance change type storage element $10_0$ that is connected to the bit line BL by the connection node $N3_0$. On the other hand, in cases where the selected word line is the word line $WL_m$, (k+1) capacitive elements are activated for the resistance change type storage element $10_m$ that is connected to the bit line BL by the connection node $N3_m$.

Thus, during the reset operation, the number of capacitive elements used for the resistance change type storage element $10_m$ located far away from the side (current supply side) onto which the pulse generator 8A is connected is equal to or more than the number of capacitive elements used for the resistance change type storage element $10_0$ located near the side onto which the pulse generator 8A is connected.

The bit line BL includes a wiring resistance and a wiring capacitance because of a wiring length and a correlation with the adjacent bit lines BL. The wiring resistance and the wiring capacitance cause an RC delay, a voltage drop, and a decrease in current.

The influence of the wiring length depends on a point at which the resistance change type storage elements $10_0$ to $10_m$ are connected to the bit line BL. The influence of the wiring length is increased with increasing capacity of the memory cell array, that is, with increasing wiring length of the bit line BL.

In FIG. 9, the difference becomes prominent between the element located closest to the connection point cp of the current supply source (pulse generator) and the element located farthest away from the connection point cp, that is, between the resistance change type storage element $10_0$ connected to the first word line WL and the resistance change type storage element $10_m$ connected to the (m+1)-th word line WL.

In configuration example 1 of FIG. 9, on one bit line BL, the connection node $N3_m$ of the resistance change type storage element $10_m$ and the bit line BL is located farther away from the connection point cp of the pulse generator 8A than the connection node $N3_0$ of the resistance change type storage element $10_0$ and the bit line BL. Because the resistance change type storage element $10_0$ has a short wiring length of the bit line from the pulse generator 8A, the RC delay has the little influence on the resistance change type storage element $10_0$.

On the other hand, because the resistance change type storage element $10_m$ connected to the word line $WL_m$ has a long wiring length from the connection point cp of the pulse generator 8A, the influence of the wiring length on the resistance change type storage element $10_n$ becomes larger than the influence of the wiring length on the resistance change type storage element $10_0$ in terms of the decrease in voltage or current caused by the wiring resistance and the delay caused by the wiring capacitance.

The output of the pulse generator 8A, which is supplied to the bit line BL, is influenced by the wiring length of the bit line BL. Therefore, in the pulse current $I_P$ imparted to the resistance change type storage element $10_m$, the current value is largely decreased or the pulse width is largely changed, when compared with the pulse current $I_P$ imparted to the resistance change type storage element $10_0$. As a result, degradation of the response speed (switching speed) of the reset operation or a writing error is generated in the resistance change type storage element $10_m$ located far away from the pulse generator 8A. Additionally, in the resistance change type storage elements $10_0$ to $10_m$ commonly connected to one bit line BL, a variation of the reset operation is generated, which destabilizes the memory operation.

Equalization of the potential difference applied between the selected bit line and the selected word line is one of the ways to pass the pulse current $I_P$, having the same current value as the resistance change type storage element $10_0$ connected to the word line $WL_0$, through the resistance change type storage element $10_m$ connected to the word line $WL_m$.

In configuration example 1, the charge potentials at the capacitive elements $21_0$ to $21_k$, applied to the word line $WL_m$, are set smaller than the charge potentials at the capacitive elements $21_0$ to $21_k$, applied to the word line $WL_0$, in consideration of the voltage drop and current loss caused by the wiring length of the bit line BL. Therefore, in configuration example 1, the number of activated capacitive elements connected in parallel is increased in performing the reset operation to the resistance change type storage element connected to the word line $WL_m$.

That is, the charge potentials at the capacitive elements $21_0$ to $21_k$ are inversely proportional to the electrostatic capacitance of the capacitive element. The magnitude of the electrostatic capacitances of the capacitive elements connected in parallel is the sum of the electrostatic capacitance of the capacitive elements.

The number of capacitive elements used in the resistance change type storage element $10_m$ connected to the word line $WL_m$ is more than the number of capacitive elements used in the resistance change type storage element $10_0$ connected to the word line $WL_0$, whereby the electrostatic capacitance of the resistance change type storage element $10_m$ is larger than the electrostatic capacitance of the resistance change type storage element $10_0$, and the charge potential at the word line $WL_m$ is smaller than the charge potential at the word line $WL_0$.

As a result, during each reset operation, the potential difference between the bit line to which the pulse current $I_P$ is supplied and the word line to which the charge potential is supplied is adjusted so as to be substantially equalized in the resistance change type storage element $10_0$ and the resistance change type storage element $10_m$.

When the potential differences applied to the resistance change type storage elements are adjusted so as to be substantially equalized in consideration of the adverse effect caused by the wiring length, electrostatic capacitances $C_0$ to $C_k$ of the plural capacitive elements $21_0$ to $21_k$ may be set to the same value or different values.

When the resistance change type storage element $10_m$ connected to the node $N3_m$ located far away from the connection point cp of the pulse generator 8A is selected in the connection nodes $N3_0$ to $N3_m$ of the bit line BL and the resistance change type storage elements $10_0$ to $10_m$, the number of activated capacitive elements $21_0$ to $21_k$ is set larger than in the case in which the resistance change type storage element $10_0$ connected to the node $N3_0$ close to the connection point cp of the pulse generator 8A.

Therefore, degradation of the reset operation, caused by the wiring resistance or the wiring capacitance, is prevented in the memory of configuration example 1.

Alternatively, the circuit configuration in which the capacitance circuit 20B is connected to each of the word lines $WL_0$ to $WL_m$ by the connection relationship similar to that of FIG. 6 may be adopted in configuration example 1. In such cases, the electrostatic capacitance of the capacitive element connected to each resistance change type storage element is increased as the resistance change type storage element is located farther away from the pulse generator 8A. That is, in the resistance change type storage element located far away from the connection point cp of the pulse generator 8A and the bit line BL, the electrostatic capacitance of the capacitive element used in the resistance change type storage element is equal to or larger than the electrostatic capacitance of the capacitive element used in the resistance change type storage element located near the connection point cp of the pulse generator 8A and the bit line BL.

Accordingly, the operational reliability can be improved in the resistance change type memory of the configuration example 1 of the first embodiment.

(b) Operation

The operation in configuration example 1 of the resistance change type memory of the first embodiment will be described with reference to FIGS. 9, 10A, and 10B. In configuration example 1, because the set operation is identical to the operation of FIG. 7A, only the reset operation will be described. The detailed description of substantially the same operation as the reset operation of FIG. 7B is omitted in configuration example 1.

For the sake of convenience, the case in which the two capacitive elements $21_0$ and $21_k$ are used will be described here by way of example. Therefore, switch-element control signals SW<$A_0$> and SW<$A_k$> that activate the two capacitive elements are illustrated in FIGS. 10A and 10B.

Figure 10A:
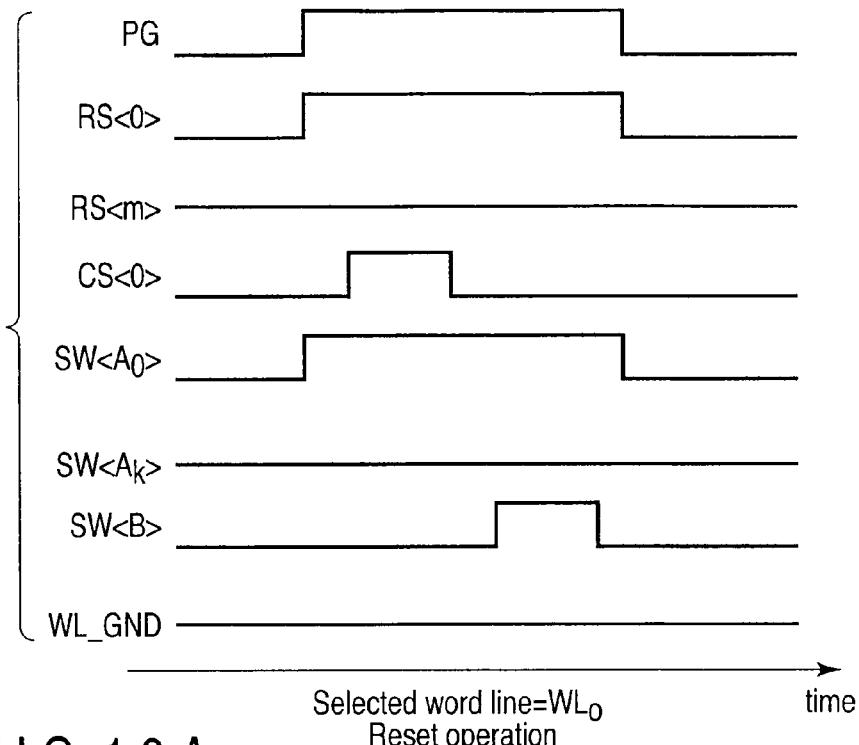
FIG. 10A is a waveform chart for explaining an operation of the resistance change type memory of FIG. 9.

FIG. 10A illustrates a timing chart of the reset operation in cases where the resistance change type storage element $10_0$ having the connection node $N3_0$ located near the connection point (current supply side) cp of the pulse generator 8A and the bit line BL is selected on one bit line BL, that is, in the case where the selected word line is the word line $WL_0$.

As illustrated in FIG. 10A, when the reset operation is performed to the resistance change type storage element $10_0$ connected to the word line $WL_0$, the row selection signal RS<0> is set to the "H" level to turn on the row selection switch element $50_0$. Therefore, the word line $WL_0$ is activated as the selected word line. The other row selection signal RS<m> is maintained at the "L" level, and the word lines $WL_i$ and $WL_m$ except for the selected word line $WL_0$ are not activated.

In the two switch elements $22_0$ and $22_k$ of the capacitance circuit 20B, the control signal SW<$A_0$> of the switch element $22_0$ is switched from the "L" level to the "H" level, thereby turning on the switch element $22_0$. At this point, the control signal SW<$A_k$> of the switch element $22_k$ is maintained at the "L" level. Therefore, in the two capacitive elements $21_0$ and $21_k$ of the capacitance circuit 20B, the capacitive element $21_0$ is activated and electrically connected to the bit line BL and selected word line $WL_0$. The capacitive element $21_0$ is charged by the pulse current $I_P$ passed through the resistance change type storage element $10_0$. At this point, because the capacitive element $21_k$ is electrically separated from the selected word line $WL_0$, the capacitive element $21_k$ is not charged.

Therefore, the charge potential at the capacitive element $21_0$ becomes the potential corresponding to the electrostatic capacitance $C_0$ of the capacitive element $21_0$, and the charge potential is supplied to the selected word line $WL_0$.

While the charge potential at the capacitive element $21_0$ is supplied to the selected word line $WL_0$ and connection node $N1_0$, the transition of the resistance state of the selected cell (resistance change type storage element $10_0$) is made from the low-resistance state to the high-resistance state by supplying the pulse current $I_P$ as in the operation of the basic example.

Then the switch element 23 of the capacitance circuit 20B is turned on and the discharge current of the capacitive element $21_0$ is discharged to the ground terminal WL_GND.

Thus, the reset operation performed to the resistance change type storage element $10_0$ connected to the word line $WL_0$ is ended in configuration example 1.

While the charge potential at the capacitive element $21_0$ is supplied to the selected word line $WL_0$ and connection node $N1_0$, the reset operation is performed to the selected cell (resistance change type storage element $10_0$) as in the operation of the basic example. Therefore, the large potential applied to the resistance change type storage element $10_0$ can be prevented immediately after the transition of the resistance state of the resistance change type storage element $10_0$, which is the selected cell, is made to the high-resistance state.

Figure 10B:
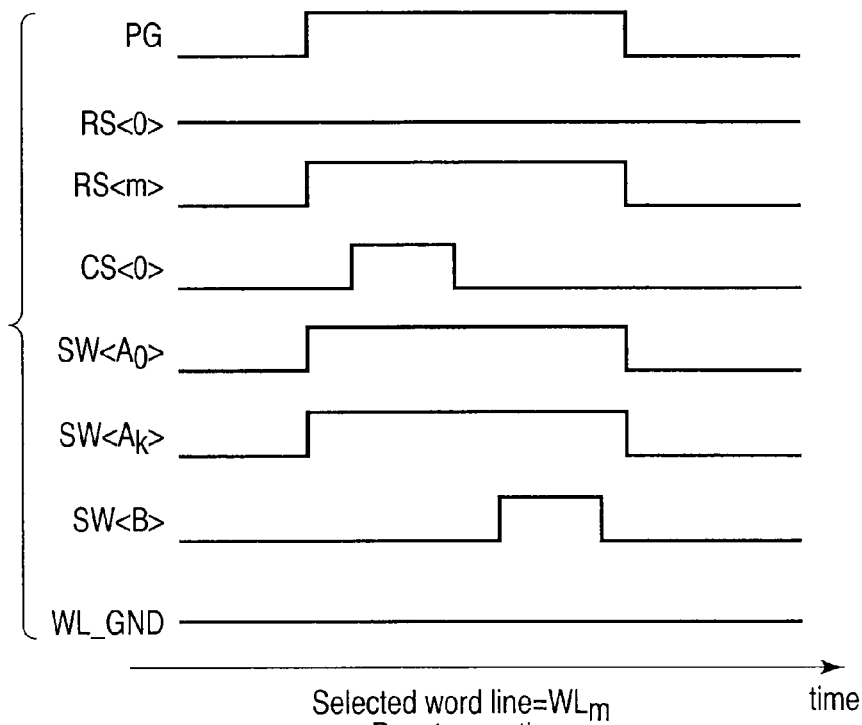
FIG. 10B is a waveform chart for explaining an operation of the resistance change type memory of FIG. 9.

FIG. 10B illustrates a timing chart of the reset operation in cases where the resistance change type storage element $10_m$ having the connection node $N3_m$ located far away from the connection point (current supply side) cp of the pulse generator 8A and the bit line BL is selected on one bit line BL, that is, in the case where the selected word line is the word line $WL_m$.

As illustrated in FIG. 10B, when the reset operation is performed to the resistance change type storage element $10_m$ connected to the word line $WL_m$, the row selection signal RS<m> is set to the "H" level and the row selection switch element $50_m$ turns on. Therefore, the word line $WL_m$ is activated as the selected word line. The row selection switch elements $50_0$ and $50_i$ are turned off, and the word lines $WL_0$ and $WL_m$ except for the selected word line $WL_m$ are not activated.

When the word line $WL_m$ is the selected word line, the state machine 7 makes the transition of the control signals SW<$A_0$> and <$A_k$> of the switch elements $22_0$ and $22_k$ from the "L" level to the "H" level, thereby activating the two capacitive elements $21_0$ and $21_k$ in the capacitance circuit 20B. The capacitive elements $21_0$ and $21_k$ are electrically connected to the bit line BL and selected word line $WL_m$ through the switch elements $22_0$ and $22_k$ that takes the on state. The capacitive elements $21_0$ and $21_k$ are charged by the pulse current $I_P$ passed through the resistance change type storage element $10_m$.

As illustrated in FIG. 9, because the capacitive elements $21_0$ and $21_k$ are connected in parallel, the sum of the electrostatic capacitances $C_0$ and $C_k$ of the capacitive elements $21_0$ and $21_k$ is the total electrostatic capacitance of the capacitive elements $21_0$ and $21_k$. Therefore, the electrostatic capacitance $(C_0+C_k)$ becomes larger than in the case in which the electrostatic capacitance $C_0$ of the capacitive element $21_0$ is used, and the charge potential $(=Q/(C_0+C_k))$ of the capacitive elements $21_0$ and $21_k$ becomes smaller than the charge potential $(=Q/C_0)$ at the capacitive element $21_0$.

Thus, the current degradation caused by the wiring length is increased when the current (or voltage) is supplied to the resistance change type storage element $10_m$ connected to one bit line BL and located far away from the connection point cp of the pulse generator 8A. In configuration example 1, in consideration of the current degradation caused by the wiring length, the state machine 7 determines the connection position of the resistance change type storage elements $10_0$ to $10_m$ to the bit line BL based on the selected address information, and the number of activated capacitive elements $21_0$ and $21_k$ is controlled based on the determination result. Therefore, even if the pulse current $I_P$ supplied to the resistance change type storage element $10_m$ is degraded by the influence of the wiring length, the potential difference between the bit line BL and the word line $WL_m$ is substantially equalized to the potential difference between the bit line BL and the word line $WL_0$ by adjusting the charge potentials at the capacitive elements $21_0$ and $21_k$.

While the charge potentials at the capacitive elements $21_0$ and $21_m$ are supplied to the selected word line $WL_m$ and connection node $N1_m$, the transition of the resistance state of the selected cell (resistance change type storage element) $10_0$ is made from the low-resistance state to the high-resistance state by supplying the pulse current $I_P$ as in the operation of the basic example, so that a large potential can be prevented from being applied to the resistance change type storage element $10_0$ immediately after the transition of the resistance state of the resistance change type storage element $10_0$ is made to the high-resistance state.

After a predetermined time elapses since the column selection switch element 60 is turned off, the switch element 23 of the capacitance circuit 20B is turned on to discharge the discharge currents of the two capacitive elements $21_0$ and $21_m$ to the ground terminal WL_GND.

Thus, the reset operation performed to the resistance change type storage element $10_m$ connected to the word line $WL_m$ is ended in configuration example 1.

Even if the two capacitive elements, $21_0$ and $21_m$, are used, a large potential can be prevented from being applied to the resistance change type storage element $10_m$ immediately after the transition of the resistance state of the resistance change type storage element $10_m$ that is the selected cell is made to the high-resistance state.

During the reset operation of configuration example 1, the number of capacitive elements used to the resistance change type storage element $10_m$ located far away from the connection point cp of the pulse generator 8A and the bit line BL is set larger than the number of capacitive elements used to the resistance change type storage element $10_0$ located near the connection point cp. Because the charge potential supplied to the resistance change type storage element $10_m$ is smaller than the charge potential supplied to the resistance change type storage element $10_0$, the bit line-word line potential difference supplied to the resistance change type storage element $10_m$ is adjusted so as to be substantially equal to the bit line-word line potential difference supplied to the resistance change type storage element $10_0$.

Therefore, the current value and pulse width of the pulse current supplied to the resistance change type storage element $10_m$ located far away from the connection point cp of the pulse generator on one bit line BL and the potential difference generated by the pulse current can substantially be equalized to the current value and pulse width of the pulse current supplied to the resistance change type storage element $10_m$ located near the connection point cp of the pulse generator and the potential difference generated by the pulse current.

The charge potentials at the capacitive elements $21_0$ to $21_k$ supplied to the word lines $WL_0$ to $WL_m$ are adjusted according to the position at which the resistance change type storage elements $10_0$ to $10_m$ are connected to the bit line BL.

Therefore, a probability of generation of the data write defects in the resistance change type storage element due to the change of the pulse shape of the pulse current $I_P$ or the decreases in current value and voltage value can be lowered, and the variation in operating characteristic can be suppressed in the plural resistance change type storage elements connected to one bit line. The change of the pulse shape of the pulse current $I_P$ or the decreases in current value and voltage value are caused by the wiring resistance or the wiring capacitance. That is, the operation degradation caused by the wiring length can be suppressed in the resistance change type memory of configuration example 1.

Accordingly, the operational reliability can be improved in the resistance change type memory of configuration example 1 of the first embodiment.

(3) Configuration Example 2

A circuit configuration and an operation in configuration example 2 of the resistance change type memory of the first embodiment will be described with reference to FIGS. 11, 12A, and 12B.

(a) Circuit Configuration

Configuration example 2 of the resistance change type memory of the first embodiment will be described with reference to FIG. 11. A difference in the circuit configuration between configuration example 2 and the memory of FIG. 9 will mainly be described here.

Figure 11:
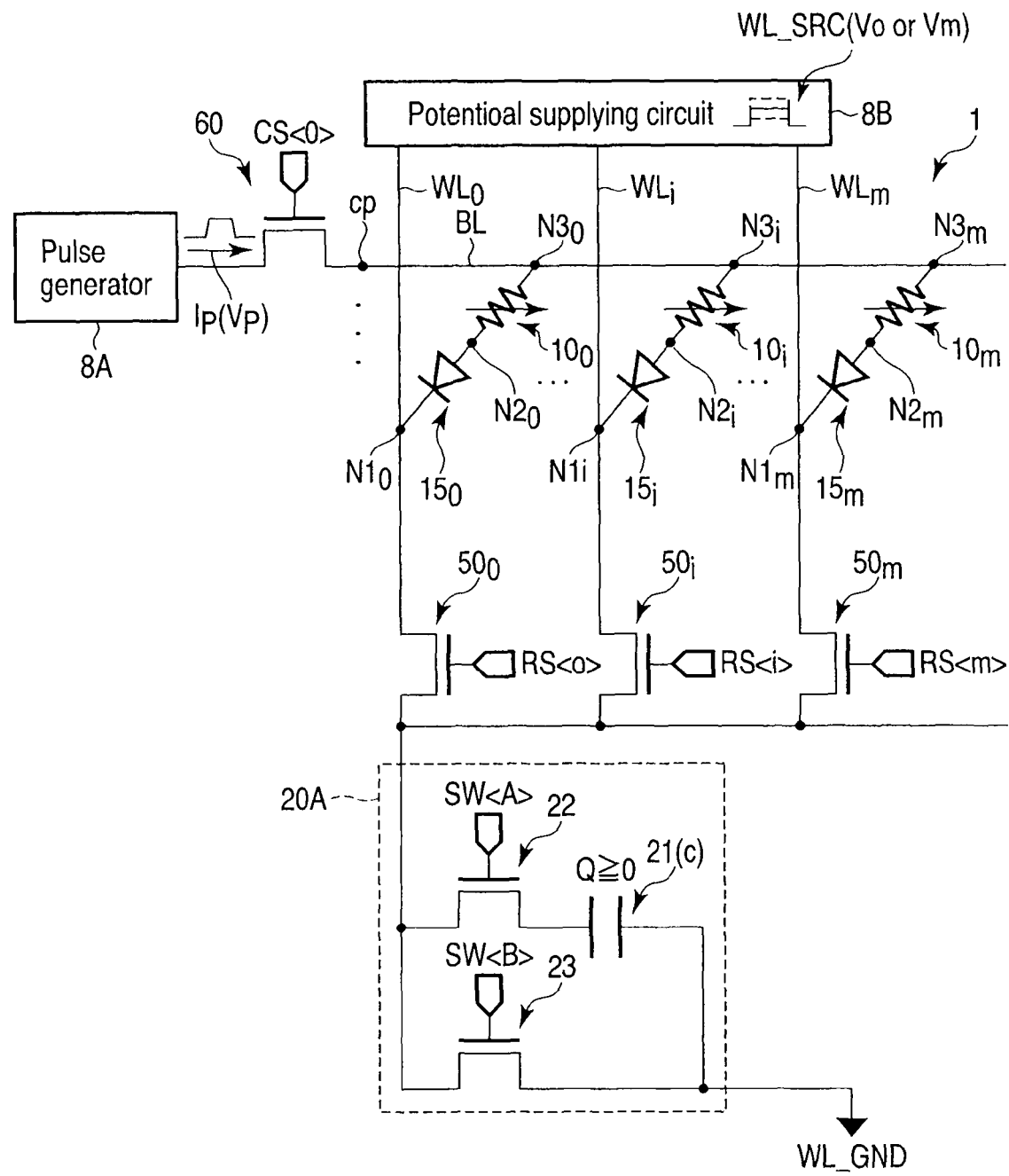
FIG. 11 illustrates configuration example 2 of the resistance change type memory of the first embodiment.

As illustrated in FIG. 11, the resistance change type memory of configuration example 2 includes the capacitance circuit 20A connected to the word line WL, and a potential supplying circuit 8B is connected to end portions of the word lines $WL_0$ to $WL_m$ that are opposite the ground terminal WL_GND.

For example, under the control of the state machine 7, the potential supplying circuit 8B supplies a potential (hereinafter referred to as word line supply potential) WL_SRC to the word lines $WL_0$ to $WL_m$.

When the resistance change type storage element $10_0$ located near the connection point (current supply side) cp of the pulse generator 8A and the bit line is selected, the potential supplying circuit 8B supplies a potential (first potential) $V_0$ to the word line $WL_0$ connected to the element $10_0$.

On the other hand, when the resistance change type storage element $10_m$ located far away from the connection point cp of the pulse generator 8A and the bit line is selected, the potential supplying circuit 8B supplies a potential (second potential) $V_m$, which is smaller than the potential $V_0$, to the word line $WL_m$ connected to the element $10_m$.

The potential $V_0$ and the potential $V_m$ are set such that the potential difference applied to the resistance change type storage element $10_m$ is substantially identical to the potential difference applied to the resistance change type storage element $10_0$ during in each reset operation to a element $10_0$ or $10_m$. The potentials $V_0$ and $V_m$ supplied to the word lines $WL_0$ and $WL_m$ are set smaller than the potentials generated by the pulse current $I_P$ and the wiring resistance of the bit line BL.

In the configuration example 2, one capacitive element 21 is provided in the capacitance circuit 20A. Because the capacitive element 21 is shared by the plural word lines $WL_0$ to $WL_m$, the same charge potential is applied to the plural word lines $WL_0$ to $WL_m$.

In configuration example 2, instead of supplying the different charge potentials to the word lines $WL_0$ to $WL_m$ using the plural capacitive elements, the potential supplying circuit 8B supplies the different potentials to the word lines $WL_0$ to $WL_m$ connected to the resistance change type storage elements $10_0$ to $10_m$ according to the connection position of the elements $10_0$ to $10_m$ to one bit line BL.

In configuration example 2, a certain constant potential is supplied to each of the word lines $WL_0$ to $WL_m$, thereby adjusting the potential difference applied between the bit line BL and the word lines $WL_0$ to $WL_m$. Therefore, an excessively large potential is prevented from being supplied to the resistance change type storage elements $10_0$ to $10_m$ immediately after the transition to the high-resistance state.

As with the examples of FIGS. 9, 10A, and 10B, the degradation of the reset operation of the resistance change type memory caused by the wiring resistance or wiring capacitance of the bit line BL is suppressed by respectively supplying the different potentials $V_0$ and $V_m$ to the word lines $WL_0$ to $WL_m$.

Alternatively, the potential $V_0$ and the potential $V_m$ may previously be set or adjusted by the state machine 7 according to the status during the reset operation such that the potential difference applied to the resistance change type storage element $10_m$ during the reset operation to the element $10_m$ is substantially identical to the potential difference applied to the resistance change type storage element $10_0$ during the reset operation to the element $10_0$. The potentials $V_0$ and $V_m$ supplied to the word lines $WL_0$ and $WL_m$ are set equal to or smaller than the potentials generated by the pulse current $I_P$ or discharge current $I_Q$ and the wiring resistance of the bit line BL.

Accordingly, the operational reliability can be improved in configuration example 2 of the resistance change type memory of the first embodiment.

(b) Operation

The operation in configuration example 2 of the resistance change type memory of the first embodiment will be described with reference to FIGS. 11, 12A, and 12B. In configuration example 2, because the set operation is identical to the operation of FIG. 7A, only the reset operation will be described. The detailed description of substantially the same operation as the reset operation of FIG. 7B is omitted in configuration example 2.

Figure 12A:
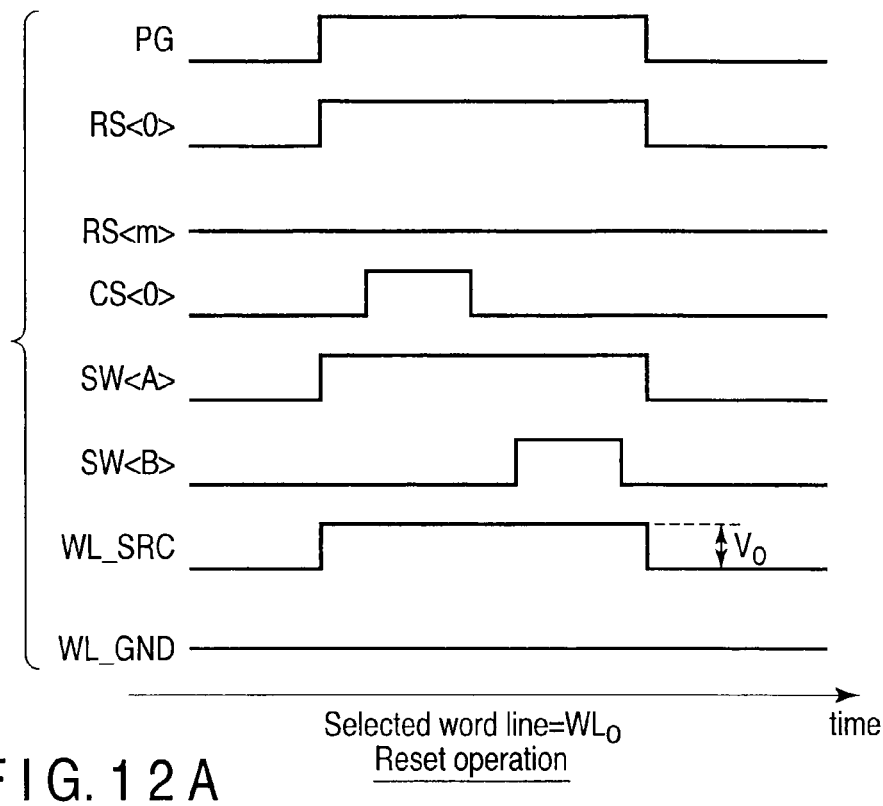
FIG. 12A is a waveform chart for explaining an operation of the resistance change type memory of FIG. 11.

FIG. 12A illustrates a timing chart of the reset operation in cases where the resistance change type storage element $10_0$ located near the connection point cp of the pulse generator 8A and the bit line BL is selected on one bit line BL, that is, in the case where the selected word line is the word line $WL_0$.

As illustrated in FIG. 12A, when the reset operation is performed to the resistance change type storage element $10_0$ connected to the word line $WL_0$, the row selection switch element $50_0$ is turned on to activate the word line $WL_0$. The other row selection switch element $50_m$ is turned off.

The control signal SW<A> of the switch element 22 is switched from the "L" level to the "H" level to turn on the switch element 22. Therefore, the capacitive element 21 is activated, and the capacitive element 21 is electrically connected to the selected word line $WL_0$.

The state machine 7 controls the potential supplying circuit 8A to impart the potential WL_SRC to the selected word line $WL_0$. When the resistance change type storage element $10_0$ located near the connection point cp of the pulse generator 8A and the bit line is selected on one bit line BL, for example, the potential WL_SRC imparted to the selected word line $WL_0$ connected to the element $10_0$ becomes the potential $V_0$. The potential difference between the selected word line supply potential WL_SRC (=$V_0$) and the ground potential WL_GND is applied to the capacitive element 21 until the column selection switch element 60 is turned on.

The column selection signal CS<0> takes the "H" level to turn on the column selection switch element 60, whereby the capacitive element 21 is charged by the pulse current $I_P$ passed through the bit line BL and selected word line $WL_0$. The potential that is supplied to the selected word line $WL_m$ and connection node $N1_m$ by the potential supplying circuit 8B and capacitive element 21 is substantially equal to the difference between the word line supply potential WL_SRC and the charge potential. However, the potential supplied to the connection node $N1_0$ may be fluctuate from the value due to the influence of the wiring resistance of the word line WL.

While the charge potential at the capacitive element 21 and the word line supply potential WL_SRC are supplied to the selected word line $WL_m$ and the connection node $N1_m$, the transition of the resistance state of the selected cell (resistance change type storage element) $10_0$ is made from the low-resistance state to the high-resistance state by supplying the pulse current $I_P$ as in the operation of the basic example. Therefore, immediately after the transition of the resistance state of the resistance change type storage element $10_0$ is made to the high-resistance state, such a large potential that the resistance change type storage element $10_0$ returns to the low-resistance state is prevented from being applied to the resistance change type storage element $10_0$.

After the column selection switch element 60 is turned off, the control signal SW<B> is set from the "L" level to the "H" level to turn on the switch element 23 of the capacitance circuit 20A, discharging the charge charged in the capacitive element 21.

While the pulse generator 8A and the row selection switch element 50 are turned off, the potential supplying circuit 8B is turned off to stop the supply of the potential WL_SRC (=$V_0$) to the selected word line $WL_0$.

Thus, the reset operation performed to the resistance change type storage element $10_0$ connected to the word line $WL_0$ is ended in configuration example 2.

Figure 12B:
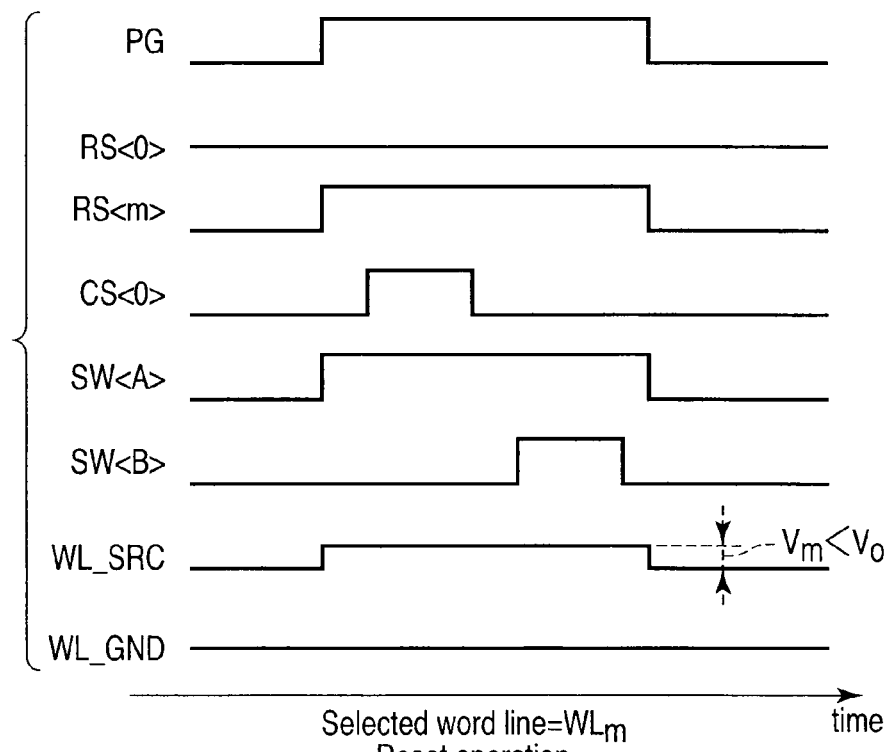
FIG. 12B is a waveform chart for explaining an operation of the resistance change type memory of FIG. 11.

In FIG. 12B, when the reset operation is performed to the resistance change type storage element $10_m$ connected to the word line $WL_m$, the row selection switch element $50_m$ is turned on to activate the word line $WL_m$. The row selection switch element $50_0$ is turned off.

The control signal SW<A> of the switch element 22 is switched to the "H" level to turn on the switch element 22. Therefore, the capacitive element 21 is activated, and is electrically connected to the selected word line $WL_m$.

In the bit line BL of FIG. 11, when the resistance change type storage element $10_m$ located far away from the connection point cp of the pulse generator 8A and the bit line BL is selected, the potential supplying circuit 8B supplies the selected word line supply potential WL_SRC that is the potential $V_m$ to the word line $WL_m$ connected to the element $10_m$. The potential $V_m$ is smaller than the potential $V_0$.

The potential difference between the selected word line supply potential WL_SRC (=$V_m$) and the ground potential WL_GND is applied to the capacitive element 21 until the column selection switch element 60 is turned on.

When the column selection switch element 60 is turned on, the capacitive element 21 is charged by the pulse current $I_P$ passed through the bit line BL and selected word line $WL_0$. The potential that is supplied to the selected word line $WL_m$ and connection node $N1_m$ by the potential supplying circuit 8B and capacitive element 21 is the difference between the word line supply potential WL_SRC and the charge potential.

While the charge potential at the capacitive element 21 and the word line supply potential WL_SRC are supplied to the selected word line $WL_m$ and the connection node $N1_m$, the transition of the resistance state of the selected cell (resistance change type storage element) $10_m$ is made from the low-resistance state to the high-resistance state by supplying the pulse current $I_P$, as in the operation of the basic example.

After the column selection switch element 60 is turned off, the control signal SW<B> is switched from the "L" level to the "H" level to turn on the switch element 23 of the capacitance circuit 20A. Therefore, the charge charged in the capacitive element 21 is discharged to the ground terminal WL_GND.

While the pulse generator 8A and the row selection switch element 50 are turned off, the potential supplying circuit 8B is turned off to stop the supply of the potential WL_SRC (=$V_m$) to the selected word line $WL_m$.

Thus, the reset operation performed to the resistance change type storage element $10_m$ connected to the word line $WL_m$ is ended in configuration example 2.

In configuration example 2, instead of changing the number of capacitive element used in the word lines $WL_0$ to $WL_m$, while the same charge potential is supplied to the word lines $WL_0$ to $WL_m$ and the different supply potentials WL_SRC is supplied to each of the word lines by the potential supplying circuit 8B.

In the resistance change type storage element $10_m$ which is located far away from the connection point cp of the pulse generator 8A and bit line BL and which is largely affected by the wiring length during the reset operation, the potential $V_m$ imparted to the selected word line $WL_m$ connected to the element $10_m$ by the potential supplying circuit 8B is smaller than the potential $V_0$ imparted to the word line $WL_0$ that is connected to the resistance change type storage element $10_0$ located near the connection point cp of the pulse generator 8A and bit line BL.

As with the configuration example 1, the potential difference between the selected bit line BL and the selected word line $WL_m$ is substantially equalized to the potential difference between the selected bit line and the selected word line in selecting the word line $WL_0$.

Therefore, the current value and pulse width of the pulse current substantially identical to that of the resistance change type storage element $10_0$ located near the connection point cp of the pulse generator 8A and bit line BL and the potential difference generated by the pulse current can be supplied to the resistance change type storage element $10_m$ located far away from the connection point cp of the pulse generator 8A and bit line BL on one bit line BL.

The degradation of the reset operation, caused by the wiring length of the bit line, is suppressed.

Accordingly, the operational reliability can be improved in configuration example 2 of the resistance change type memory of the first embodiment.

(4) Layout Example

A layout example of the capacitance circuit included in the resistance change type memory of the first embodiment will be described with reference to FIGS. 13A and 13B.

The capacitance circuits 20A and 20B included in the resistance change type memories of the embodiments and the memory cell array 1 are provided in the same chip.

Usually, a wiring pitch between the word lines WL is larger than the wiring pitch between the bit lines BL. Therefore, a region where an element can be provided exists in an end portion in the Y-direction of the memory cell array 1. As illustrated in FIG. 13A, a capacitance circuit block 29 is provided in the end portion of the memory cell array 1 by utilizing such region.

The capacitance circuit 20A is provided in the capacitance circuit block 29. One capacitance circuit 20A is connected to one word line WL. Alternatively, one capacitance circuit 20A may be shared by the plural word lines WL using the switch element such that a roundabout current does not flow into the non-selected cell. In the layout of FIG. 13A, an enlargement in chip size can be prevented even if the capacitance circuit 20A is provided in the chip.

Figure 13A:
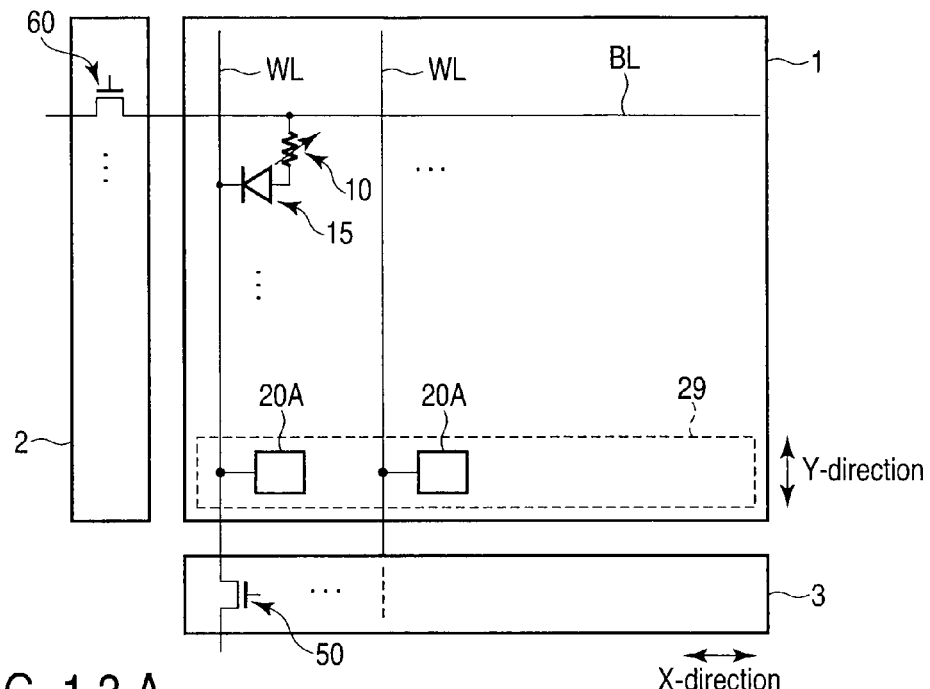
FIG. 13A illustrates a layout example of the resistance change type memory of the first embodiment.
Figure 13B:
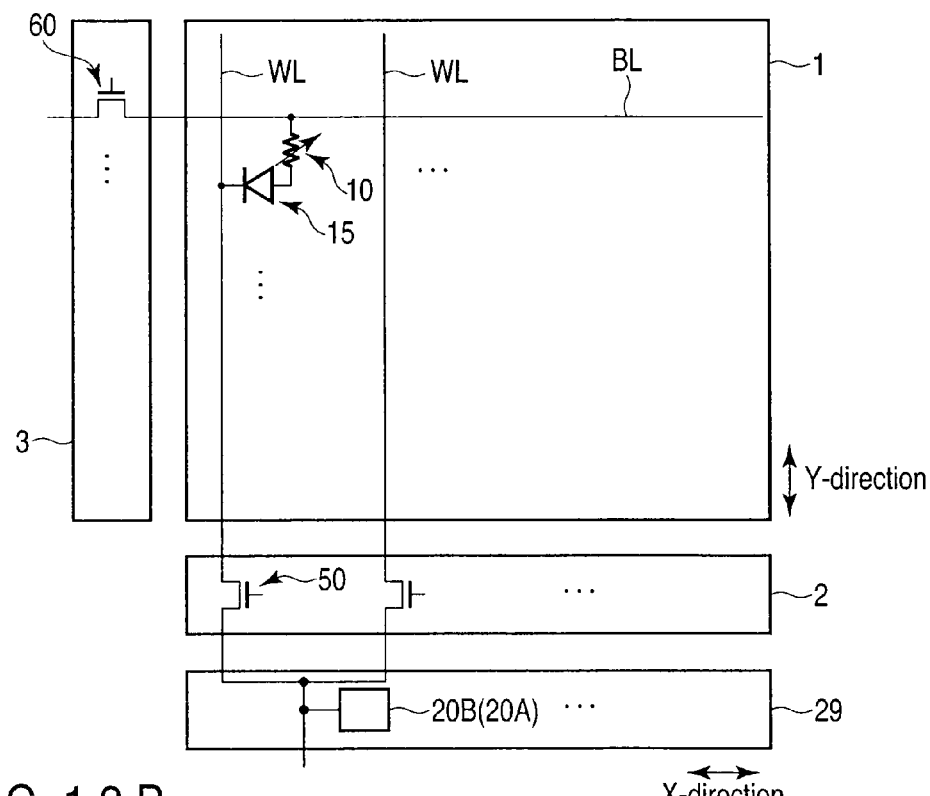
FIG. 13B illustrates a layout example of the resistance change type memory of the first embodiment.

As illustrated in FIG. 13B, the capacitance circuit block 29 may be provided outside the row control circuit 3 in which the row selection switch element 50 is provided. In such cases, each of the capacitance circuits 20A and 20B can be shared by the plural word lines WL. Therefore, the number of capacitive elements 21, and the number of switch elements that control the connection relationship between the capacitive element 21 and the word line WL can be decreased.

The invention is not limited to the examples of FIGS. 13A and 13B, and the capacitance circuit block 29 may be provided in the region between the memory cell array 1 and the row control circuit 3 or in the row control circuit 3.

3. Second Embodiment

A resistance change type memory (for example, ReRAM) according to a second embodiment of the invention will be described with reference to FIGS. 14 to 24B. In the second embodiment, the same component as that in the first embodiment is designated by the same numeral, and an overlapping description is made if needed. In the second embodiment, for the sake of convenience, only components required for the description are illustrated. However, the invention is not limited to the components.

(1) Basic Example

A circuit configuration and an operation in a basic example of the resistance change type memory of the second embodiment will be described with reference to FIGS. 14 to 16.

(a) Circuit Configuration

The circuit configuration in the basic example of the resistance change type memory of the second embodiment will be described with reference to FIG. 14.

FIG. 14 illustrates the circuit configuration in the basic example of the resistance change type memory.

The resistance change type storage element 10 and the diode (non-ohmic element) 15 are connected to the bit line BL and the word line WL by a connection relationship similar to that of the first embodiment.

The row selection switch element 50 is provided between the connection node N1 and the ground terminal WL_GND of the word line WL.

The column selection switch element 60 is provided between the connection node N3 and the pulse generator 8A.

A capacitance circuit 30A is provided between the connection node N3 and the column selection switch element 60. The capacitance circuit 30A is connected between the bit line BL and the ground terminal GND. For example, the capacitance circuit 30A includes one capacitive element 31 and one switch element 32. For example, the capacitance circuit 30A is connected to each of the plural bit lines provided in the memory cell array, respectively.

One end of the capacitive element 31 is connected to the bit line BL through the switch element (first switch element) 32. The other end of the capacitive element 31 is connected to the ground terminal GND. For example, the capacitive element 31 has an electrostatic capacitance ranging from 10 pF to 10 nF. In cases where the capacitive element 31 has an electrostatic capacitance C of 100 pF to 1 nF, the power consumption can be suppressed to a low level during the write operation, and the write operation (particularly, reset operation) can be stabilized. However, the electrostatic capacitance value of the capacitive element 31 depends on the material or structure of the resistance change type storage element 10.

The capacitive element 31 is charged by the pulse current (write current) $I_P$ supplied from the pulse generator 8A. The capacitive element 31 supplies the discharge current to the bit line BL.

For example, the switch element 32 is a field effect transistor 32. One end of the current path of the field effect transistor 32 is connected to the bit line BL, and a connection node Nx is formed between the switch element 32 and the bit line BL. The other end of the current path of the field effect transistor 32 is connected to one end of the capacitive element 31. The connection node Nx of the field effect transistor 32 and the bit line BL is located between the column selection switch element 60 and the connection node N3. The control signal SW<0> is fed into the gate (control terminal) of the field effect transistor 32. The state machine 7 controls the control signal SW<0> to control the turn-on and turn-off of the switch element (field effect transistor) 32.

It is only necessary to connect the capacitance circuit 30A between the pulse generator 8A and the connection node N3. For example, the capacitance circuit 30A is provided between the pulse generator 8A and the column selection switch element 60, and the connection node Nx may be located between the pulse generator 8A and the column selection switch element 60.

In the resistance change type memory of the second embodiment, one end of the resistance change type storage element 10 is connected to the bit line BL, and the cathode of the diode (non-ohmic element) is connected to the word line WL. The resistance change type memory includes the capacitance circuit 30A connected to the bit line BL.

As described in the first embodiment, there is a case where a large potential is applied to the resistance change type storage element 10 immediately after the transition of the resistance state of the resistance change type storage element 10 is made from the low-resistance state to the high-resistance state. As a result, the resistance change type storage element 10 that makes the transition to the high-resistance state by the reset operation may be switched to the low-resistance state again.

In the basic example of the second embodiment, charge is accumulated in the capacitive element 31 of the capacitance circuit 30A by the pulse current $I_P$ supplied from the pulse generator 8A, and therefore the capacitive element 31 is charged during the operation (reset operation) for switching the resistance state of the resistance change type storage element 10 from the low-resistance state to the high-resistance state. For example, in FIG. 14, the pulse current is also passed through the resistance change type storage element 10 while the capacitive element 31 is charged.

After the capacitive element 31 is charged, the column selection switch element 60 is turned off, and the pulse generator 8A is electrically separated from the bit line BL and capacitance circuit element 30.

Therefore, the capacitive element 31 is discharged, the discharge current of the capacitive element 31 is discharged, and the potential at the bit line BL becomes lower. This is attributed to the following reason.

When the resistance change type storage element (selected cell) 10 that is the reset operation target is in the low-resistance state, the discharge current $I_Q$ supplied from the capacitive element 31 is selectively passed only through the selected cell. When the transition of the resistance state of the selected cell is made from the low-resistance state to the high-resistance state, because the plural resistance change type storage elements 10 are commonly connected to one bit line BL as illustrated in FIG. 2, the discharge current $I_Q$ of the capacitive element 31 is divided such that the potentials applied to the plural resistance change type storage elements connected to the same bit line BL become identical to one another. Alternatively, in order to efficiently divide the discharge current, the row selection switch element connected to each word line may be turned on in supplying the discharge current.

In the second embodiment, the transition of the resistance state of the resistance change type storage element 10 that is the selected cell is made from the low-resistance state to the high-resistance state using the discharge current $I_Q$ of the capacitive element 31.

After the resistance state of the selected cell is made from the low-resistance state to the high-resistance state, almost all the charges accumulated in the capacitive element 31 are discharged, and the potential at the bit line BL is lowered, thereby decreasing the potential difference between the selected bit line BL and the selected word line WL connected to the ground terminal WL_GND. In the second embodiment, immediately after the resistance state of the resistance change type storage element 10 changed to the high-resistance state, such a large potential that makes the transition of the resistance state is not applied to the resistance change type storage element 10.

Therefore, as soon as the resistance state of the resistance change type storage element 10 is made from the low-resistance state to the high-resistance state, the resistance change type storage element 10 can be prevented from returning to the low-resistance state due to supplying a large voltage to element 10 that takes the high-resistance state.

In the resistance change type memory of the second embodiment, the operation for making the transition of the resistance state of the resistance change type storage element is performed using the discharge current of the capacitive element, so that the resistance change type storage element whose resistance state is switched from the low-resistance state to the high-resistance state can be prevented from making the transition to the low-resistance state again. That is, the resistance change type memory of the second embodiment can prevent the writing errors.

Accordingly, the operational reliability can be improved in the resistance change type memory of the second embodiment.

The configuration of the resistance change type memory of the second embodiment is effectively applied to a memory such as ReRAM in which the resistance change type storage element 10 is used. In the memory such as ReRAM, the transition (switching speed) of the resistance state is made at high speed in the resistance change type storage element.

(b) Operation

A set operation and a reset operation in the basic example of the resistance change type memory of the second embodiment will be described with reference to FIGS. 14, 15A, 15B, and 16. The detailed description of substantially the same operation as the first embodiment is omitted.

(b-1) Set Operation

The set operation of the resistance change type memory of FIG. 14 will be described with reference to FIG. 15A. FIG. 15A is a timing chart (waveform chart) for explaining the set operation of the memory of FIG. 14.

As illustrated in FIG. 15A, the control signal PG is switched to the "H" level, and the pulse generator 8A supplies the pulse current $I_P$. Based on the selected address information, the row selection signal RS<0> of the switch element connected to the selected word line $WL_0$ is switched to the "H" level to turn on the row selection switch element 50, the selected word line $WL_0$ is activated.

Then, based on the selected address information, the control signal CS<0> of the column selection switch element 60 is switched from the "L" level to the "H" level, thereby activating the selected bit line BL. In the capacitance circuit 30A, the control signal SW<0> of the switch element 32 is maintained at the "L" level. Therefore, in the set operation of the memory of the basic example, the capacitive element 31 is not activated, and the capacitive element 31 is electrically separated from the selected bit line BL.

In the set operation, while the capacitive element 31 is not connected to the selected resistance change type storage element 10, the pulse current $I_P$ having the predetermined pulse shape is supplied from the pulse generator 8A to the selected bit line BL through the column selection switch element 60. The current value of the pulse current $I_P$ is set in a range of 10 nA to 50 μA, and the pulse width is set in a range of 10 ns to 10 μs. However, obviously the current value and pulse width of the pulse current used in the reset operation depend on the material used in the resistance change type storage element 10 and the shape and size of the resistance change type storage element 10.

The transition of the resistance state of the resistance change type storage element 10 that is the selected cell is made from the high-resistance state to the low-resistance state by the pulse current $I_P$.

Then, the column selection signal CS<0> is switched from the "H" level to the "L" level to turn off the column selection switch element 60. Then the control signal PG and the row selection signal RS<0> are switched from the "H" level to the "L" level to turn off the pulse generator 8A and the row selection switch element 50, respectively.

Thus, the set operation is ended in the resistance change type memory of the basic example of the second embodiment.

During the set operation of the basic example, because the capacitive element 31 is electrically separated from the selected bit line BL, a discharge current is not generated from the capacitive element 31, and the capacitive element 31 does not contribute to the transition of the resistance state of the resistance change type storage element 10.

As with the first embodiment, the verify operation may be performed after the set operation of FIG. 15A. The resistance state of the selected cell (resistance change type storage element) 10 is confirmed before the set operation, and the pulse current may be not supplied when the selected cell is in the low-resistance state.

Thus, during the set operation, because the capacitive element 31 connected to the bit line BL is electrically separated from the bit line BL and the selected resistance change type storage element 10, the capacitive element 31 is not charged, and the set operation of the memory of the second embodiment is not degraded by the charge and discharge of the capacitive element 31.

Accordingly, the set operation is stably performed to the selected resistance change type storage element in the resistance change type memory in which the capacitance circuit 30A is connected to the bit line BL of FIG. 14.

(b-2) Reset Operation

The reset operation of the resistance change type memory of FIG. 14 will be described with reference to FIGS. 15B and 16. FIG. 15B is a timing chart (waveform chart) for explaining the reset operation of the resistance change type memory of FIG. 14. FIG. 16 is a schematic diagram for explaining the reset operation of the memory of FIG. 14. The detailed description of the operation of substantially the same element as the reset operation of the resistance change type memory of the first embodiment is omitted.

As illustrated in FIG. 15B, as with the set operation, the control signal PG and the row selection signal RS<0> are switched to the "H" level, whereby the pulse generator 8A generates the pulse current $I_P$. The row selection switch element 50 is turned on to activate the selected word line WL.

Then, in the capacitance circuit 30A connected to the selected bit line BL based on the selected address information, the state machine 7 switches the control signal SW<0> from the "L" level to the "H" level to turn on the switch element 23. Therefore, the capacitive element 31 is electrically connected to the selected bit line BL through the on-state switch element 32.

Then, based on the selected address information, the control signal CS<0> of the column selection switch element 60 is switched from the "L" level to the "H" level, thereby activating the selected bit line BL.

In the reset operation of the second embodiment, the capacitive element 31 of the capacitance circuit 30A is connected to the selected bit line BL.

Figure 16:
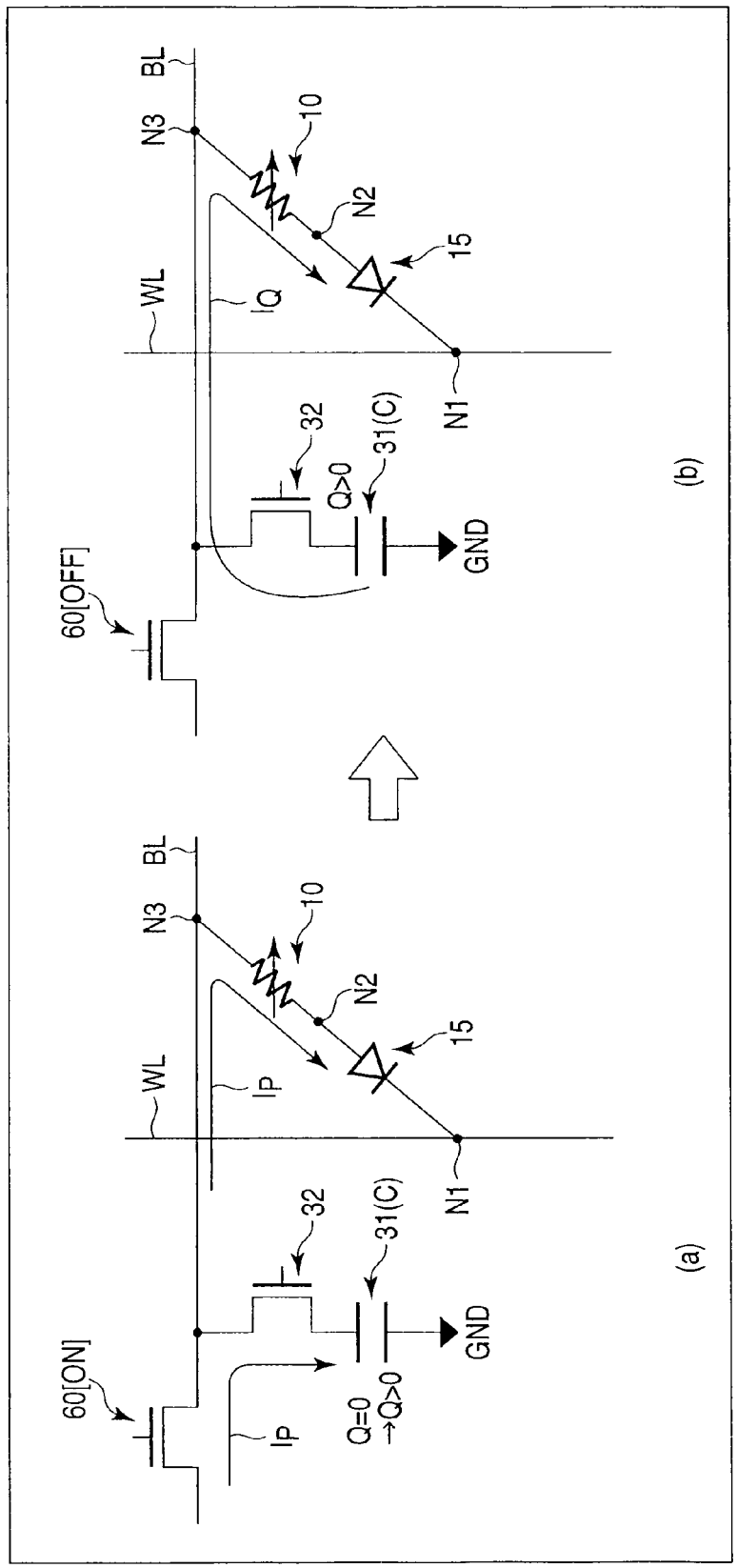
FIG. 16 schematically illustrates the operation of the resistance change type memory of FIG. 14.

Therefore, as illustrated in (a) of FIG. 16, the pulse current $I_P$ is supplied not only to the selected resistance change type storage element 10 but also to the capacitive element 31 of the capacitance circuit 30A.

The column selection switch element 60 is activated in a period from a time $t_1$ to a time $t_2$. The charge Q derived from the pulse current $I_P$ is accumulated in the capacitive element 31 in the period $t_1$ to $t_2$. Referring to FIG. 15B, after the capacitive element 31 is activated at a time $t_0$, the column selection switch element 60 is activated at the time $t_1$. This is because the capacitive element 31 is efficiently charged by previously activating the capacitive element 31 before the pulse current $I_P$ is supplied to the resistance change type storage element 10. Preferably, the period from the time $t_1$ to the time $t_2$ is previously set such that a time sufficient to accumulate the charge in the capacitive element 31 can be ensured, or preferably the state machine 7 controls the period from the time $t_1$ to the time $t_2$ during the reset operation.

At the time $t_2$, the column selection signal CS<0> is switched to the "L" level to turn off the column selection switch element 60. Therefore, the pulse generator 8A is electrically separated from the selected bit line BL, and the pulse current $I_P$ is not supplied to the selected cell 10 and the capacitive element 31.

When the column selection switch element 60 is turned off, because the current is not supplied to the capacitive element 31, the state (operation) of the capacitive element 31 is changed from the charge to the discharge. Therefore, as illustrated in (b) of FIG. 16, the discharge current $I_Q$ of the capacitive element 31 is supplied through the switch element 32 to the resistance change type storage element 10 that is the selected cell. The transition of the resistance state of the resistance change type storage element 10 that is the selected cell is made from the low-resistance state to the high-resistance state by the Joule heat generated by the discharge current $I_Q$ or the potential difference applied to the resistance change type storage element 10 due to the current $I_Q$. The discharge current $I_Q$ is discharged to the ground terminal WL_GND of the selected word line WL through the selected cell 10.

In the basic example, preferably the current value of the discharge current $I_Q$ used in the reset operation ranges from 500 nA to 100 μA. Preferably, the pulse width of the pulse current used in the reset operation ranges from 10 ns to 100 μs. Preferably, the electrostatic capacitance C of the capacitive element 31 and the charge period $t_1$ to $t_2$ of the capacitive element 31 are set such that the discharge current having the current value and pulse width is obtained. However, in the reset operation, obviously the current value and pulse width of the pulse current depend on the shape and thickness of the resistance change type storage element 10 and the material used in the resistance change type storage element 10.

As illustrated in FIG. 2, plural resistance change type storage elements are connected to the bit line BL. In the second embodiment, before the transition of the resistance state of the selected cell 10 is made to the high-resistance state, the discharge current $I_Q$ is selectively passed only through the selected cell 10 that is in the low-resistance state. When the transition of the resistance state of the selected cell 10 is made to the high-resistance state, the current and voltage are distributed such that all the resistance change type storage elements including the selected cell and non-selected cell which are connected to the same bit line BL become the same potential, and the distributed currents and voltages are supplied to the resistance change type storage elements. The current value of the discharge current $I_Q$ is decreased as time advances, thereby lowering the potential at the selected bit line BL.

When the transition of the resistance state of the selected cell 10 is made to the high-resistance state, most of the charges accumulated in the capacitive element 31 are discharged, and the potential at the bit line BL is lowered. Therefore, because large amounts of current and voltage are not supplied to the selected cell 10 that is in the high-resistance state, selected cell 10 does not return to the low-resistance state again due to supplying the current and voltage used in the reset operation to the cell 10 immediately after the transition of the resistance state of the selected cell 10 is made to the high-resistance state. Alternatively, in order to efficiently divide the discharge current, the row selection switch element connected to each word line may be turned on in supplying the discharge current.

At a time $t_3$, the control signal SW<0> is switched from the "H" level to the "L" level to turn off the switch element 32 of the capacitance circuit 30A. Preferably the period from the time $t_2$ to the time $t_3$ is previously set such that a time required for the transition of the resistance state of the selected cell 10 from the low-resistance state to the high-resistance state by the discharge current $I_Q$ of the capacitive element 31 is ensured, or preferably the state machine 7 controls the period from the time $t_2$ to the time $t_3$ during the reset operation.

Thus, the transition of the resistance state of the resistance change type storage element 10 that is the selected cell is made from the low-resistance state to the high-resistance state by utilizing the discharge current $I_Q$ of the capacitive element 31, whereby predetermined data (for example, "1") is stored in the selected cell.

After the switch element 32 is turned off, the control signal PG is set to the "L" level to turn off the pulse generator 8A. The row selection signal RS<0> is set to the "L" level to turn off the row selection switch element 60.

The reset operation is ended in the resistance change type memory of the basic example of the second embodiment. As with the set operation, the verify operation may be performed after the reset operation of FIG. 15B. The resistance state of the selected cell (resistance change type storage element) 10 is confirmed before the reset operation, and the pulse current and the discharge current are not supplied when the selected cell is in the high-resistance state.

In the resistance change type memory of the basic example of the second embodiment, the capacitive element 31 is connected to the bit line BL, and the operation (reset operation) for making the transition of the resistance state of the resistance change type storage element 10 from the low-resistance state to the high-resistance state is performed by utilizing the discharge current $I_Q$ of the capacitive element 31.

As described above, the discharge current $I_Q$ of the capacitive element 31 is preferentially supplied to the selected cell when the selected cell is in the low-resistance state, and the discharge current $I_Q$ is distributed such that the same potential is applied to the selected cell and the non-selected cell when the selected cell is in the high-resistance state.

When the reset operation is performed using the discharge current of the capacitive element 31, a large current such as the pulse current or a large voltage is not supplied to the resistance change type storage element 10 immediately after the transition of the resistance state of the resistance change type storage element 10 is made to the high-resistance state. Therefore, in the reset operation, the resistance change type storage element 10 that takes the high-resistance state can be prevented from returning to the low-resistance state due to the current or voltage used in the data write.

Therefore, the reset operation is stably performed to the selected resistance change type storage element.

Accordingly, the operational reliability can be improved in the resistance change type memory of the second embodiment.

(2) Configuration Example 1

A circuit configuration and an operation in configuration example 1 of the resistance change type memory of the second embodiment will be described with reference to FIGS. 17A and 17B.

(a) Circuit Configuration

Configuration example 1 of the resistance change type memory of the second embodiment will be described with reference to FIG. 17A. A difference in the circuit configuration between configuration example 1 and the memory of FIG. 14 will mainly be described here.

As illustrated in FIG. 17A, a capacitance circuit 30B is provided in the resistance change type memory of configuration example 1 of the second embodiment. The capacitance circuit 30B includes a resistive element 34 in addition to the capacitive element 31.

The resistive element 34 has a predetermined resistance value R. One end of the resistive element 34 is connected to the bit line BL through a switch element 35, and the other end of the resistive element 34 is connected to the ground terminal GND.

For example, the switch element 35 is a field effect transistor. One end of the current path of the field effect transistor 35 is connected to the bit line BL, and the other end of the current path of the field effect transistor 35 is connected to the other end of the resistive element 34. The control signal SW<1> is fed into the gate (control terminal) of the field effect transistor 35. The control signal SW<1> controls the turn-on and turn-off of the field effect transistor (switch element) 35.

Preferably, a resistance value R of the resistive element 34 is smaller than the resistance value in the high-resistance state of the resistance change type storage element 10. This is because the resistance change type storage element 10 in the high-resistance state and the resistive element 34 disturbs the discharge of the capacitive element 31, which cannot prevent an increase in potential at the bit line BL when the resistance value R of the resistive element 34 is larger than the resistance value in the high-resistance state of the resistance change type storage element 10.

Preferably, a resistance value R of the resistive element 34 is larger than the resistance value in the low-resistance state of the resistance change type storage element 10. When the resistance value R is smaller than the resistance value in the low-resistance state of the resistance change type storage element 10, the discharge current $I_Q$ of the capacitive element 31 is preferentially passed through the resistive element 34 having a small resistance value, the current passed through the resistance change type storage element 10 reduce. In order to prevent this phenomenon, it is necessary to increase the amount of charge accumulated in the capacitive element 31, which results in an increased power consumption for the charge.

As illustrated in FIG. 17A, in configuration example 1, the resistive element 34 is provided in the capacitance circuit 30B in addition to the capacitive element 31.

When the transition of the resistance state of the resistance change type storage element 10 is made from the low-resistance state to the high-resistance state, the resistive element 34 is connected to the bit line BL, whereby the potential or current that is supplied to the bit line BL is divided or discharged by the resistive element 34. Therefore, the large potential due to raising the potential at the bit line BL can efficiently be prevented from being applied to the resistance change type storage element 10.

As with the basic example, the resistance change type storage element 10 that takes the high-resistance state can be prevented from returning to the low-resistance state due to the supplying current or voltage during the reset operation, and the reset operation can stably be performed.

Accordingly, the operational reliability can be improved in the resistance change type memory of the second embodiment.

(b) Operation

The operation in configuration example 1 of the resistance change type memory of the second embodiment will be described with reference to FIGS. 17A and 17B.

Configuration example 1 differs from the example of FIG. 15A only in that the resistive element 34 is turned off during the set operation. Therefore, in the configuration example 1, the description of the set operation is omitted, and only the reset operation will be described. The detailed description of substantially the same operation as the reset operation of the basic example is omitted in configuration example 1.

FIG. 17B is a flowchart for explaining the reset operation of the memory of FIG. 17A.

First, as illustrated in FIG. 17B, as with the basic example of FIG. 15B, the pulse generator 8A and the row selection switch element 50 are turned on, respectively. When the row selection switch element 50 is turned on, the selected word line WL is activated.

Then the switch element 32 connected to the capacitive element 31 is turned on, and the capacitive element 31 is made conductive with the selected bit line BL.

Then the column selection switch element 60 is turned on to activate the selected bit line BL.

Therefore, the pulse current $I_P$ supplied from the pulse generator 8A is supplied to the selected bit line BL through the column selection switch element 60. The pulse current $I_P$ is supplied to the activated capacitive element 31 to charge the capacitive element 31.

Referring to FIG. 17B, at a time $t_4$, the state machine 7 makes the transition of the control signal SW<1> from the "L" level to the "H" level to turn on the switch element 35 of the capacitance circuit 30B, whereby the resistive element 34 connected to the switch element 35 is electrically connected to the selected bit line BL. Therefore, after the resistive element 34 is activated, the pulse current (voltage) $I_P$ is also supplied to the resistive element 34 in addition to the resistance change type storage element 10 and the capacitive element 31.

The column selection switch element 60 is turned off at the time $t_2$, and the pulse current $I_P$ is not supplied to the selected bit line BL. The state of the capacitive element 31 is changed from the charge to the discharge, and the discharge current $I_Q$ of the capacitive element 31 is supplied to the selected bit line BL and the resistance change type storage element 10. The discharge current $I_Q$ is also supplied to the resistive element 34.

The transition of the resistance state of the resistance change type storage element 10 that is the selected cell is made from the low-resistance state to the high-resistance state by the discharge current $I_Q$.

Because the resistive element 34 is electrically connected to the selected bit line BL, the potential at the bit line BL that is raised by the transition of the resistance state of the resistance change type storage element (selected cell) 10 to the high-resistance state is divided by the non-selected cell while divided by the resistive element 34. Therefore, a large potential can be prevented from being applied to the resistance change type storage element 10 that is the selected cell immediately after the transition of the resistance state of the element 10 is made to the high-resistance state.

At this point, preferably the time $t_4$ at which the resistive element 34 is activated, that is, the switch element 35 is turned on is set to the sum of the time $t_2$ at which the column selection switch element 60 is turned off and a minimum time (reset minimum time) $t_{RSmin}$ necessary to make the transition of the resistance state of the resistance change type storage element 10 from the low-resistance state to the high-resistance state, or preferably the time $t_4$ is previously set to a time before the time $t_2$. Alternatively, the state machine 7 may control the time $t_4$ such that the time $t_4$ is previously set to such time. This is because the potential at the bit line BL can be divided by the resistive element 34 and discharged through the resistive element 34 by putting the resistive element 34 in the conduction state to the bit line BL for the time immediately after the transition of the resistance state of the resistance change type storage element 10 is made from the low-resistance state to the high-resistance state. Alternatively the time $t_4$ may be set while the reset minimum time $t_{RSmin}$ is set to zero.

Preferably, the period from the time $t_4$ to the time $t_2$ is shorter than the period from the time $t_0$ to the time $t_2$. The time the pulse current $I_P$ is passed through the resistive element 34 is shortened, so that the charge speed of the capacitive element 31 can be enhanced and therefore the power consumption for the charge can be reduced.

At the time $t_3$, the switch element 32 connected to the capacitive element 31 is turned off, and the capacitive element 31 is electrically separated from the selected bit line BL.

At a time $t_5$, the control signal SW<1> is switched from the "H" level to the "L" level to turn off the switch element 35, whereby the resistive element 34 is electrically separated from the selected bit line BL. Preferably the time $t_5$ is set to a time after the time $t_3$. This is because the bit line BL is sufficiently discharged by the resistive element 34.

Then the row selection switch element 50 is turned off to deactivate the selected word line WL. The pulse generator 8A is turned off.

The reset operation is ended in the resistance change type memory of configuration example 1 of the second embodiment.

As illustrated in FIG. 17A, the resistance change type memory of configuration example 1 includes the capacitance circuit 30B, and the capacitive element 31 and the resistive element 34 are provided in the capacitance circuit 30B. As with the capacitive element 31, the resistive element 34 is connected to the bit line BL.

In configuration example 1, the potential at the bit line BL is divided and discharged by the resistive element 34 when the transition of the resistance state of the resistance change type storage element 10 is made to the high-resistance state, so that the resistive element 34 can prevent the potential raising at the bit line BL.

Therefore, the resistance change type storage element 10 that takes the high-resistance state can be prevented from returning to the low-resistance state due to the current or voltage used in the data write, during the reset operation. Therefore, the reset operation can stably be performed.

Accordingly, the operational reliability can be improved in the configuration example 1 of the resistance change type memory of the second embodiment.

(3) Configuration Example 2

A circuit configuration and an operation in configuration example 2 of the resistance change type memory of the second embodiment will be described with reference to FIGS. 18, 19A, and 19B.

(a) Circuit Configuration

Configuration example 2 of the resistance change type memory of the second embodiment will be described with reference to FIG. 18. A difference in the circuit between configuration example 2 and the memory of FIG. 14 will mainly be described here.

As illustrated in FIG. 18, a capacitance circuit 30C includes a switch element 37.

The current path of the switch element 37 is series-connected to the bit line BL.

For example, the switch element 37 is a field effect transistor. One end of the current path of the field effect transistor 37 is connected to the connection node Nx, and the other end of the current path of the field effect transistor 37 is connected to the connection node N3. The control signal SW<2> is fed into the gate (control terminal) of the field effect transistor 37. The control signal SW<2> controls the turn-on and turn-off of the field effect transistor 37 that is the switch element.

The switch element 37 is provided between the capacitive element 31 and the resistance change type storage element 10. The switch element 37 controls the conduction state between the capacitive element 31 and the resistance change type storage element 10.

In the resistance change type memory of configuration example 2, the capacitive element 31 is provided between the column selection switch element 60 and the switch element 37, and the two switch elements 37 and 60 control the charge and the discharge to the capacitive element 31.

The switch element 37 electrically separates the resistance change type storage element 10 and the pulse generator 8A while the capacitive element 31 is charged. The switch element 37 electrically connects the capacitive element 31 and the resistance change type storage element (selected cell) 10 when the discharge current $I_Q$ of the capacitive element 31 is imparted to the resistance change type storage element (selected cell) 10. Therefore, the pulse current $I_P$ does not flow into the resistance change type storage element 10 while the capacitive element 31 is charged, so that the charge speed of the capacitive element 31 can be enhanced to shorten the time necessary for the reset operation.

After the transition of the resistance state of the resistance change type storage element 10 is made to the high-resistance state by the discharge current $I_Q$, the switch element 37 is turned off to suppress the emission of the discharge current $I_Q$ to the resistance change type storage element 10, so that the charge time of the discharge current used in the next reset operation can be shortened and the power consumption for the charge can be reduce. Alternatively, the switch element 32 may control the suppression of the emission of the discharge current $I_Q$.

In the resistance change type memory of configuration example 2, the operating characteristic is improved during the reset operation by precharging the capacitive element 31.

Thus, in the resistance change type memory of configuration example 2, the resistance change type storage element 10 that takes the high-resistance state can be prevented from returning to the low-resistance state due to supplying the current or voltage which is used in the data write during the reset operation, and the reset operation can stably be performed.

The switch element 37 that controls the precharge of the capacitive element 31 is provided in the capacitance circuit 30C, which realizes speed enhancement and low power consumption of the operation.

Accordingly, the operational reliability can be improved in the resistance change type memory of configuration example 2 of the second embodiment. Further, the operation characteristic can be improved in the resistance change type memory of configuration example 2 of the second embodiment.

The capacitive element 31 can be precharged, even if the capacitance circuit 30C is provided between the column selection switch element 60 and the pulse generator 8A instead of providing the switch element 37. That is, the column selection switch element 60 is turned off while the capacitive element 31 is charged. After the capacitive element 31 is charged, the pulse generator 8A is turned off, and the column selection switch element 60 is turned on, thereby supplying the discharge current of the capacitive element 31 to the selected cell.

The connection position of the switch element 37 and the column selection switch element 60 may be replaced when the switch elements 37 and 60 can be controlled such that capacitive element 31 is precharged.

(b) Operation

The operation in configuration example 2 of the resistance change type memory of the second embodiment will be described with reference to FIGS. 18, 19A, and 19B. Configuration example 2 differs from the example of FIG. 15A only in that the switch element 37 is turned on during the set operation. Therefore, in configuration example 2, the description of the set operation is omitted, and only the reset operation will be described. The detailed description of substantially the same operation as the reset operation of FIG. 15B is omitted in configuration example 2.

Figure 19A:
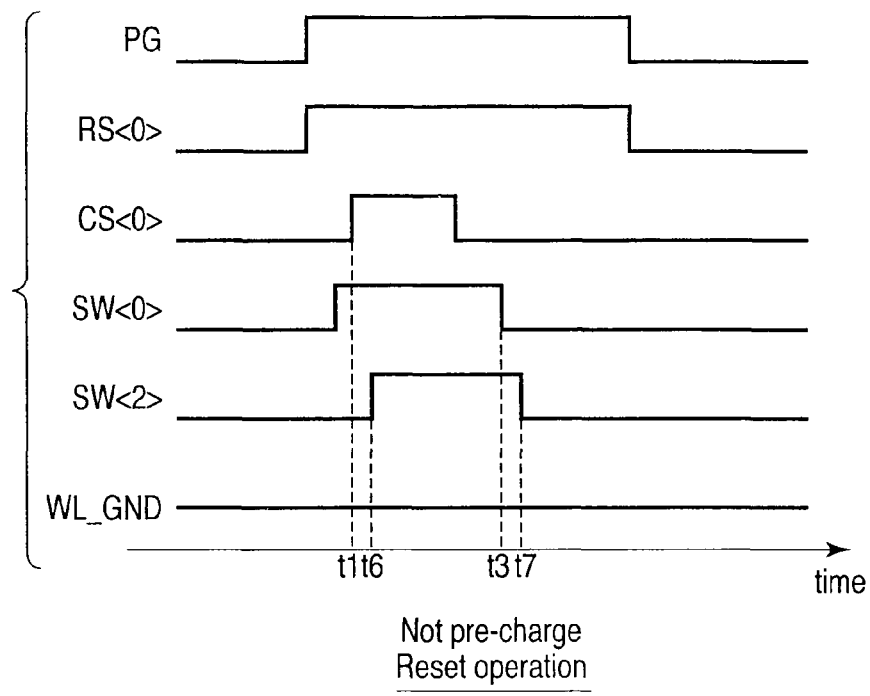
FIG. 19A is a waveform chart for explaining an operation of the resistance change type memory of FIG. 18.

FIG. 19A is a timing chart illustrating the operation when the precharge is not performed to the capacitive element 31 in the memory of FIG. 18.

In cases where the capacitive element 31 is not precharged, the reset operation of configuration example 2 is substantially identical to the reset operation (see FIG. 15B) of the basic example. The difference between the reset operation of the configuration example 2 and the reset operation of the basic example will be described below.

After the column selection switch element 60 is turned on at the time $t_1$, the control signal SW<2> is set to the "H" level at the time $t_6$, thereby turning on the switch element 37.

After a predetermined time elapses since the column selection switch element 60 is turned on, the switch element 37 is turned on such that the pulse current $I_P$ is efficiently supplied to the capacitive element 31.

After the capacitive element 31 is electrically separated from the bit line BL at the time $t_3$, the control signal SW<2> is set to the "L" level at a time $t_7$, thereby turning off the switch element 37. Thus, after the predetermined time elapses since deactivation of the column selection switch element 60 and the capacitive element 31, the switch element 37 is turned off such that the reset operation is stably performed by the discharge current $I_Q$.

Figure 19B:
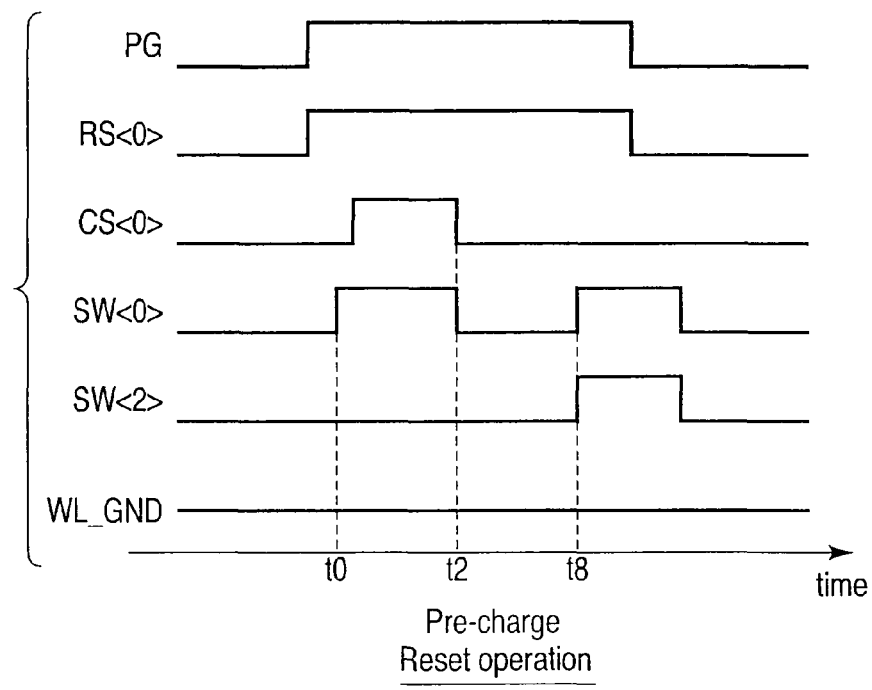
FIG. 19B is a waveform chart for explaining an operation of the resistance change type memory of FIG. 18.

FIG. 19B is a timing chart illustrating the operation in cases where the capacitive element 31 is precharged in the memory of FIG. 18.

As with the basic example of FIG. 15B, the pulse generator 8A and the row selection switch element 50 are turned on. The selected word line WL is activated by turning on the row selection switch element 50.

Then the switch element 32 connected to the capacitive element 31 is turned on to put the capacitive element 31 in the conduction state to the selected bit. The column selection switch element 60 is turned on. The control signal SW<2> is maintained at the "L" level, and the switch element 37 is turned off.

The pulse current $I_P$ supplied from the pulse generator 8A is supplied to the activated capacitive element 31 through the column selection switch element 60, and the capacitive element 31 is charged. Because the switch element 37 is turned off while the capacitive element 31 is charged, the pulse current $I_P$ is not supplied to the resistance change type storage element 10. Therefore, the capacitive element 31 is efficiently charged without a loss of the branch current to the resistance change type storage element 10.

At the time $t_2$, the column selection switch element 60 is turned off to end the charge of the capacitive element 31. For example, based on the control of the state machine 7, at the same time as the column selection switch element 60 is turned off, the control signal SW<0> is set to the "L" level to turn off the switch element 32. Therefore, the charged capacitive element 31 is electrically separated from the bit line BL. The capacitive element 31 is maintained in the charged state until the switch element 32 is turned on.

At a time $t_8$, the two control signals SW<0> and SW<2> are switched to the "H" level to turn on the switch element 32 and the switch element 37. Therefore, the capacitive element 31 in the charged state is electrically connected to the selected bit line BL and the resistance change type storage element 10 that is the selected cell. At this point, for example, the column selection switch element 60 is turned off, and the pulse generator 8A is electrically separated from the bit line BL.

Similarly, the discharge current $I_Q$ of the capacitive element 31 is passed through the selected cell (resistance change type storage element) 10 to make the transition of the resistance state of the selected cell 10 from the low-resistance state to the high-resistance state. Thus, immediately after the transition of the resistance state of the resistance change type storage element 10 is made to the high-resistance state, a large potential difference can be prevented from being applied to the resistance change type storage element 10 by performing the reset operation with the discharge current $I_Q$.

After the transition of the resistance state of the selected cell 10 is made to the high-resistance state, for example, the pulse generator 8A and the row selection switch element 50 are turned off. Then the control signals SW<0> and SW<2> are set to the "L" level to turn off the two switch elements 32 and 37, thereby electrically separating the capacitive element 31 from the bit line BL.

The reset operation is ended in the resistance change type memory of configuration example 2 of the second embodiment.

As illustrated in FIG. 18, in the resistance change type memory of configuration example 2, the switch element 37 that controls the precharge of the capacitive element 31 is provided in the capacitance circuit 30C.

In configuration example 2, the capacitive element 31 is precharged, so that the charge period of the capacitive element 31 can be shortened to achieve a speed enhancement of the reset operation. The switch element 37 prevents the pulse current $I_P$ from branching to the resistance change type storage element 10 while the capacitive element 31 is charged, so that the power consumption necessary to charge the capacitive element 31 can be reduced. Therefore, the operating characteristic of the resistance change type memory can be improved. In the configuration example 2, all the charges accumulated in the capacitive element 31 are not emitted subsequent to the reset operation, and the charge time of the next write cycle can be shortened and the power consumption can be reduced.

Configuration example 2 is effectively applied to the case in which the write operation (set operation and reset operation) is continuously performed to one bit line BL.

In configuration example 2 too also, the resistance change type storage element 10 that takes the high-resistance state can be prevented from returning to the low-resistance state due to supplying the current or voltage used in the data write during the reset operation and therefore the reset operation can stably be performed.

Accordingly, the operational reliability can be improved in the resistance change type memory of the configuration example 2 of the second embodiment.

Additionally, an improvement in an operational characteristic can be realized.

(4) Configuration Example 3

A circuit configuration and an operation in configuration example 3 of the resistance change type memory of the second embodiment will be described with reference to FIGS. 20, 21A and 21B.

(a) Circuit Configuration

Configuration example 3 of the resistance change type memory of the second embodiment will be described with reference to FIG. 20. A difference in the circuit between configuration example 3 and the memory of FIG. 14 will mainly be described here.

As described above with reference to FIG. 2, the plural bit lines and the plural word lines are provided in one memory cell array 1. The resistance change type storage elements $10_0$ to $10_m$ are connected to the bit lines and the word lines, respectively.

As described above, during the operation, the resistance change type storage elements $10_0$ to $10_m$ are affected by the wiring resistance and wiring capacitance of the bit line BL. Therefore, the difference in operating characteristic caused by the wiring resistance and wiring capacitance is generated between the element $10_0$ located near the current supply source or potential supply source and the element $10_m$ located far away from the current supply source or potential supply source.

In the second embodiment, the transition of the resistance state of the resistance change type storage element is made using the discharge current of the capacitive element 31. As with the pulse current, the discharge current is affected by the wiring resistance and wiring capacitance and, for example, the waveform of the discharge current is deformed or the maximum current value is decreased.

Figure 20:
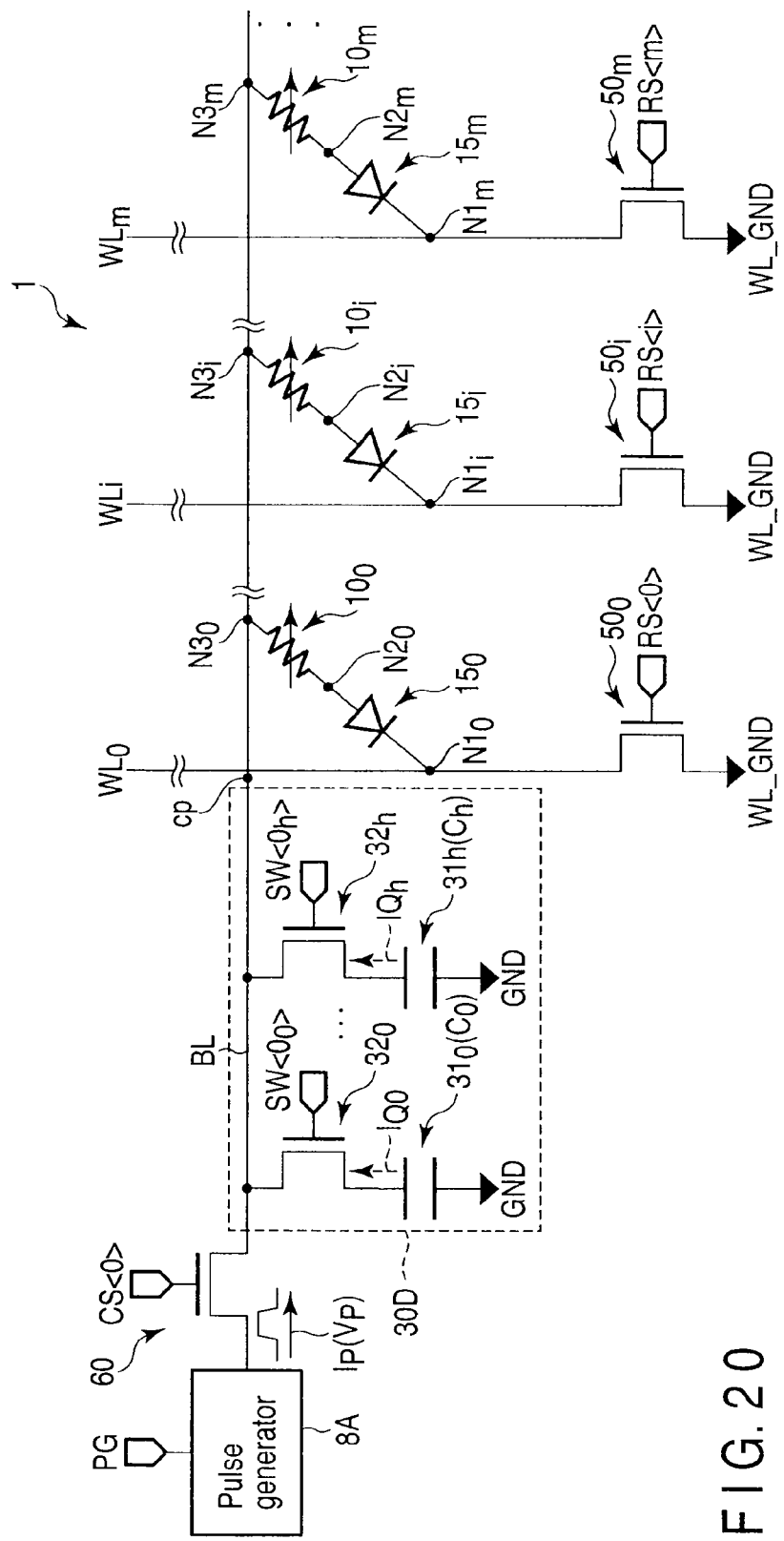
FIG. 20 illustrates configuration example 3 of the resistance change type memory of the second embodiment.

In configuration example 3, as illustrated in FIG. 20, plural capacitive elements $31_0$ to $31_h$ are provided in a capacitance circuit 30D in order to suppress the adverse effect of the discharge current degradation.

The capacitive elements $31_0$ to $31_h$ are connected to one bit line BL through the switch elements $32_0$ to $32_h$, respectively. The capacitive elements $31_0$ to $31_h$ may have different electrostatic capacitances or the same electrostatic capacitance.

The state machine 7 separately controls the switch elements $32_0$ to $32_h$ using control signals $SW<0_0>$ to $SW<0_h>$.

The state machine 7 controls the capacitance circuit 30D such that the number of activated capacitive elements $31_0$ to $31_h$ depends on the connection points of the resistance change type storage elements $10_0$ to $10_n$ and the bit line BL.

Therefore, for example, in a resistance change type storage element $10_0$ that is hardly affected by the wiring resistance and wiring capacitance caused by the wiring length, the transition of the resistance state of the element $10_0$ is made using a small discharge current $I_{Q0}$. On the other hand, in a resistance change type storage element $10_m$ that is significantly affected by the wiring resistance and wiring capacitance caused by the wiring length, the transition of the resistance state of the element $10_m$ is made using a discharge current $(I_{Q0}+I_{Qh})$ that is larger than the discharge current $I_{Q0}$ used in the resistance change type storage element $10_0$.

Thus, in connection nodes $N3_0$ to $N3_m$ of the bit line BL and the resistance change type storage elements $10_0$ to $10_n$, when the resistance change type storage element $10_m$ connected to the node $N3_m$ located far away from the pulse generator 8A and capacitance circuit 30D is selected, the number of activated capacitive elements $31_0$ to $31_h$ becomes larger than in the case in which the resistance change type storage element $10_0$ connected to the node $N3_0$ located near the pulse generator 8A and capacitance circuit 30D is selected.

As a result, the discharge current $(I_{Q0}+I_{Qh})$ supplied to the resistance change type storage element $10_m$ becomes larger than the discharge current $I_{Q0}$ supplied to the resistance change type storage element $10_0$.

Therefore, even if the operation of the resistance change type memory is degraded due to the wiring resistance or wiring capacitance, the probability of the generation of data write defects can be reduced.

Accordingly, the operational reliability can be improved in the resistance change type memory of the configuration example 3 of the second embodiment.

(b) Operation

The operation in configuration example 3 of the resistance change type memory of the second embodiment will be described with reference to FIGS. 21A and 21B. Configuration example 3 differs from the example of FIG. 15A only in that the capacitive elements $31_0$ and $31_h$ of the capacitance circuit 30D are electrically separated from the bit line BL during the set operation. Therefore, in Configuration example 3, the description of the set operation is omitted, and only the reset operation will be described. The detailed description of substantially the same operation as the reset operation of FIG. 15B is omitted in the configuration example 3. For the sake of convenience, the case in which the two capacitive elements $31_0$ and $31_h$ are used will be described here by way of example.

The case in which the reset operation is performed to the resistance change type storage element $10_0$ having the connection node $N3_0$ located near the connection point cp of the pulse generator 8A (or the capacitance circuit 30D) that is the current supply side on one bit line BL will be described with reference to FIG. 21A. At this point, the selected word line is the word line $WL_0$.

As with the basic example of FIG. 15B, the pulse generator 8A and the row selection switch element $50_0$ are turned on. The selected word line $WL_0$ is activated by turning on the row selection switch element $50_0$.

Then, in the two control signals $SW<0_0>$ and $SW<0_h>$, the control signal $SW<0_0>$ is switched to the "H" level, and the control signal $SW<0_h>$ is maintained at the "L" level.

Figure 21A:
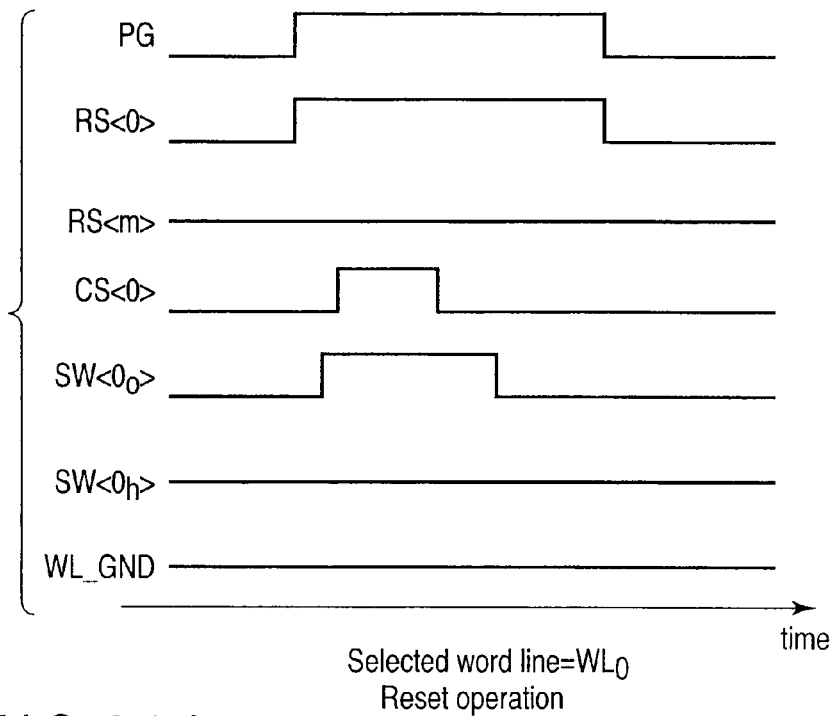
FIG. 21A is a waveform chart for explaining an operation of the resistance change type memory of FIG. 20.

In FIG. 21A, because the resistance change type storage element $10_0$ connected near the connection point cp of the pulse generator 8A is the selected cell, the capacitive element $31_0$ is activated, and the capacitive element $31_0$ is put in the conduction state with the bit line BL. The capacitive element $31_h$ is not activated, and the capacitive element $31_h$ is electrically separated from the bit line BL.

Then the column selection switch element 60 is turned on to activate the selected bit line BL.

Therefore, the pulse current $I_P$ is supplied from the pulse generator 8A to the selected bit line BL through the column selection switch element 60. The pulse current $I_P$ is also supplied to the activated capacitive element $31_0$, and the capacitive element $31_0$ is charged by the pulse current $I_P$. As described above, because the capacitive element $31_h$ is not activated, only the capacitive element $31_0$ is charged.

After the capacitive element $31_0$ is charged in a predetermined period, the column selection switch element 60 is turned off. The discharge current $I_{Q0}$ of the capacitive element $31_0$ is supplied to the resistance change type storage element $10_0$ connected to the selected word line $WL_0$, whereby the discharge current $I_{Q0}$ makes the transition of the resistance state of the resistance change type storage element $10_0$ from the low-resistance state to the high-resistance state.

In cases where the current (or voltage) is supplied to the resistance change type storage element $10_0$ connected near the connection point cp of the pulse generator 8A (capacitance circuit 30D) on one bit line BL, current degradation caused by the wiring length is hardly generated. Therefore, in configuration example 3, the discharge current $I_{Q0}$ is supplied from the capacitive element $31_0$ to the resistance change type storage element $10_0$ near the current supply side to make the transition of the resistance state of the resistance change type storage element $10_0$ that is the selected cell.

After the transition of the resistance state of the resistance change type storage element $10_0$ is made to the high-resistance state, the control signal SW<$0_0$> is switched from the "H" level to the "L" level to deactivate the capacitive element $31_0$. Then the pulse generator 8A and the row selection switch element 50 are turned off.

The reset operation performed to the resistance change type storage element $10_0$ connected to the selected word line $WL_0$ is ended in the resistance change type memory of configuration example 3 of the second embodiment.

As illustrated in FIG. 21A, the reset operation is performed to the resistance change type storage element $10_0$ connected near the connection point cp of the pulse generator 8A (capacitance circuit 30D) on one bit line BL using the capacitive element $31_0$ in the capacitive elements $31_0$ and $31_h$ provided in the capacitance circuit 30D.

The case in which the reset operation is performed to the resistance change type storage element $10_m$ having the connection node $N3_m$ located far away from the connection point cp of the pulse generator 8A (or capacitance circuit 30D) that is the current supply side on one bit line BL will be described with reference to FIG. 21B. At this point, the selected word line is the word line $WL_m$.

As with the operation of FIG. 21A, the pulse generator 8A and the row selection switch element $50_m$ are turned on. The selected word line $WL_m$ is activated by turning on the row selection switch element $50_m$.

Then, in the two control signals SW<$0_0$> and SW<$0_h$>, the control signal SW<$0_0$> is switched to the "H" level, and the control signal SW<$0_h$> is also set to the "H" level.

Figure 21B:
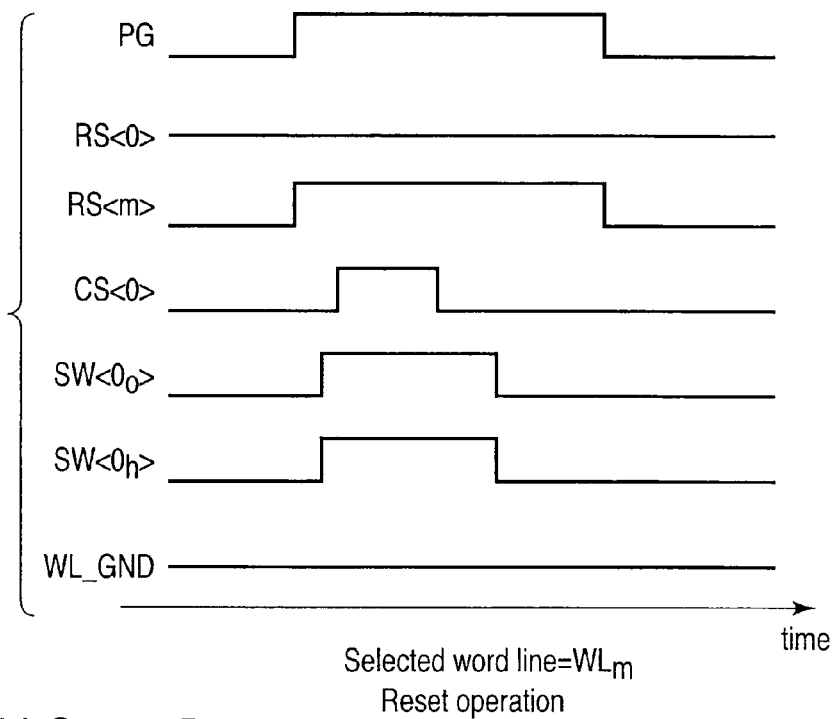
FIG. 21B is a waveform chart for explaining an operation of the resistance change type memory of FIG. 20.

In FIG. 21B, because the resistance change type storage element $10_m$ provided far away from the connection point cp of the pulse generator 8A (or the capacitance circuit 30D) is the selected cell, the capacitive elements $31_0$ and $31_h$ are activated, and the capacitive elements $31_0$ and $31_h$ are put in the conduction state to the bit line BL. Then the column selection switch element 60 is turned on to activate the selected bit line BL.

Therefore, the pulse current $I_P$ is supplied to the selected bit line BL through the column selection switch element 60. The pulse current $I_P$ is also supplied to the two activated capacitive elements $31_0$ and $31_h$, and the capacitive elements $31_0$ and $31_h$ are charged by the pulse current $I_P$.

After the two capacitive elements $31_0$ and $31_h$ are charged in a predetermined period, the column selection switch element 60 is turned off. The sum of the discharge currents $I_{Q0}$ and $I_{Qh}$ of the two capacitive elements $31_0$ and $31_h$ is supplied to the resistance change type storage element $10_m$ connected to the selected word line $WL_m$.

The transition of the resistance state of the resistance change type storage element $10_m$ is made from the low-resistance state to the high-resistance state by the discharge current $(I_{Q0}+I_{Qh})$ supplied from the two capacitive elements $31_0$ and $31_h$.

In cases where the current (or voltage) is supplied to the resistance change type storage element $10_m$ connected far away from the connection point cp of the pulse generator 8A (capacitance circuit 30D) on one bit line BL, the current degradation caused by the wiring length is significantly generated. Therefore, in consideration of the current degradation caused by the wiring length, the state machine 7 determines the connection positions of the bit line BL and the resistance change type storage elements $10_0$ to $10_m$ based on the selected address information, and the state machine 7 controls the number of activated capacitive elements based on the determination result.

When the plural capacitive elements are activated for the selected cell (resistance change type storage element) located far away from the current supply side (pulse generator 8A and capacitance circuit 30D), the discharge current $(I_{Q0}+I_{Qh})$ is passed through the bit line BL. The discharge current $(I_{Q0}+I_{Qh})$ is larger than the discharge current $I_{Q0}$ used to make the transition of the resistance state of the resistance change type storage element $10_0$ located near the current supply side. When the discharge current $(I_{Q0}+I_{Qh})$ reaches the resistance change type storage element $10_m$, although the discharge current is affected by the wiring length, the current value or pulse width necessary for the transition of the resistance state is ensured. Therefore, the influence of the discharge current degradation caused by the wiring resistance or wiring capacitance is reduced to enable normally writing of data in the selected cell.

The sum of the discharge currents $I_{Q0}$ and $I_{Qh}$ is supplied from the two capacitive elements $31_0$ and $31_h$ to the resistance change type storage element $10_m$ located far away from the current supply side, thereby making the transition of the resistance state of the resistance change type storage element $10_0$ that is the selected cell.

After the transition of the resistance state of the resistance change type storage element $10_m$ is made from the low-resistance state to the high-resistance state, the control signals SW<$0_0$> and SW<$0_h$> are switched from the "H" level to the "L" level to deactivate the capacitive elements $31_0$ and $31_h$. Then the pulse generator 8A and the row selection switch element 50 are turned off.

The reset operation performed to the resistance change type storage element $10_m$ connected to the selected word line $WL_m$ is ended in the resistance change type memory of configuration example 3 of the second embodiment.

As illustrated in FIG. 21B, the reset operation is performed to the resistance change type storage element $10_m$ connected far away from the connection point cp of the pulse generator 8A (capacitance circuit 30D) on one bit line BL using the capacitive elements $31_0$ and $31_h$ provided in the capacitance circuit 30D.

In the resistance change type memory of configuration example 3 of the second embodiment, as illustrated in FIG. 20, the capacitive elements $31_0$ and $31_h$ are provided in the capacitance circuit 30D.

In the resistance change type memory of configuration example 3, in consideration of the connection positions of one bit line BL and the resistance change type storage elements $10_0$ to $10_m$, the number of capacitive elements $31_0$ and $31_h$ used in the charge and discharge is controlled, and the discharge current used in the reset operation is adjusted. Therefore, the discharge current degradation caused by the wiring length can be suppressed to reduce the data write defects caused by the wiring length. As with other examples, immediately after the resistance change type storage element takes the high-resistance state, an excessively large potential that return the high-resistance state element to the low-resistance state again can be prevented from being applied to the resistance change type storage element. Therefore, stabilization of the reset operation can be achieved.

Accordingly, the operational reliability can be improved in the configuration example 3 of the resistance change type memory of the second embodiment.

(5) Configuration Example 4

A circuit configuration and an operation in configuration example 4 of the resistance change type memory of the second embodiment will be described with reference to FIGS. 22, 23A, and 23B.

(a) Circuit Configuration

Configuration example 4 of the resistance change type memory of the second embodiment will be described with reference to FIG. 22. Only a difference between configuration example 4 and the memories of FIGS. 14 and 20 will be described here.

As illustrated in FIG. 22, the resistance change type memory of configuration example 4 includes the capacitance circuit 30A that supplies the discharge current $I_Q$ to the resistance change type storage elements $10_0$ to $10_m$ and the potential supplying circuit 8B that is connected to the word lines $WL_0$ to $WL_m$. For example, the state machine 7 controls the potential supplying circuit 8B.

During the reset operation, under the control of the state machine 7, the potential supplying circuit 8B supplies the word line supply potential WL_SRC to the plural word lines $WL_0$ to $WL_m$.

During the reset operation, the potential WL_SRC is previously supplied to the word lines $WL_0$ to $WL_m$, whereby the potential difference between the bit line BL and the word lines $WL_0$ to $WL_m$ is adjusted so as not to become excessively large.

Therefore, the large potentials applied to the resistance change type storage elements that are the selected cell can be suppressed immediately after the transitions of the resistance states of the resistance change type storage elements $10_0$ to $10_m$ that are the selected cell are made to take the high-resistance state.

Similarly, on one bit line BL, the resistance change type storage element $10_0$ is connected near the connection point (current supply side) cp of the pulse generator 8A (or capacitance circuit 30A) and the bit line BL, and the resistance change type storage element $10_m$ is connected far away from the connection point cp of the pulse generator 8A and the bit line BL.

The potential supplying circuit 8B supplies the potential $V_0$ as the word line supply potential WL_SRC to the word line $WL_0$ connected to the resistance change type storage element $10_0$ when the reset operation is performed to the resistance change type storage element $10_0$.

The potential supplying circuit 8B supplies the potential $V_m$ as the word line supply potential WL_SRC to the word line $WL_m$ connected to the resistance change type storage element $10_m$ when the reset operation is performed to the resistance change type storage element $10_0$.

The influence of the degradation of the discharge current $I_Q$, which is caused by the wiring length of the bit line BL, is reduced by respectively imparting different potentials to the word lines $WL_0$ to $WL_m$, and the potential differences applied to the resistance change type storage elements $10_0$ to $10_m$ become substantially identical.

Therefore, even if operation of the resistance change type memory is degraded due to the wiring resistance or wiring capacitance, the probability of the generation of the data write defects generated by the degraded operation can be reduced.

The potential $V_0$ and the potential $V_m$ may previously be set such that the potential difference applied to the resistance change type storage element $10_m$ is substantially identical to the potential difference applied to the resistance change type storage element $10_0$ during the each reset operation, or the state machine 7 may adjust the potential $V_0$ and the potential $V_m$ depending on the situation during the reset operation. For example, the potentials $V_0$ and $V_m$ supplied to the word lines $WL_0$ to $WL_m$ is set equal to or smaller than a potential that is generated from the pulse current $I_P$ or discharge current $I_Q$ and the wiring resistance of the bit line BL.

Accordingly, the operational reliability can be improved in the configuration example 4 of the resistance change type memory of the second embodiment.

(b) Operation

The operation in the configuration example 4 of the resistance change type memory of the second embodiment will be described with reference to FIGS. 22, 23A, and 23B. Configuration example 4 differs from the example of FIG. 15A only in that the potential supplying circuit 8B is turned off during the set operation. Therefore, in configuration example 4, the description of the set operation is omitted, and only the reset operation will be described. The detailed description of substantially the same operation as the reset operation of FIG. 15B is omitted in configuration example 4.

The case in which the reset operation is performed to the resistance change type storage element $10_0$ connected near the connection point cp of the pulse generator 8A and capacitance circuit 30A (current supply side) on one bit line BL will be described with reference to FIG. 23A. At this point, the selected word line is the word line $WL_0$.

As with the basic example of FIG. 15B, the pulse generator 8A and the row selection switch element $50_0$ are turned on. The selected word line $WL_0$ is activated by turning on the row selection switch element $50_0$.

Figure 23A:
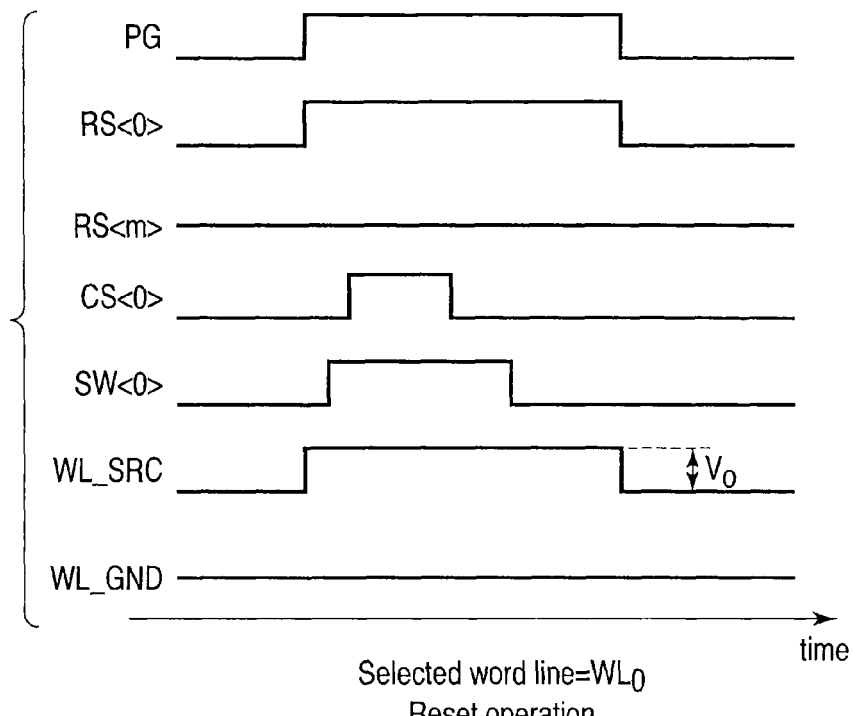
FIG. 23A is a waveform chart for explaining an operation of the resistance change type memory of FIG. 22.

As illustrated in FIG. 23A, before the bit line BL is activated, the state machine 7 turns on the potential supplying circuit 8B to, the word line supply potential WL_SRC having the potential $V_0$ is supplied to the selected word line $WL_0$. The control signal SW<0> is set to the "H" level to activate the capacitive element 31.

Then the column selection switch element 60 is turned on to activate the selected bit line BL. Therefore, the pulse current $I_P$ is supplied from the pulse generator 8A to the selected bit line BL through the column selection switch element 60. The pulse current $I_P$ is also supplied to the activated capacitive element 31, and the capacitive element 31 is charged by the pulse current $I_P$.

After the capacitive element 31 is charged in a predetermined period, the column selection switch element 60 is turned off. The discharge current $I_Q$ of the capacitive element 31 is supplied to the resistance change type storage element $10_0$ connected to the selected word line $WL_0$, whereby the discharge current $I_Q$ makes the transition of the resistance state of the resistance change type storage element $10_0$ from the low-resistance state to the high-resistance state.

In configuration example 4, the word line supply potential WL_SRC (=$V_0$) is previously supplied to the selected word line $WL_0$. Therefore, immediately after the transition of the resistance state of the selected cell (resistance change type storage element) $10_0$ is made to the high-resistance state, the potential difference applied to the selected cell $10_0$ is adjusted so as not to become excessively large. Alternatively, the state machine 7 may adjust the word line supply potential WL_SRC in order to stabilize the operation while the discharge current $I_Q$ is supplied to the selected cell.

After the transition of the resistance state of the resistance change type storage element $10_0$, the pulse generator 8A and the row selection switch element 50 are turned off. The state machine 7 turns off the potential supplying circuit 8B to stop the supply of the word line supply potential WL_SRC.

The reset operation performed to the resistance change type storage element $10_0$ connected to the selected word line WL$_0$ is ended in the resistance change type memory of configuration example 4 of the second embodiment.

The case in which the reset operation is performed to the resistance change type storage element 10$_m$ connected far away from the connection point cp of the pulse generator 8A and capacitance circuit 30A (current supply side) on one bit line BL will be described with reference to FIG. 23B. At this point, the selected word line is the word line WL$_m$.

Figure 23B:
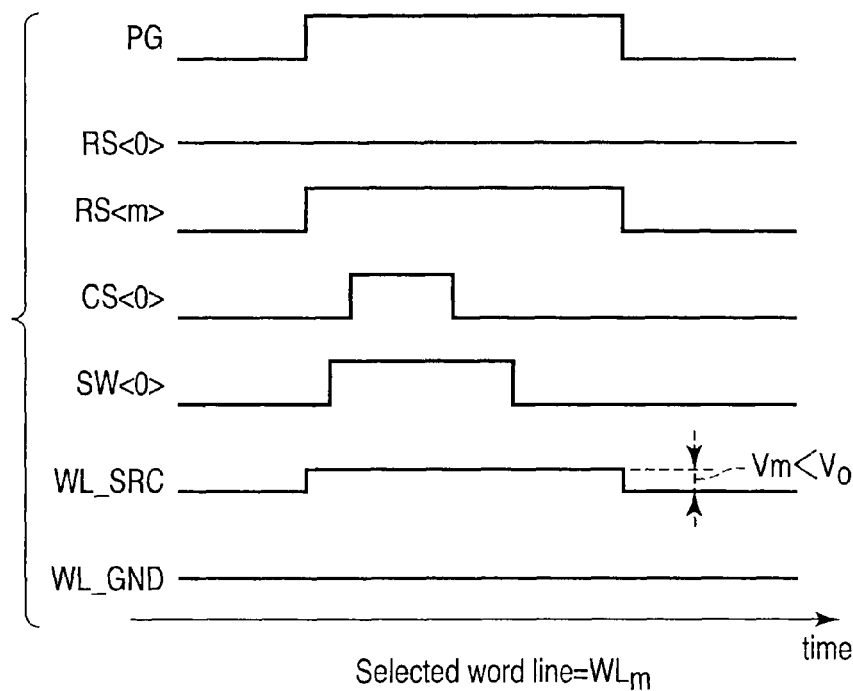
FIG. 23B is a waveform chart for explaining an operation of the resistance change type memory of FIG. 22.

As illustrated in FIG. 23B, the pulse generator 8A is turned on. The row selection switch element 50$_m$ is turned on to activate the selected word line WL$_m$.

Then the potential supplying circuit 8B is turned on, and the word line supply potential WL_SRC having the potential V$_m$ is supplied to the selected word line WL$_m$ before the bit line BL is activated. The potential V$_m$ is smaller than the potential V$_0$ supplied to the word line WL$_0$.

After the capacitive element 31 is activated, because the column selection switch element 60 is turned on to activate the selected bit line BL, the pulse current I$_P$ is supplied to the selected bit line BL through the column selection switch element 60. The capacitive element 31 is charged by the pulse current I$_P$.

After the capacitive element 31 is charged in a predetermined period, the column selection switch element 60 is turned off. The discharge current I$_Q$ of the capacitive element 31 is supplied to the resistance change type storage element 10$_m$ connected to the selected word line WL$_m$, whereby the discharge current I$_Q$ makes the transition of the resistance state of the resistance change type storage element 10$_0$ that is the selected cell from the low-resistance state to the high-resistance state.

The word line supply potential WL_SRC is previously supplied to the selected word line WL$_m$. Therefore, immediately after the transition of the resistance state of the selected cell (resistance change type storage element) 10$_m$ is made to the high-resistance state, an excessively large potential difference that makes the transition of the selected cell 10$_m$ to the low-resistance state again can be prevented from being applied to the selected cell 10$_m$.

In the resistance change type storage element 10$_m$ located far away from the connection point cp of the current supply source such as the pulse generator 8A and the capacitance circuit 31, the potential WL_SRC (=V$_m$) supplied to the word line WL$_m$ connected to the element 10$_m$ is smaller than the potential WL_SRC (=V$_0$) supplied to the word line WL$_0$ connected to the resistance change type storage element 10$_0$ provided near the current supply source. Therefore, the influence of the discharge current degradation caused by the wiring length of the bit line is reduced, and substantially the same potential difference is applied to both the resistance change type storage element 10$_m$ located far away from the current supply source and the resistance change type storage element 10$_0$ located near the current supply source.

After the transition of the resistance state of the resistance change type storage element 10$_0$, the pulse generator 8A and the row selection switch element 50 are turned off. The potential supplying circuit 8B is turned off to stop the supply of the word line supply potential WL_SRC.

The reset operation performed to the resistance change type storage element 10$_m$ connected to the selected word line WL$_m$ is ended in the resistance change type memory of configuration example 4 of the second embodiment.

The resistance change type memory of configuration example 4 includes the potential supplying circuit 8B that supplies the potential to the word line. In the resistance change type memory of configuration example 4, the potential WL_SRC is previously supplied to the selected word lines WL$_0$ to WL$_m$ during the reset operation, whereby an excessively large potential is prevented from being supplied to the resistance change type storage elements 10$_0$ to 10$_m$ immediately after the transitions of the resistance states of the resistance change type storage elements 10$_0$ to 10$_m$ are made to take the high-resistance state. Therefore, in configuration example 4, as with other configuration examples, stabilization of the reset operation can be achieved.

In configuration example 4, in consideration of the connection positions of one bit line BL and the resistance change type storage elements 10$_0$ to 10$_m$, the potential supplying circuit 8B controls the potential WL_SRC supplied to each word line, so that the reset operation can be performed while the discharge current degradation caused by the wiring length is suppressed. Therefore, data write defects caused by the wiring length can be reduced.

Accordingly, the operational reliability can be improved in the resistance change type memory of configuration example 4 of the second embodiment.

(6) Layout Example

A layout example of the capacitance circuit included in the resistance change type memory of the second embodiment will be described with reference to FIGS. 24A and 24B.

The capacitance circuits 30A to 30D included in the resistance change type memories of the embodiment and the memory cell array 1 are provided in the same chip.

As illustrated in FIG. 24A, a capacitance circuit block 39 is provided in the end portion of the memory cell array 1. The capacitance circuit 30A is provided in the capacitance circuit block 39.

One capacitance circuit 30A is connected to one bit line BL. In the layout of FIG. 24, an enlargement of the chip size can be prevented even if the capacitance circuit 30A is provided in the chip.

Obviously the capacitance circuit block 39 may be provided outside the memory cell array 1. For example, as illustrated in FIG. 24B, the capacitance circuit block 39 may be provided between the memory cell array 1 and the column control circuit 2.

In FIGS. 24A and 24B, one bit line BL is connected to one capacitance circuit 30A. Alternatively, one capacitance circuit 30A may be shared by the plural bit lines BL using the switch element such that the roundabout current does not flow into the non-selected cell. In addition to the points of FIGS. 24A and 24B, the capacitance circuit block 39 may be provided outside (chip end portion) the column control circuit 2 or inside the column control circuit 2 according to the chip layout. Although the capacitance circuit 30A of the basic example is illustrated in FIGS. 24A and 24B, obviously the capacitance circuits 30B to 30D of configuration examples 2 to 5 may be used.

4. Verification

Verification of the resistance change type memories of the first and second embodiments will be described with reference to FIG. 25.

The configuration of the resistance change type memory illustrated in FIG. 6 and the configuration of the resistance change type memory illustrated in FIG. 18 are used in the verification.

The resistance change type storage element 10 and non-ohmic element 15, which are used in the verification, have a structure in which the resistance change type storage element 10 and the non-ohmic element are laminated as illustrated in FIG. 4.

The size (dimension) of the resistance change type storage element 10 is set to 43 nm. The resistance change type storage element 10 is formed by a hafnium oxide film (HfO$_X$). Titanium nitride (TiN) is used in electrodes 71 and 73 that are provided in the bottom and upper surfaces of the resistance change type storage element 10, respectively. The hafnium oxide film has a thickness of 10 nm.

The non-ohmic element 15 is a diode. As with the resistance change type storage element 10, the size (dimension) of the diode is set to 43 nm.

FIG. 25 illustrates the verification result of the reset operation of the resistance change type storage element (hafnium oxide film) 10. FIG. 25 illustrates a probability (hereinafter referred to as reset probability) of the reset operation of the element to the relationship between the capacitance value and the voltage value.

The capacitance values of FIG. 25 correspond to the capacitance values of the capacitive elements 21 and 31 of FIGS. 6 and 18. The capacitive elements 21 and 31 used in the verification have capacitance values of 0.8 pF, 2.4 pF, and 5.6 pF. The voltage values of FIG. 25 indicate the potential differences applied to the bit line BL. The voltage values used in the verification are 4 V, 5 V, and 6 V, The pulse current is produced by this voltage, respectively. In the configuration illustrated in FIG. 6, the switch element 60 is made open for 10 μs to charge the capacitive element 21. In the configuration illustrated in FIG. 18, the switch element 60 is made open to charge the capacitive element 31 for 10 μs and thereafter the switch element 37 is made open for 10 μs to discharge the current from the capacitive element 31. The charge and discharge time is set such that a sufficient amount of charge to verify the operation is accumulated in and discharge from the capacitive elements 21 and 31, respectively.

As illustrated in FIG. 25, even if the capacitive elements 21 and 31 are connected to the word line WL or bit line BL, the resistance change type storage element performs the reset operation to normally write the data.

In the circuit configuration of FIGS. 6 and 18, a time (referred to as applied time) t for which the voltage is actually applied to the resistance change type storage element and diode is obtained from the capacitance value of the capacitive element and the resistance value (impedance) of the resistance change type storage element and diode. The applied time t can be expressed by "t=RC" using a capacitance value (C) and a resistance value (R).

Assuming that the element and wiring having the configuration used in the verification have the resistance value of 300 kΩ and the capacitance of 2 pF, the applied time is 0.6 μs.

The applied time (0.6 μs) satisfies a time (up to 100 ns) necessary to perform the reset operation in cases where hafnium oxide is used in resistance change type storage element 10. Therefore, as illustrated in FIG. 25, the reset probability is obtained within the capacitance value of 0.8 pF to 5.6 pF.

However, the verification result is illustrated in FIG. 25 only by way of example. When the size (area), film thickness, and material of the resistance change type storage element 10 are changed, obviously the resistance value of the resistance change type storage element 10 is changed. Therefore, preferably the capacitance value of the capacitive element is changed according to the resistance value of the resistance change type storage element 10.

As is clear from the verification result, the operational reliability can be improved in the resistance change type memories of the first and second embodiments.

5. Other

The components may appropriately be combined in the first and second embodiments of the invention. For example, configuration examples 2 to 4 may be combined in the resistance change type memory of the second embodiment.

The resistance change type memory that is driven by the unipolar operation has been described in the first and second embodiments. However, the resistance change type memory of the invention may be of course applied to the resistance change type memory that is driven by the bipolar operation.

In the resistance change type memory of the invention, the connection relationship between the word line WL and bit line BL and the series circuit including the resistance change type storage element and non-ohmic element is not limited to the examples of the first and second embodiments.

For example, as illustrated in FIGS. 26A and 26B, there may be adopted a circuit configuration, in which the anode of the non-ohmic element 15 is connected to the bit line BL, the cathode of the non-ohmic element 15 is connected to one end of the resistance change type storage element 10, and the other end of the resistance change type storage element 10 is connected to the word line WL.

When the bit line (first wiring) is connected to the one end of the resistance change type storage element 10, the other end of the resistance change type element is connected to the one end (anode) of the non-ohmic element (diode), and the other end (cathode) of the non-ohmic contact is connected to the word line (second wiring) as shown in FIGS. 2, 6 and 14, the stress to the non-selected resistance change type storage element is smaller compared to the configuration shown in FIGS. 26A and 26B because the reverse bias is applied directly to non-ohmic element by applying a voltage to the non-selected word line.

Figure 27A:
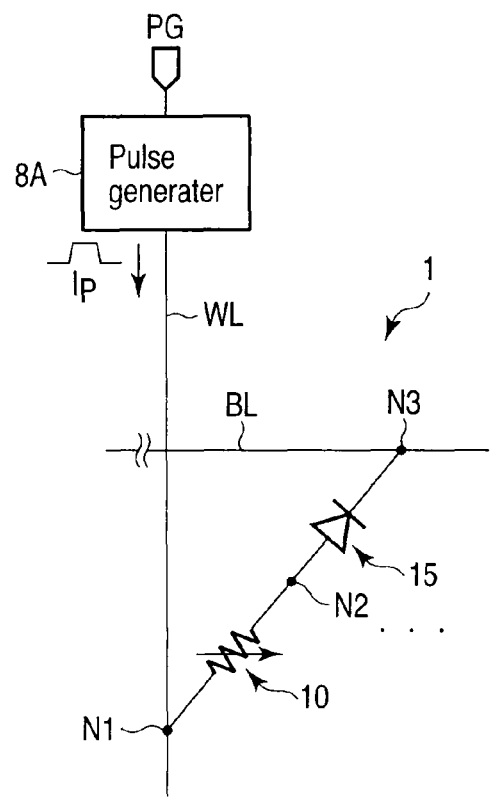
FIG. 27A illustrates a modification example of the resistance change type memory.
Figure 27B:
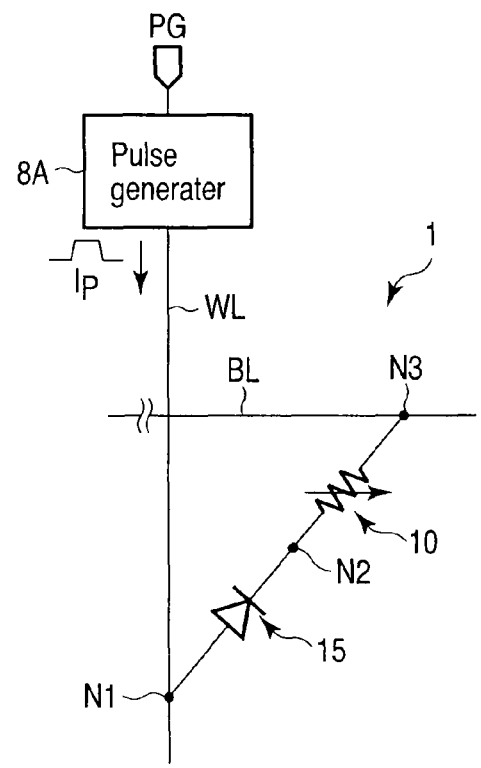
FIG. 27B illustrates a modification example of the resistance change type memory.

In another configuration example of the series circuit in the case where the pulse generator (energy supplying circuit) 8A is connected to the word line WL, as illustrated in FIG. 27A, the cathode of the non-ohmic element 15 may be connected to the bit line BL, the anode of the non-ohmic element may be connected to one end of the resistance change type storage element, and the other end of the resistance change type storage element may be connected to the word line WL. As illustrated in FIG. 27B, one end of the resistance change type storage element 10 may be connected to the bit line BL, the other end of the resistance change type storage element 10 may be connected to the cathode of the non-ohmic element 15, and the anode of the non-ohmic element may be connected to the word line WL.

When first or second embodiment is applied to the circuit configuration of FIG. 27B, as illustrated in FIGS. 28A and 28B, the word line WL may be set onto the high potential side while the bit line BL is set onto the low potential side, and the reset operation of the embodiments may be performed. For example, in the circuit configuration of the resistance change type storage element 10 connected between the bit line and the word line, the anode of the diode 15 is connected to the word line WL, one end of the resistance change type storage element 10 is connected to the bit line BL, and the cathode of the diode 15 is connected to the other end of the resistance change type storage element 10. The energy (for example, current or voltage) for making the transition of the resistance state of the resistance change type storage element 10 is supplied from The word line side to the resistance change type storage element 10. In such cases, the circuit configuration in which the capacitance circuit 30A that supplies the discharge current is connected to the word line WL is obtained as illustrated in FIG. 28A. Alternatively, the circuit configuration in which the capacitance circuit 20A used in the charge is connected to the bit line BL is obtained as illustrated in FIG. 28B.

Similarly, in the series circuit in which the cathode of the non-ohmic element 15 is connected to the bit line BL while the other end of the resistance change type storage element 10 is connected to the word line WL as shown in FIG. 27A, the circuit configuration in which the capacitance circuit that supplies the discharge current is connected to the word line WL is obtained, or the circuit configuration in which the capacitance circuit used in the charge is connected to the bit line BL is obtained.

The resistance change type memories of the embodiments may be a memory cell array including a global-bit line connected to bit lines and a global-word line connected to word lines. One of the capacitance circuits of the first and second embodiments may be connected to the global-word line and the global-bit line.

In the first and second embodiments of the invention, the pulse generator 8A produces currents or voltages having different pulse shapes according to the set operation and reset operation, and supplies the currents or voltages to the resistance change type storage element. Alternatively, the pulse generator produces a current or voltage having the same pulse shape, and may impart currents or voltages having different pulse shapes to the resistance change type storage element in the set operation and reset operation by controlling a period during which the column selection switch element is turned on or by controlling the column selection switch element with the intermediate potential between the "L" level and the "H" level.

The resistance change type memories of the embodiments are not limited to ReRAM, and may be PCRAM or MRAM. The resistance change type storage element used in PCRAM includes the recording layer 10 made of a phase change material and the heater layer (lower electrode) 71 that is in contact with the bottom of the recording layer. In the resistance change type storage element 10 of PCRAM, the recording layer is changed between a crystalline state and an amorphous state by the heat generated in data writing, thereby storing data. The resistance change type storage element used in an MRAM is an MTJ (Magnetic Tunnel Junction) element in which a Tunneling MagnetoResistive (TMR) effect is used. In an MRAM, the data is written by changing relative magnetization directions of two magnetic layers constituting the MTJ element.

In the resistance change type memories of the first and second embodiments of the invention, the operational reliability can be improved. The resistance change type memories of the first and second embodiments are effectively applied to a memory such as ReRAM in which the resistance change type storage element has a high response speed (switching characteristic).

The first and second embodiments and the examples described in the first and second embodiments may appropriately be combined.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A resistance change type memory comprising:
a plurality of first wirings extending in a first direction and arrayed in a second direction crossing the first direction;
a plurality of second wirings extending in the second direction and arrayed in the first direction;
a plurality of series circuits connected to the first and second wirings, the series circuit including a non-ohmic element being more conductive in the first to second wiring direction than in the second to first direction and a resistance change type storage element in which data is stored according to a change of a resistance state, respectively;
an energy supplying circuit connected to the plurality of first wirings to supply energy to the first wirings, the energy being used to store the data in the resistance change type storage element; and
at least one capacitance circuit that includes at least one capacitive element and being connected to at least one of the first wirings or at least one of the second wirings.

2. The resistance change type memory according to claim 1, wherein the capacitance circuit is commonly connected to the plurality of second wirings, and
the capacitive element is charged by the energy when a transition of the resistance state of the resistance change type storage element is made from a low-resistance state to a high-resistance state.

3. The resistance change type memory according to claim 2, wherein the capacitance circuit includes at least two capacitive elements,
one of the capacitive elements is activated when a resistance change type storage element provided near a connection point between the energy supplying circuit and the first wiring is selected, and
at least two capacitive elements are activated when a resistance change type storage element provided far away from the connection point between the energy supplying circuit and the first wiring is selected.

4. The resistance change type memory according to claim 2, further comprising a potential supplying circuit to supply a first potential and a second potential to the plurality of second wirings, the second potential being smaller than the first potential,
wherein the potential supplying circuit supplies the first potential to the second wiring connected to a resistance change type storage element provided near a connection point between the energy supplying circuit and the first wiring when the resistance change type storage element is selected, and
the potential supplying circuit supplies the second potential to the second wiring connected to a resistance change type storage element provided far away from the connection point between the energy supplying circuit and the first wiring when the resistance change type storage element is selected.

5. The resistance change type memory according to claim 1, wherein the capacitance circuit is connected to each of the first wirings,
the capacitive element is charged by the energy when a transition of the resistance state of the resistance change type storage element is made from a low-resistance state to a high-resistance state, and the capacitance circuit imparts a discharge current of the capacitive element to the resistance change type storage element after the capacitive element is charged.

6. The resistance change type memory according to claim 5, wherein the capacitance circuit includes a resistive element connected to the first wiring, the resistive element is made conductive with the first wiring when a transition of the resistance state of the resistance change type storage element is made from a low-resistance state to a high-resistance state, and the resistive element is not made conductive with the first wiring when the transition of the resistance state of the resistance change type storage element is made from the high-resistance state to the low-resistance state.

7. The resistance change type memory according to claim 5, wherein the capacitance circuit includes a switch element that is connected to the first wiring between the capacitive element and the series circuit, and the switch element electrically separates the resistance change type storage element and the capacitance circuit for a period until the capacitive element is charged when a transition of the resistance state of the resistance change type storage element is made from a low-resistance state to a high-resistance state.

8. The resistance change type memory according to claim 5, wherein the capacitance circuit includes at least two capacitive elements, one of the capacitive elements is activated when a resistance change type storage element provided near a connection point between the energy supplying circuit and the first wiring is selected, and at least two capacitive elements are activated when a resistance change type storage element provided far away from the connection point between the energy supplying circuit and the first wiring is selected.

9. The resistance change type memory according to claim 5, further comprising a potential supplying circuit to supply a first potential and a second potential to the plurality of second wirings, the second potential being smaller than the first potential, wherein the potential supplying circuit supplies the first potential to the second wiring connected to a resistance change type storage element provided near a connection point between the energy supplying circuit and the first wiring when the resistance change type storage element is selected, and the potential supplying circuit supplies the second potential to the second wiring connected to a resistance change type storage element provided far away from the connection point between the energy supplying circuit and the first wiring when the resistance change type storage element is selected.

10. The resistance change type memory according to claim 1, wherein the first wiring is a bit line and the second wiring is a word line.

11. The resistance change type memory according to claim 1, wherein the capacitance circuit is connected to one wiring which has a lower applied voltage in a selected first wiring among the plurality of first wirings and a selected second wiring among the plurality of second wirings, and the capacitance circuit is charged by the energy during a transition of the resistance of the resistance change type storage element.

* * * * *